(12) United States Patent
Masuoka et al.

(10) Patent No.: US 8,669,601 B2
(45) Date of Patent: Mar. 11, 2014

(54) METHOD FOR PRODUCING SEMICONDUCTOR DEVICE AND SEMICONDUCTOR DEVICE HAVING PILLAR-SHAPED SEMICONDUCTOR

(75) Inventors: Fujio Masuoka, Tokyo (JP); Nozomu Harada, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/609,992

(22) Filed: Sep. 11, 2012

(65) Prior Publication Data

US 2013/0069149 A1 Mar. 21, 2013

Related U.S. Application Data

(60) Provisional application No. 61/535,133, filed on Sep. 15, 2011.

(51) Int. Cl.
*H01L 31/062* (2012.01)
*H01L 31/113* (2006.01)

(52) U.S. Cl.
USPC ........... 257/291; 257/292; 257/623; 438/237; 438/268

(58) Field of Classification Search
USPC .................. 257/291, 292, 623; 438/237, 268
See application file for complete search history.

(56) References Cited

U.S. PATENT DOCUMENTS

| | | |
|---|---|---|
| 5,017,977 A | 5/1991 | Richardson |
| 5,258,635 A | 11/1993 | Nitayama et al. |
| 5,308,782 A | 5/1994 | Mazure et al. |
| 5,312,767 A | 5/1994 | Shimizu et al. |
| 5,382,816 A | 1/1995 | Mitsui |
| 5,416,350 A | 5/1995 | Watanabe |
| 5,480,838 A | 1/1996 | Mitsui |
| 5,627,390 A | 5/1997 | Maeda et al. |
| 5,656,842 A | 8/1997 | Iwamatsu et al. |

(Continued)

FOREIGN PATENT DOCUMENTS

| | | |
|---|---|---|
| CN | 1507035 | 6/2004 |
| CN | 1610126 A | 4/2005 |

(Continued)

OTHER PUBLICATIONS

Notice of Allowance for U.S. Appl. No. 12/704,935, dated May 16, 2013, 10 pages.

(Continued)

*Primary Examiner* — Ngan Ngo
(74) *Attorney, Agent, or Firm* — Brinks Gilson & Lione

(57) ABSTRACT

A method for producing a semiconductor device includes the steps of forming first and second pillar-shaped semiconductors on a substrate at the same time so as to have the same height; forming a first semiconductor layer by doping a bottom region of the first pillar-shaped semiconductor with a donor or acceptor impurity to connect the first semiconductor layer to the second pillar-shaped semiconductor; forming a circuit element including an upper semiconductor region formed by doping an upper region of the first pillar-shaped semiconductor with a donor or acceptor impurity; forming a first conductor layer in the second pillar-shaped semiconductor; forming first and second contact holes that are respectively connected to the first and second pillar-shaped semiconductors; and forming a wiring metal layer that is connected to the upper semiconductor region and the first conductor layer through the first and second contact holes, respectively.

19 Claims, 52 Drawing Sheets

(56) References Cited

U.S. PATENT DOCUMENTS

| | | |
|---|---|---|
| 5,703,386 A | 12/1997 | Yasuda et al. |
| 5,707,885 A | 1/1998 | Lim |
| 5,710,447 A | 1/1998 | Tohyama |
| 5,767,549 A | 6/1998 | Chen et al. |
| 5,780,888 A | 7/1998 | Maeda et al. |
| 5,811,336 A | 9/1998 | Kasai |
| 5,872,037 A | 2/1999 | Iwamatsu et al. |
| 5,905,283 A | 5/1999 | Kasai |
| 5,994,735 A | 11/1999 | Maeda et al. |
| 6,121,086 A | 9/2000 | Kuroda et al. |
| 6,127,209 A | 10/2000 | Maeda et al. |
| 6,175,138 B1 | 1/2001 | Noda |
| 6,294,418 B1 | 9/2001 | Noble |
| 6,373,099 B1 | 4/2002 | Kikuchi et al. |
| 6,392,271 B1 | 5/2002 | Alavi et al. |
| 6,406,962 B1 | 6/2002 | Agnello et al. |
| 6,420,751 B1 | 7/2002 | Maeda et al. |
| 6,461,900 B1 | 10/2002 | Sundaresan et al. |
| 6,483,171 B1 | 11/2002 | Forbes et al. |
| 6,624,459 B1 | 9/2003 | Dachtera et al. |
| 6,658,259 B2 | 12/2003 | McIntosh |
| 6,740,937 B1 | 5/2004 | Sushihara |
| 6,747,314 B2 | 6/2004 | Sundaresan et al. |
| 6,815,277 B2 | 11/2004 | Fried et al. |
| 6,849,903 B2 | 2/2005 | Sushihara |
| 6,861,684 B2 | 3/2005 | Skotnicki et al. |
| 6,878,991 B1 | 4/2005 | Forbes |
| 6,891,225 B2 | 5/2005 | Horiguchi et al. |
| 6,943,407 B2 | 9/2005 | Ouyang et al. |
| 7,052,941 B2 | 5/2006 | Lee |
| 7,193,278 B2 | 3/2007 | Song |
| 7,198,976 B2 | 4/2007 | Hirata |
| 7,233,033 B2 | 6/2007 | Koyama et al. |
| 7,241,655 B2 | 7/2007 | Tang et al. |
| 7,271,052 B1 | 9/2007 | Forbes |
| 7,368,334 B2 | 5/2008 | Yeo et al. |
| 7,374,990 B2 | 5/2008 | Tang et al. |
| 7,413,480 B2 | 8/2008 | Thomas |
| 7,579,214 B2 | 8/2009 | Yamazaki et al. |
| 7,619,675 B2 | 11/2009 | Horii |
| 7,829,952 B2 | 11/2010 | Moniwa et al. |
| 7,872,287 B2 | 1/2011 | Masuoka et al. |
| 7,977,736 B2 | 7/2011 | Kim et al. |
| 7,977,738 B2 | 7/2011 | Minami et al. |
| 7,981,738 B2 | 7/2011 | Moniwa et al. |
| 8,039,893 B2 | 10/2011 | Masuoka et al. |
| 8,058,683 B2 | 11/2011 | Yoon et al. |
| 8,067,800 B2 | 11/2011 | Hsieh |
| 8,110,869 B2 | 2/2012 | Bhalla |
| 8,154,076 B2 | 4/2012 | Takaishi |
| 8,188,537 B2 | 5/2012 | Masuoka et al. |
| 8,227,305 B2 | 7/2012 | Forbes |
| 8,378,400 B2 | 2/2013 | Masuoka et al. |
| 8,482,047 B2 | 7/2013 | Abbott et al. |
| 2001/0052614 A1 | 12/2001 | Ishibashi |
| 2002/0000624 A1 | 1/2002 | Takemura et al. |
| 2002/0034853 A1 | 3/2002 | Alavi et al. |
| 2002/0110039 A1 | 8/2002 | Forbes et al. |
| 2002/0195652 A1 | 12/2002 | Maeda et al. |
| 2003/0002093 A1 | 1/2003 | Hynecek |
| 2003/0075758 A1 | 4/2003 | Sundaresan et al. |
| 2004/0005755 A1 | 1/2004 | Moniwa et al. |
| 2004/0113207 A1 | 6/2004 | Hsu et al. |
| 2004/0135215 A1 | 7/2004 | Song |
| 2004/0169293 A1 | 9/2004 | Sushihara |
| 2004/0256639 A1 | 12/2004 | Ouyang et al. |
| 2004/0262681 A1 | 12/2004 | Masuoka et al. |
| 2005/0127404 A1 | 6/2005 | Sushihara |
| 2005/0145911 A1 | 7/2005 | Forbes et al. |
| 2005/0263821 A1 | 12/2005 | Cho et al. |
| 2005/0281119 A1 | 12/2005 | Shibata et al. |
| 2006/0006444 A1 | 1/2006 | Leslie |
| 2006/0007333 A1 | 1/2006 | Horii |
| 2006/0033524 A1 | 2/2006 | Sushihara |
| 2006/0043520 A1 | 3/2006 | Jerdev et al. |
| 2006/0046391 A1 | 3/2006 | Tang et al. |
| 2006/0261406 A1 | 11/2006 | Chen |
| 2007/0007601 A1 | 1/2007 | Hsu et al. |
| 2007/0075359 A1 | 4/2007 | Yoon et al. |
| 2007/0117324 A1 | 5/2007 | Previtali |
| 2007/0138557 A1 | 6/2007 | Ipposhi |
| 2007/0173006 A1 | 7/2007 | Moniwa et al. |
| 2008/0048245 A1 | 2/2008 | Kito et al. |
| 2008/0173936 A1 | 7/2008 | Yoon et al. |
| 2008/0210985 A1 | 9/2008 | Ogawa et al. |
| 2008/0227241 A1 | 9/2008 | Nakabayashi et al. |
| 2009/0032955 A1 | 2/2009 | Tanaka et al. |
| 2009/0057722 A1 | 3/2009 | Masuoka et al. |
| 2009/0065832 A1 | 3/2009 | Masuoka et al. |
| 2009/0085088 A1 | 4/2009 | Takaishi |
| 2009/0114989 A1 | 5/2009 | Hamamoto |
| 2009/0159964 A1 | 6/2009 | Lee |
| 2009/0174024 A1 | 7/2009 | Kim |
| 2009/0197379 A1 | 8/2009 | Leslie |
| 2009/0290082 A1 | 11/2009 | Yamazaki et al. |
| 2009/0291551 A1 | 11/2009 | Cho |
| 2010/0052029 A1 | 3/2010 | Huang |
| 2010/0200731 A1 | 8/2010 | Masuoka et al. |
| 2010/0200913 A1 | 8/2010 | Masuoka et al. |
| 2010/0207172 A1 | 8/2010 | Masuoka et al. |
| 2010/0207201 A1 | 8/2010 | Masuoka et al. |
| 2010/0207213 A1 | 8/2010 | Masuoka et al. |
| 2010/0213525 A1 | 8/2010 | Masuoka et al. |
| 2010/0213539 A1 | 8/2010 | Masuoka et al. |
| 2010/0219457 A1 | 9/2010 | Masuoka et al. |
| 2010/0219483 A1 | 9/2010 | Masuoka et al. |
| 2010/0270611 A1 | 10/2010 | Masuoka et al. |
| 2010/0276750 A1 | 11/2010 | Tu |
| 2010/0295123 A1 | 11/2010 | Lung et al. |
| 2011/0073925 A1 | 3/2011 | Park et al. |
| 2011/0215381 A1 | 9/2011 | Masuoka et al. |
| 2011/0254067 A1 | 10/2011 | Abbott et al. |
| 2011/0275207 A1 | 11/2011 | Moniwa et al. |
| 2011/0303973 A1 | 12/2011 | Masuoka et al. |
| 2011/0303985 A1 | 12/2011 | Masuoka et al. |
| 2012/0086051 A1 | 4/2012 | Wang et al. |
| 2012/0196415 A1 | 8/2012 | Masuoka et al. |
| 2013/0062673 A1* | 3/2013 | Masuoka et al. ............ 257/291 |
| 2013/0241023 A1* | 9/2013 | Nishizawa et al. ........... 257/446 |

FOREIGN PATENT DOCUMENTS

| | | |
|---|---|---|
| CN | 1983601 A | 6/2007 |
| CN | 101542733 A | 9/2009 |
| DE | 4443968 | 11/1995 |
| EP | 1770769 A1 | 4/2007 |
| EP | 2197032 A1 | 6/2010 |
| EP | 2239770 A1 | 10/2010 |
| EP | 2239771 A1 | 10/2010 |
| EP | 2244305 A1 | 10/2010 |
| EP | 2246895 A1 | 11/2010 |
| JP | 60-070757 A | 4/1985 |
| JP | 61-013661 | 1/1986 |
| JP | 62-045058 A | 2/1987 |
| JP | 62-190751 | 8/1987 |
| JP | 63-037633 A | 2/1988 |
| JP | 63-158866 A | 7/1988 |
| JP | 64-089560 A | 4/1989 |
| JP | 01-175775 A | 7/1989 |
| JP | 02-066969 A | 3/1990 |
| JP | 02-071556 | 3/1990 |
| JP | 02-089368 A | 3/1990 |
| JP | 02-188966 | 7/1990 |
| JP | 03-114233 | 5/1991 |
| JP | 03-145761 | 6/1991 |
| JP | 03-225873 A | 10/1991 |
| JP | 04-234166 A | 8/1992 |
| JP | 05-276442 A | 10/1993 |
| JP | 06-021467 A | 1/1994 |
| JP | 06-069441 | 3/1994 |
| JP | 06-237003 A | 8/1994 |
| JP | 07-099311 | 4/1995 |
| JP | 07-321228 | 12/1995 |
| JP | 08-078533 A | 3/1996 |

(56) References Cited

FOREIGN PATENT DOCUMENTS

| | | |
|---|---|---|
| JP | 09-008295 | 1/1997 |
| JP | 10-079482 A | 3/1998 |
| JP | 10-223777 A | 8/1998 |
| JP | 11-087649 | 3/1999 |
| JP | 2000-012705 A | 1/2000 |
| JP | 2000-068516 | 3/2000 |
| JP | 2000-208434 | 7/2000 |
| JP | 2000-243085 | 9/2000 |
| JP | 2000-244818 A | 9/2000 |
| JP | 2000-357736 | 12/2000 |
| JP | 2001-028399 | 1/2001 |
| JP | 2001-237421 A | 8/2001 |
| JP | 2001-339057 A | 12/2001 |
| JP | 2001-352047 A | 12/2001 |
| JP | 2002-009257 | 1/2002 |
| JP | 2002-033399 A | 1/2002 |
| JP | 2002-231951 A | 8/2002 |
| JP | 2002-246580 A | 8/2002 |
| JP | 2002-246581 A | 8/2002 |
| JP | 2003-068883 A | 3/2003 |
| JP | 2003-142684 | 5/2003 |
| JP | 2003-179160 A | 6/2003 |
| JP | 2003-224211 A | 8/2003 |
| JP | 2004-079694 | 3/2004 |
| JP | 2004-096065 A | 3/2004 |
| JP | 2004-153246 | 5/2004 |
| JP | 2004-193588 A | 7/2004 |
| JP | 2004-259733 A | 9/2004 |
| JP | 2004-319808 A | 11/2004 |
| JP | 2005-012213 A | 1/2005 |
| JP | 2005-135451 | 5/2005 |
| JP | 2006-024799 A | 1/2006 |
| JP | 2006-514392 | 4/2006 |
| JP | 2006-294995 A | 10/2006 |
| JP | 2007-0250652 A | 9/2007 |
| JP | 2008-177565 | 7/2008 |
| JP | 2008-205168 A | 9/2008 |
| JP | 2008-300558 A | 12/2008 |
| JP | 2009-110049 A | 5/2009 |
| JP | 2009-182316 A | 8/2009 |
| JP | 2009-182317 A | 8/2009 |
| JP | 2010-171055 | 8/2010 |
| JP | 2010-0213539 A | 9/2010 |
| JP | 2010-258345 | 11/2010 |
| JP | 2011-066105 | 3/2011 |
| JP | 2011-071235 | 4/2011 |
| JP | 2011-077437 | 4/2011 |
| JP | 2011-211161 A | 10/2011 |
| KR | 10-0132560 | 12/1997 |
| KR | 10-0200222 | 6/1999 |
| KR | 10-0327875 B1 | 9/2002 |
| KR | 2004-0063348 A | 7/2004 |
| WO | WO 94/14198 A1 | 6/1994 |
| WO | WO 01/22494 A1 | 3/2001 |
| WO | WO 2005/036651 | 4/2005 |
| WO | WO 2006/127586 | 11/2006 |
| WO | WO 2009/034623 A1 | 3/2009 |
| WO | WO 2009/034731 A1 | 3/2009 |
| WO | WO 2009/057194 A1 | 5/2009 |
| WO | WO 2009/095997 A1 | 8/2009 |
| WO | WO 2009/096001 A1 | 8/2009 |
| WO | WO 2009/096464 A1 | 8/2009 |
| WO | WO 2009/096465 A1 | 8/2009 |
| WO | WO 2009/096466 A1 | 8/2009 |
| WO | WO 2009/096470 A1 | 8/2009 |
| WO | WO 2009/102059 A1 | 8/2009 |
| WO | WO 2009/133957 A1 | 11/2009 |
| WO | WO 2011/111662 A1 | 9/2011 |

OTHER PUBLICATIONS

Notice of Allowance for U.S. Appl. No. 13/046,113, dated May 13, 2013, 10 pages.
Notice of Allowance for U.S. Appl. No. 13/412,959, dated May 8, 2013, 9 pages.
Office Action for U.S. Appl. No. 13/116,506, dated Jul. 18, 2013, 12 pages.
Notice of Allowance for U.S. Appl. No. 12/894,923, dated Jul. 2, 2013, 9 pages.
Notice of Allowance for U.S. Appl. No. 13/606,823, dated Jul. 8, 2013, 12 pages.
English translation of previously cited International Search Report for PCT/JP2011/070534, dated Dec. 6, 2011, 2 pages.
English translation of previously cited International Search Report for PCT/JP2011/071162, dated Dec. 13, 2011, 5 pages.
Office Action for U.S. Appl. No. 13/917,040 dated Aug. 6, 2013, 5 pages.
Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, September 2009.
Choi, Yang-Kyu et al., "FinFET Process Refinements for Improved Mobility and Gate Work Function Engineering," IEEE, 2002, 4 pages.
Examination Report for European Application No. 08722595.9, dated Jul. 11, 2012, 4 pages.
Examination Report in corresponding European Application No. 07 807 139.6, dated Jun. 11, 2012, 4 pages.
Extended European Search Report for European Application No. 07807139.6, dated Jun. 24, 2011, 10 pages.
Extended European Search Report for European Application No. 10004492.4, dated Jun. 21, 2012, 10 pages.
Extended European Search Report for European Application No. 12001395.8, dated Apr. 26, 2012, 7 pages.
International Preliminary Report on Patentability for International Application No. PCT/JP2008/051300, dated Aug. 31, 2010, 9 pages.
International Preliminary Report on Patentability for International Application No. PCT/JP2009/051459, dated Aug. 31, 2010, 9 pages.
International Preliminary Report on Patentability for International Application No. PCT/JP2011/055264, dated Oct. 11, 2012, 7 pages.
International Search Report for International Application No. PCT/JP2007/067732, dated Dec. 11, 2007, 2 pages.
International Search Report for International Application No. PCT/JP2008/051300, dated May 13, 2008, 4 pages.
International Search Report for International Application No. PCT/JP2008/051304, dated Apr. 15, 2008, 2 pages.
International Search Report for International Application No. PCT/JP2008/058412, dated Jun. 10, 2008, 2 pages.
International Search Report for International Application No. PCT/JP2009/051459, dated Apr. 14, 2009, 4 pages.
International Search Report for International Application No. PCT/JP2009/051463, dated Feb. 24, 2009, 2 pages.
International Search Report for International Application No. PCT/JP2009/058629, dated Jun. 2, 2009, 2 pages.
International Search Report for International Application No. PCT/JP2011/070534, dated Dec. 6, 2011, 10 pages.
International Search Report for International Application No. PCT/JP2011/071162, dated Dec. 13, 2011, 18 pages.
Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.
Maeda, Shigenobu et al., "Impact of a Vertical .PHI.-Shape Transistor (V.PHI.T) Cell for 1 Gbit DRAM and Beyond," IEEE Transactions on Electron Devices, vol. 42, No. 12, Dec. 1995, pp. 2117-2124.
Nakamura, Jun-ichi et al., "Nondestructive Readout Mode Static Induction Transistor (SIT) Photo Sensors," IEEE Transactions on Electron Devices, 1993, vol. 40, pp. 334-341.
Non-Certified Partial Translation of Office Action from counterpart Korean Application No. 10-2010-7018204, dated Mar. 29, 2012, 1 page.
Notice of Allowance for U.S. Appl. No. 12/700,294, dated Oct. 5, 2012, 7 pages.
Notice of Allowance for U.S. Appl. No. 12/704,955, dated Mar. 15, 2012, 8 pages.
Notice of Allowance for U.S. Appl. No. 13/447,721, dated Nov. 2, 2012, 9 pages.
Office Action from co-pending U.S. Appl. No. 12/704,935, dated Nov. 18, 2011, 9 pages.

(56) References Cited

OTHER PUBLICATIONS

Office Action from co-pending U.S. Appl. No. 12/704,955, dated Dec. 8, 2011, 12 pages.
Office Action from counterpart Korean Application No. 10-2010-7018204, dated Mar. 29, 2012, 7 pages.
Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.
Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.
Watanabe, S. et al., "A Nobel Circuit Technology with Surrounding Gate Transistors (SGT's) for Ultra High Density DRAM's", IEEE Journal of Solid-State Circuits, vol. 30, No. 9, Sep. 1995, pp. 960-971.
Written Opinion of the International Searching Authority for International Application No. PCT/JP2007/067732, dated Dec. 11, 2007, 4 pages.
Written Opinion of the International Searching Authority for International Application No. PCT/JP2008/051300, dated Aug. 30, 2010, 8 pages.
Written Opinion of the International Searching Authority for International Application No. PCT/JP2008/058412, dated Jun. 10, 2008, 4 pages.
Written Opinion of the International Searching Authority for International Application No. PCT/JP2009/058629, dated Jun. 2, 2009, 4 pages.
Written Opinion of the International Searching Authority for International Application No. PCT/JP2009/051459, dated Aug. 30, 2010, 8 pages.
Wuu, S.G. et al., "A Leading-Edge 0.9 μm Pixel CMOS Image Sensor Technology with Backside Illumination: Future Challenges for Pixel Scaling", *IEDM2010 Digest Papers*, 14.1.1, pp. 332-335, 2010.
Yonemoto, Kazuya, "A CMOS Image Sensor with a Simple FPN-Reduction Technology and a Hole Accumulated Diode," 2000 IEEE International Solid-State Circuites Conference, 9 pages.
Notice of Allowance for U.S. Appl. No. 13/043,081, dated Mar. 18, 2013, 6 pages.
Notice of Allowance for U.S. Appl. No. 13/113,482, dated Apr. 4, 2013, 10 pages.
Notice of Allowance for U.S. Appl. No. 12/768,290, dated Apr. 18, 2013, 9 pages.
Notice of Allowance for U.S. Appl. No. 12/894,923, dated Feb. 21, 2013, 5 pages.
Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Office Action for Korean Patent Application Serial No. 9-5-2013-010869116, dated Feb. 18, 2013, 4 pages.
International Search Report for PCT/JP2011/079300, dated Mar. 13, 2012, 5 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-μm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.
Chen, Yijian et al., "Vertical integrated-gate CMOS for ultra-dense IC", *Microelectronic Engineering*, vol. 83, 2006, pp. 1745-1748.
Office Action for Chinese Patent Application Serial No. 200980103454.9, dated Oct. 31, 2012, 7 pages.
Office Action for Chinese Patent Application Serial No. 200980103505.8, dated Nov. 1, 2012, 5 pages.
Office Action for Chinese Patent Application Serial No. 201010171435.4, dated Dec. 21, 2012, 7 pages.
Office Action for Chinese Patent Application Serial No. 2011100647037, dated Nov. 14, 2012, 6 pages.
Office Action for Japanese Patent Application Serial No. 2009-538870, dated Nov. 8, 2012, 4 pages.
Restriction Requirement for U.S. Appl. No. 13/412,959, dated Nov. 8, 2012, 6 pages.
European Search Report for counterpart European Application No. 09705485.2, dated Feb. 14, 2011, 5 pages.
Extended European Search Report for European Application No. 10009574.4, dated May 15, 2012, 6 pages.
Extened European Search Report for European Application No. 10009579.3, dated Jun. 11, 2012, 11 pages.
Guidash, R.M. et al. "A 0.6 μm CMOS Pinned Photodiode Color Imager Technology", *IEDM Digest Papers*, pp. 927-929, 1997.
Hieda, K. et al., "New Effects of Trench Isolated Transistor Using Side-Wall Gates", *VLSI Research Center*, Toshiba Corporation, 1987, 4 pages.
International Search Report for International Application No. PCT/JP2007/071052, dated Jan. 29, 2008, 6 pages.
International Search Report for International Application No. PCT/JP2008/051301, dated Apr. 1, 2008, 2 pages.
International Search Report for International Application No. PCT/JP2008/051302, dated Apr. 8, 2008, 2 pages.
International Search Report for International Application No. PCT/JP2009/051460, dated Apr. 21, 2009, 2 pages.
International Search Report for International Application No. PCT/JP2009/051461, dated Apr. 21, 2009, 2 pages.
Iwai, Makoto et al., "High-Performance Buried Gate Surrounding Gate Transistor for Future Three-Dimensional Devices", *Japanese Journal of Applied Physics*, 2004, vol. 43, No. 10, pp. 6904-6906.
Mendis, Sunetra K. et al. "A 128×128 CMOS Active Pixel Image Sensor for Highly Integrated Imaging System", *IEDM93, Digest Papers*, 22.6.1, pp. 583-586, 1993.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nitayama, Akihiro et al., "Multi-Pillar Surrounding Gate Transistor (M-SGT) for Compact and High-Speed Circuits", *IEEE Transactions on Electron Devices*, vol. 3, No. 3, Mar. 1991, pp. 679-583.
Office Action from co-pending U.S. Appl. No. 12/894,923, dated Oct. 2, 2012, 21 pages.
Office Action from co-pending U.S. Appl. No. 13/043,081, dated Jul. 16, 2012, 6 pages.
Office Action from co-pending U.S. Appl. No. 13/046,113, dated Jan. 9, 2013, 6 pages.
Office Action from co-pending U.S. Appl. No. 13/113,482, dated Jan. 2, 2013, 9 pages.
Office Action from co-pending U.S. Appl. No. 13/412,959, dated Dec. 7, 2012, 9 pages.
Written Opinion of the International Searching Authority for International Application No. PCT/JP2007/071052, dated Jan. 29, 2008, 9 pages.
Written Opinion of the International Searching Authority for International Application No. PCT/JP2008/051301, dated Apr. 1, 2008, 5 pages.
Written Opinion of the International Searching Authority for International Application No. PCT/JP2008/051302, dated Apr. 8, 2008, 5 pages.
Written Opinion of the International Searching Authority for International Application No. PCT/JP2009/051460, dated Apr. 21, 2009, 5 pages.
Written Opinion of the International Searching Authority for International Application No. PCT/JP2009/051461, dated Apr. 21, 2009, 6 pages.
Wu et al., "High Performance 22/20nm FinFET CMOS Devices with Advanced High-K/Metal Gate Scheme", IEEE, pp. 27.1.1-27.1.4, 2010.

* cited by examiner

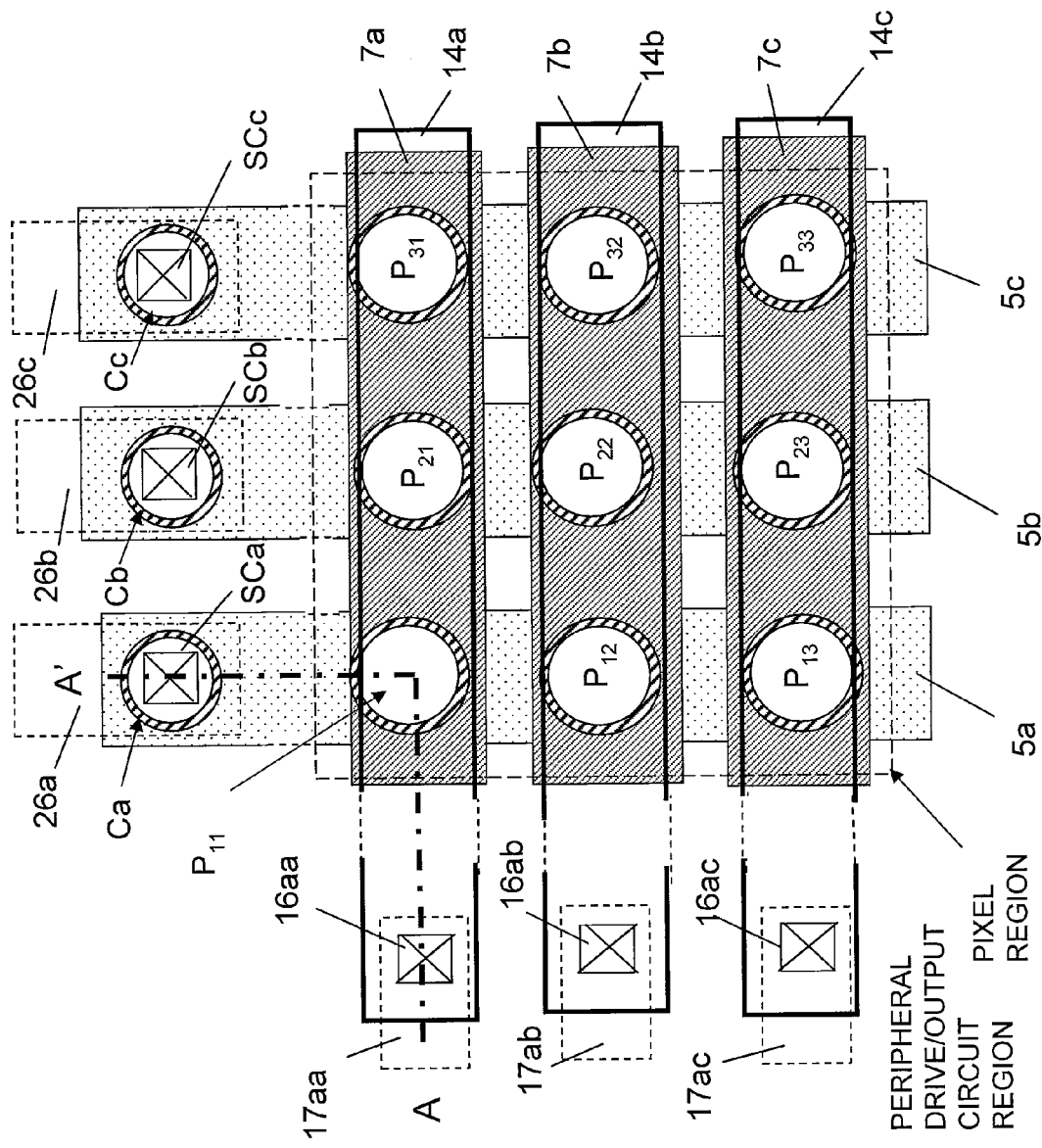

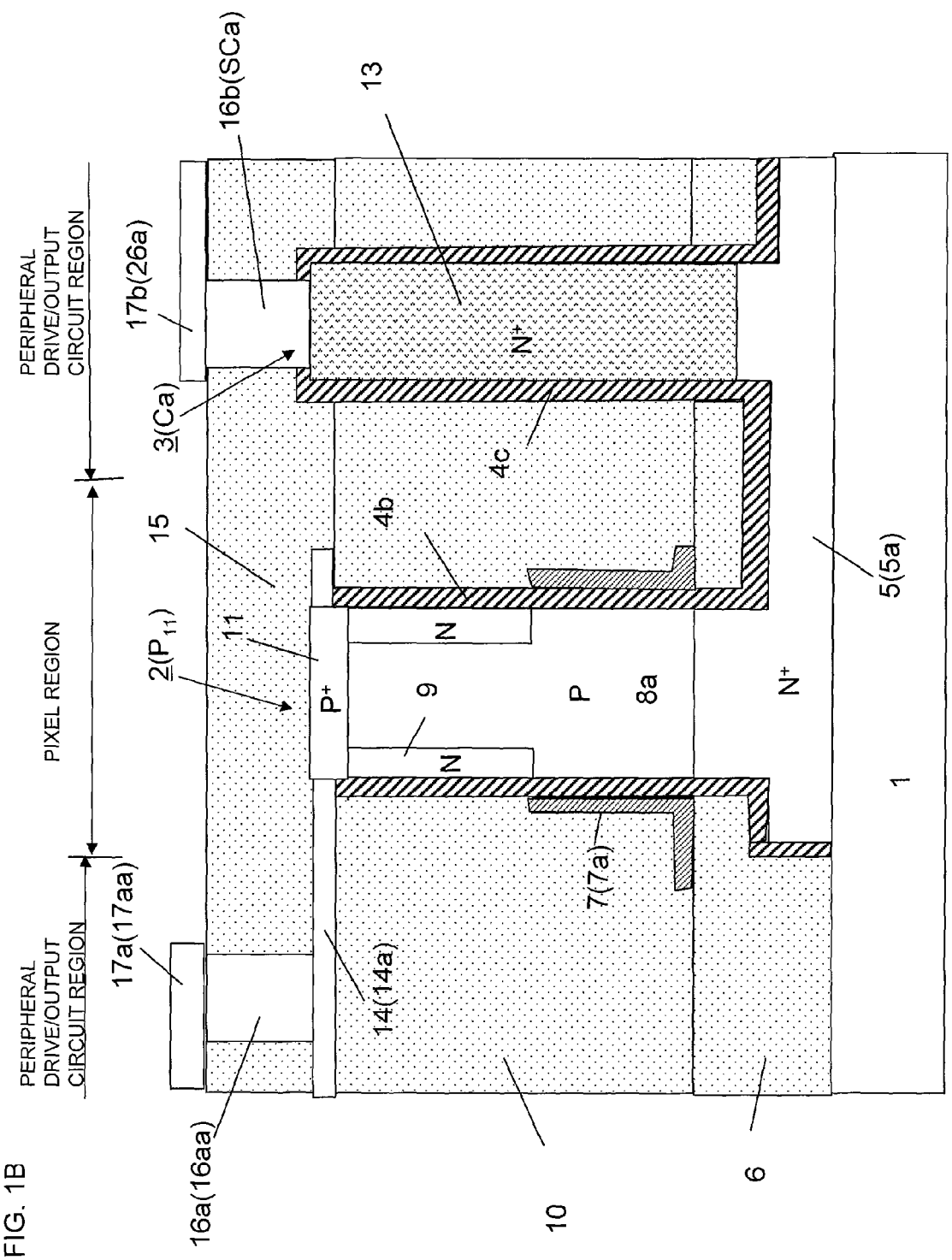

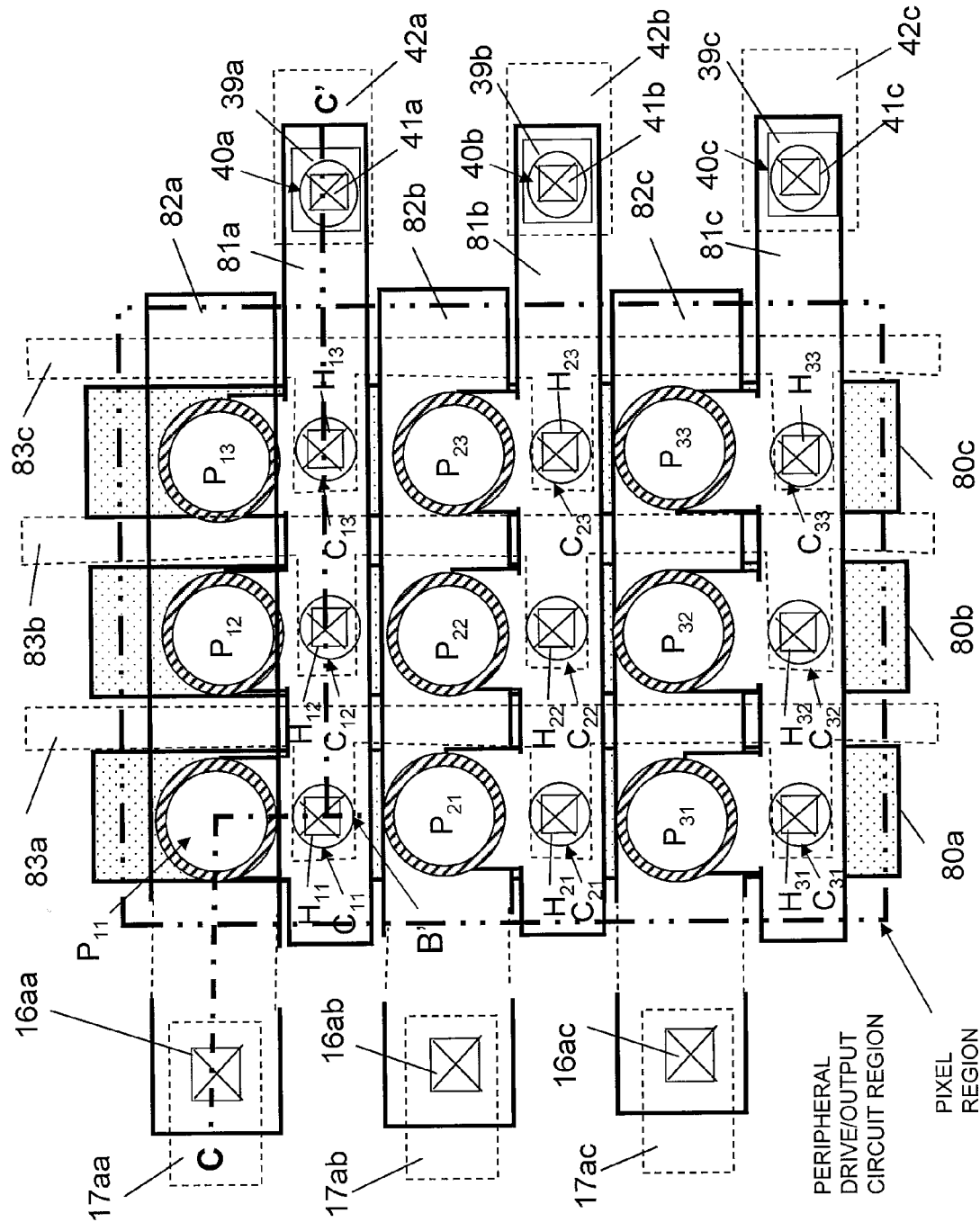

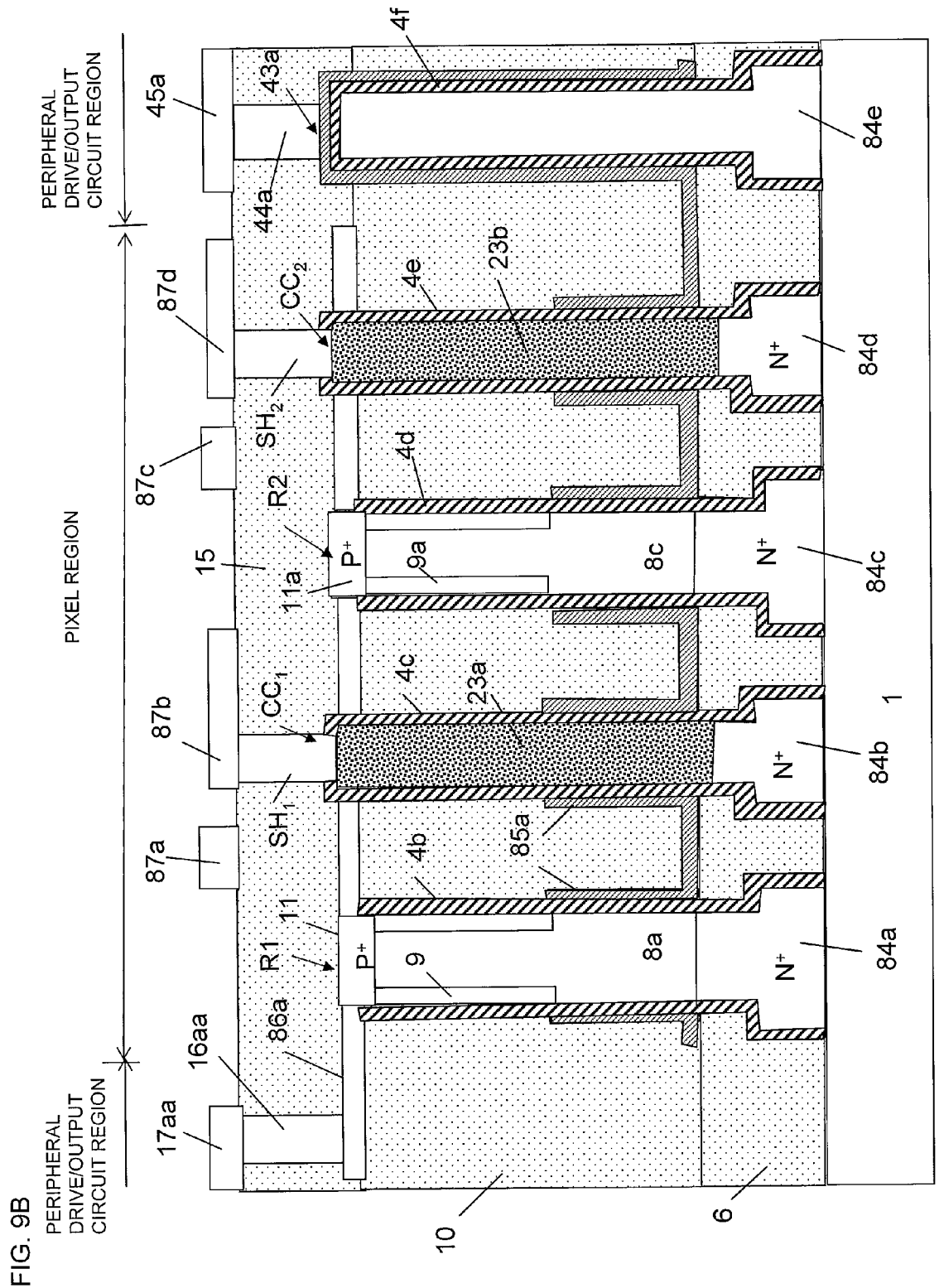

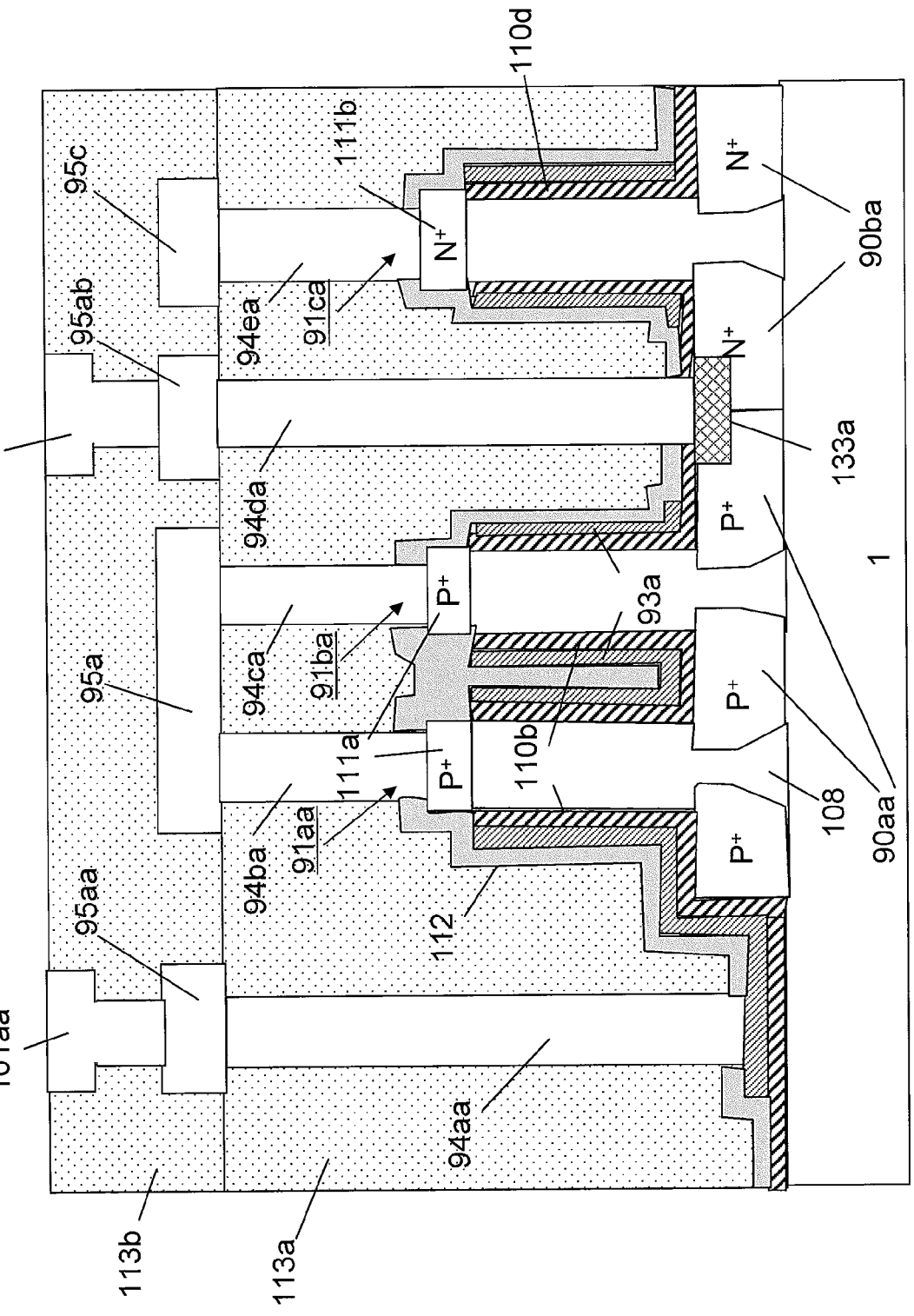

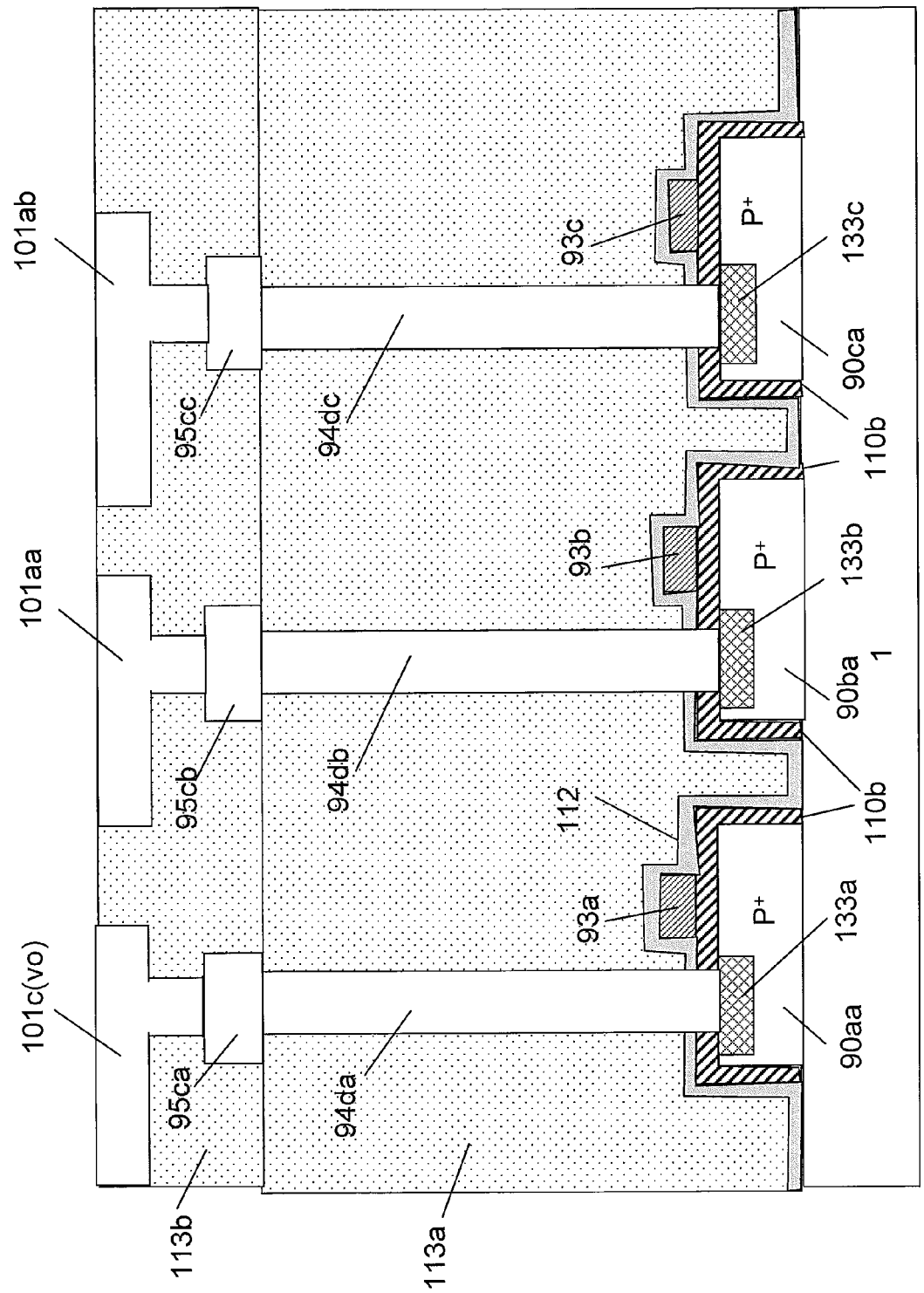

US 8,669,601 B2

METHOD FOR PRODUCING SEMICONDUCTOR DEVICE AND SEMICONDUCTOR DEVICE HAVING PILLAR-SHAPED SEMICONDUCTOR

RELATED APPLICATIONS

Pursuant to 35 U.S.C. §119(e), this application claims the benefit of the filing date of Provisional U.S. patent application Ser. No. 61/535,133 filed on Sep. 15, 2011. The entire content of this application is hereby incorporated by reference.

BACKGROUND OF THE INVENTION

1. Field of the Invention

The present invention relates to a semiconductor device and a method for producing a semiconductor device, and in particular, to a method for producing a semiconductor device including a transistor in which a channel region is formed in a semiconductor having a pillar structure, and the semiconductor device.

2. Description of the Related Art

Realization of higher performance has been desired in, for example, CMOS solid-state imaging devices in which a pixel is formed in a pillar-shaped semiconductor or in semiconductor devices in which a MOS transistor is formed in a pillar-shaped semiconductor.

Solid-state imaging devices are widely used in video cameras, still cameras, and the like. Improvement in performance such as realization of high resolution, high speed, and high sensitivity of solid-state imaging devices has been desired.

An example of a solid-state imaging device in the related art will now be described with reference to FIGS. 17A to 17D. As illustrated in FIGS. 17A to 17D, a known solid-state imaging device has a structure in which one pixel is formed in a single silicon (hereinafter represented by "Si") pillar 115, which is a semiconductor (refer to, for example, International Publication No. 2009/034623). FIG. 17A is a cross-sectional structural view of a single pixel. In this pixel structure, a planar signal line N$^+$ layer ("an N-type Si semiconductor layer containing a large amount of a donor impurity" is hereinafter abbreviated as "N$^+$ layer") 116 is formed on a silicon oxide substrate 114. A silicon pillar 115 is formed on the signal line N$^+$ layer 116. The signal line N$^+$ layer 116 is formed so as to extend to a lower portion of the silicon pillar 115 by diffusion. A P layer 117 ("a P-type Si semiconductor layer containing an acceptor impurity" is hereinafter abbreviated as "P layer") is connected on the signal line N$^+$ layer 116. A gate insulating layer 118 is formed around the P layer 117, and a gate conductor layer 119 is formed outside the gate insulating layer 118. The P layer 117 and an N layer 120 located on an outer peripheral portion of the P layer 117 are formed in an area adjacent to the gate conductor layer 119. A pixel selection P$^+$ layer (which is a P-type Si semiconductor layer containing a large amount of an acceptor impurity and is hereinafter referred to as "P$^+$ layer") 121 is formed on the P layer 117 and the N layer 120. A pixel selection line conductor layer 122 is connected to the pixel selection P$^+$ layer.

Light incident on the upper surface of the silicon pillar 115 is absorbed in a photoelectric conversion region of the P layer 117 and the N layer 120 that form a photodiode, and generates signal charges (free electrons). Almost all the generated signal charges are stored in the N layer 120 of the photodiode. In the pixel silicon pillar 115, a junction transistor is formed in which the N layer 120 of the photodiode functions as a gate, the P layer 117 surrounded by the N layer 120 functions as a channel, the pixel selection P$^+$ layer 121 functions as a source, and the P layer 117 near the signal line N$^+$ layer 116 functions as a drain. A signal current corresponding to the amount of signal charges stored in the N layer 120 of the photodiode is read by applying a plus voltage to the pixel selection P$^+$ layer 121 and a ground voltage to the signal line N$^+$ layer 116. A reset MOS transistor is formed in which the N layer 120 functions as a source, the signal line N$^+$ layer 116 functions as a drain, and the gate conductor layer 119 surrounding the gate insulating layer 118 functions as a gate. Signal charges stored in the N layer 120 of the photodiode is discharged to the outside through the signal line N$^+$ layer 116 by applying a plus voltage to the gate conductor layer 119 and a plus voltage to the signal line N$^+$ layer 116 functioning as the drain.

As described above, a basic operation of a pixel in the solid-state imaging device in the related art includes a photoelectric conversion operation for absorbing radiated light and generating signal charges in a photodiode portion of the P layer 117 and the N layer 120, a signal charge storage operation for storing the signal charges in the N layer 120 of the photodiode, a signal charge reading operation for reading a signal current corresponding to the amount of stored signal charges by the junction transistor in which the N layer 120 of the photodiode functions as a gate, the pixel selection P$^+$ layer 121 functions as a source, and the P layer 117 near the signal line N$^+$ layer 116 functions as a drain, and a reset operation for discharging the stored signal charges to the signal line N$^+$ layer 116 by the reset MOS transistor in which the N layer 120 functions as a source, the signal line N$^+$ layer 116 functions as a drain, and the gate conductor layer 119 surrounding the gate insulating layer 118 functions as a gate.

A solid-state imaging device includes a pixel region where pixels are two-dimensionally arranged, and peripheral drive/output circuit regions for driving the pixels in the pixel region and extracting a pixel signal to perform signal processing. FIG. 17B is a view illustrating a cross-sectional structure in which a silicon pillar 115 that forms one pixel in a pixel region, a signal line N$^+$ layer 116, and a pixel selection line conductor layer 122 are electrically connected to upper wiring metal layers 124a and 124b in a peripheral drive/output circuit region. This pixel structure is characterized in that the signal line N$^+$ layer 116 and a pixel selection P$^+$ layer 121 are respectively formed in a lower region and an upper region of the silicon pillar 115. The signal line N$^+$ layer 116 extends from the silicon pillar 115 that forms the pixel to a peripheral drive/output circuit, and is connected to a signal line metal layer 124a through a contact hole 123a in the peripheral drive/output circuit region. The pixel selection line conductor layer 122 connected to the pixel selection P$^+$ layer 121 extends from the silicon pillar 115 that forms the pixel to a peripheral drive/output circuit, and is connected to a pixel selection line metal layer 124b through a contact hole 123b in the peripheral drive/output circuit region. The contact hole 123a on the signal line N$^+$ layer 116 is formed by etching SiO$_2$ layers 125a, 125b, and 125c deposited on the signal line N$^+$ layer 116. The contact hole 123b is formed by etching only the SiO$_2$ layer 125c on the pixel selection line conductor layer 122. This structure inevitably results in a difference between the depth of the contact hole 123a and the depth of the contact hole 123b, the difference corresponding to the height of the silicon pillar 115 that forms the pixel.

The height of the silicon pillar 115 is determined mainly on the basis of the height of the N layer 120 of a photodiode. Light is incident on the upper surface of the pixel selection P$^+$ layer 121 on the silicon pillar 115. The rate of signal charges generated by this light irradiation has a characteristic that it exponentially decreases from the upper surface of the pixel selection P$^+$ layer 121 with respect to the depth of Si. In a solid-state imaging device that senses visible light, a depth of a photoelectric conversion region in the range of 2.5 to 3 μm is necessary in order to efficiently extract signal charges that contribute to the sensitivity (refer to, for example, G. Agranov, R. Mauritzson; J. Ladd, A. Dokoutchaev, X. Fan, X. Li, Z. Yin, R. Johnson, V. Lenchenkov, S. Nagaraja, W. Gazeley, J. Bai, H. Lee, and Yoshinori Takizawa; "Reduction in pixel size and characteristic comparison of CMOS image sensors" Report of the Institute of Image Information and Television Engineers, ITE Technical Report Vol. 33, No. 38, pp. 9-12 (September 2009)). Accordingly, it is necessary that the height of the N layer 120 of the photoelectric conversion photodiode be at least 2.5 to 3 μm. Even when the height of the gate conductor layer 119 of the reset MOS transistor, the gate conductor layer 119 being located under the N layer 120, is 0.1 μm or less, the operation can be performed. Thus, a height of the pixel silicon pillar 115 of at least 2.5 to 3 μm is necessary.

FIG. 17C is a plan view of an example of a solid-state imaging device in the related art. A cross-sectional structural view taken along line G-G' in FIG. 17C corresponds to FIG. 17B. As illustrated in FIG. 17C, silicon pillars $P_{11}$ to $P_{33}$ that form pixels are arranged, and these silicon pillars $P_{11}$ to $P_{33}$ are formed on signal line $N^+$ layers 116a (116), 116b, and 116c formed so as to extend to a peripheral drive/output circuit region in the vertical (column) direction of the figure. The signal line $N^+$ layers 116a (116), 116b, and 116c are respectively connected to signal line metal layers 128a (124a), 128b, and 128c through contact holes 126a (123a), 126b, and 126c in the peripheral drive/output circuit region. Reset MOS gate conductor layers 119a (119), 119b, and 119c and pixel selection line conductor layers 122a (122), 122b, and 122c, which are connected to the silicon pillars $P_{11}$ to $P_{33}$ that form pixels in each row, extend to the peripheral drive/output circuit region in the horizontal (row) direction of the figure. The pixel selection line conductor layers 122a (122), 122b, and 122c are respectively connected to pixel selection line metal layers 129a (124b), 129b, and 129c through contact holes 127a (123b), 127b, and 127c in the peripheral drive/output circuit region.

In FIG. 17C, the contact holes 126a, 126b, and 126c on the signal line $N^+$ layers 116a, 116b, and 116c are formed in the peripheral drive/output circuit region located outside the pixel region. However, in some cases, it is necessary to form the contact holes 126a, 126b, and 126c so as to be adjacent to the pixel silicon pillars $P_{11}$ to $P_{33}$. Referring to FIG. 17C, a signal current in the signal charge reading operation and a stored charge-discharging current in the reset operation are extracted from the signal line metal layers 128a, 128b, and 128c through the contact holes 126a, 126b, and 126c that are respectively provided at terminals of the signal line $N^+$ layers 116a, 116b, and 116c. In the case where the connection between the signal line $N^+$ layers 116a, 116b, and 116c and the corresponding signal line metal layers 128a, 128b, and 128c is established in the peripheral drive/output circuit region, the resistance of the signal line $N^+$ layers 116a, 116b, and 116c between the pixel silicon pillars $P_{11}$ to $P_{33}$ and the corresponding contact holes 126a, 126b, and 126c restricts the response times of the extraction of a signal current and the discharge of stored charges. Accordingly, in order to achieve a high-speed operation, it is necessary to reduce the resistance of this signal line.

FIG. 17D is a plan view of a solid-state imaging device in which the resistance of the signal line is reduced. A cross-sectional structural view taken along line H-H' in FIG. 17D corresponds to FIG. 17B. As illustrated in FIG. 17D, in a pixel region, contact holes $CH_{11}$ to $CH_{33}$ are formed so as to be adjacent to silicon pillars $P_{11}$ to $P_{33}$. The silicon pillars $P_{11}$ to $P_{33}$ each have the structure of the silicon pillar 115 illustrated in FIG. 17B. The contact holes $CH_{11}$ to $CH_{33}$ each have the structure of the contact hole 123a illustrated in FIG. 17B. The silicon pillars $P_{11}$ to $P_{33}$ and the contact holes $CH_{11}$ to $CH_{33}$ are formed on signal line $N^+$ layers 130a, 130b, and 130c extending in the vertical (column) direction of the figure. The signal line $N^+$ layers 130a, 130b, and 130c are respectively connected to signal line metal layers 135a, 135b, and 135c extending in the vertical (column) direction of the figure through the contact holes $CH_{11}$ to $CH_{33}$. Reset MOS gate conductor $N^+$ layers 131a, 131b, and 131c and pixel selection line conductor $N^+$ layers 132a, 132b, and 132c, which extend in each row of the silicon pillars $P_{11}$ to $P_{33}$ that form pixels, extend to a peripheral drive/output circuit region in the horizontal (row) direction of the figure while bypassing the contact holes $CH_{11}$ to $CH_{33}$. The pixel selection line conductor $N^+$ layers 132a, 132b, and 132c are respectively connected to pixel selection line metal layers 134a, 134b, and 134c through contact holes 133a, 133b, and 133c in the peripheral drive/output circuit region.

By establishing the connection of signal lines from the pixels to the peripheral drive/output circuit region using the signal line metal layers 135a, 135b, and 135c respectively connected to the signal line $N^+$ layers 130a, 130b, and 130c through the contact holes $CH_{11}$ to $CH_{33}$, the reduction in the resistance of the signal lines is realized. This is because the resistivity (Ωm) of the signal line $N^+$ layers 130a, 130b, and 130c is about $10^{-5}$ Ωm, whereas the resistivity of the signal line metal layers 135a, 135b, and 135c is about $3 \times 10^{-8}$ Ωm when aluminum (Al) is used and about $1.5 \times 10^{-8}$ Ωm when copper (Cu) is used, and thus the resistivity of the signal line metal layers 135a, 135b, and 135c is sufficiently small. In this case, it is necessary to form the silicon pillars $P_{11}$ to $P_{33}$ that form pixels and the contact holes $CH_{11}$ to $CH_{33}$ in the pixel region. Furthermore, in order to prevent short-circuit of the signal line metal layers 135a, 135b, and 135c, the pixel selection line conductor $N^+$ layers 132a, 132b, and 132c, and the reset MOS gate conductor $N^+$ layers 131a, 131b, and 131c, it is necessary to form the contact holes $CH_{11}$ to $CH_{33}$ so as to bypass the pixel selection line conductor $N^+$ layers 132a, 132b, and 132c and the reset MOS gate conductor $N^+$ layers 131a, 131b, and 131c. In addition, since it is necessary to form the contact holes $CH_{11}$ to $CH_{33}$ so as to be adjacent to the silicon pillars $P_{11}$ to $P_{33}$ that respectively form pixels, it is necessary to form the contact holes $CH_{11}$ to $CH_{33}$ and the silicon pillars $P_{11}$ to $P_{33}$ that respectively form pixels while ensuring a margin for mask alignment of the silicon pillars $P_{11}$ to $P_{33}$ and the contact holes $CH_{11}$ to $CH_{33}$. In this manner, in order to reduce the signal line resistance, it is necessary to form the contact holes $CH_{11}$ to $CH_{33}$ so as to be adjacent to the silicon pillars $P_{11}$ to $P_{33}$ that form pixels and to establish the connection from the pixels to the peripheral drive/output circuit region using the signal line metal layers 135a, 135b, and 135c. Consequently, the degree of pixel integration in the pixel region is decreased.

Currently, regarding the pitch of pixels that are two-dimensionally arranged in a pixel region, the minimum pitch of a commercial product is 1.4 μm, and a product having a pixel pitch of 0.9 μm has been disclosed (refer to, for example, S. G. Wuu, C. C. Wang, B. C. Hseih, Y. L. Tu, C. H. Tseng, T. H. Hsu, R. S. Hsiao, S. Takahashi, R. J. Lin, C. S. Tsai, Y. P. Chao, K. Y. Chou, P. S. Chou, H. Y. Tu, F. L. Hsueh, L. Tran; "A Leading-Edge 0.9 μm Pixel CMOS Image Sensor Technology with Backside Illumination: Future Challenges for Pixel Scaling", IEDM2010 Digest Papers, 14.1.1 (2010)). In the case where a design rule (minimum design dimension) is 0.2 μm (200 nm), a planar shape of a contact hole is usually formed with consideration of this minimum design dimension. In this case, the aspect ratio of the contact hole 123a on the signal line N+ layer 116 illustrated in FIG. 17B (the ratio of the depth to the width of the contact hole) is at least 12.5 to 15. In order to reduce the cost of solid-state imaging devices, a further reduction in the area of a pixel region has been required. To achieve this, it is necessary to decrease the minimum processing dimension. In view of a requirement of a photoelectric conversion characteristic, the height of the silicon pillar 115 is determined to be 2.5 to 3 μm, and thus it is required to form a contact hole 123a having a higher aspect ratio.

As illustrated in FIG. 17B, in the solid-state imaging devices illustrated in FIGS. 17C and 17D, it is necessary to form the two contact holes 123a and 123b having depths that differ by at least the height of the silicon pillar 115 that forms a pixel. In general, since the contact holes 123a and 123b are separately formed, the number of steps is increased. Furthermore, the degree of pixel integration is decreased because it is necessary to separately ensure a margin of mask alignment in the formation of the contact holes 123a and 123b. Alternatively, in the case where the two contact holes 123a and 123b are formed at the same time, in terms of manufacturing, it may be difficult to stop the formation of the contact holes by reactive ion etching (RIE) or the like with good controllability on the surfaces of the signal line N+ layer 116 and the pixel selection line conductor layer 122. Furthermore, in the case where the two contact holes are formed at the same time, the device is additionally exposed to an etching gas from after the etching of the contact hole 123b reaches the pixel selection line conductor layer 122 of the bottom and until the etching of the contact hole 123a reaches the surface of the signal line N+ layer 116. Therefore, it is necessary to increase the thickness of the pixel selection line conductor layer. In addition, when the etching time becomes long, there may be a problem that it becomes difficult to remove a mask layer for etching after RIE and to remove etching residue. With an increase in the aspect ratio of the contact hole, these difficulties in the production process become significant.

Similarly to the solid-state imaging device described above, a surrounding gate transistor (SGT) is known as a semiconductor device in which a circuit element is formed in a silicon pillar. An SGT has a structure in which a gate conductor layer is formed on the outer periphery of a silicon pillar with a gate insulating layer therebetween. Furthermore, the SGT includes impurity diffusion layers functioning as a source or a drain in portions of the silicon pillar located on the upper part and a lower part of the gate conductor layer, and the silicon pillar between the source and drain impurity diffusion layers functions as a channel of a MOS transistor (refer to, for example, FIGS. 32, 33, and 34 of U.S. Patent Application Publication No. 2010/0213539).

An example of a CMOS inverter circuit using SGTs in the related art will now be described with reference to FIGS. 18A, 18B, and 18C. FIG. 18A is a circuit diagram of an inverter circuit using SGTs. The inverter circuit includes two P-channel SGTs 125a and 125b and one N-channel SGT 125c. Gates of all the SGTs 125a, 125b, and 125c are connected to an input terminal Vi, drains of the P-channel SGTs 125a and 125b are connected to a power supply terminal Vcc, sources of the P-channel SGTs 125a and 125b and a source of the N-channel SGT 125c are connected to an output terminal Vo, and a drain of the N-channel SGT 125c is connected to a ground terminal Vss. In this circuit, a signal voltage input to the input terminal Vi is inverted and output from the output terminal Vo. The input terminal Vi is connected to a gate terminal Vi1 of the P-channel SGTs 125a and 125b and to a gate terminal Vi2 of the N-channel SGT 125c.

FIG. 18B is a plan view illustrating a case where the CMOS inverter circuit illustrated in FIG. 18A is formed on a silicon oxide substrate 131 by applying a known technique. A source P+ layer 126a of the P-channel SGTs 125a and 125b and a source N+ layer 126b of the N-channel SGT 125c are formed so as to contact each other. Silicon pillars 127a and 127b that form the P-channel SGTs 125a and 125b are formed on the source P+ layer 126a. A silicon pillar 127c that forms the N-channel SGT 125c is formed on the N+ layer 126b. A gate conductor layer 128a of the SGTs 125a and 125b is continuously formed so as to surround the silicon pillars 127a and 127b. The gate conductor layer 128a is connected to an input wiring metal layer 130a (Vi1) through a contact hole 129a. A gate conductor layer 128b of the SGT 125c is continuously formed so as to surround the silicon pillar 127c. The gate conductor layer 128b is connected to an input wiring metal layer 130e (Vi2) through a contact hole 129f. Drains of the P-channel SGTs 125a and 125b are connected to a power supply wiring metal layer 130b (Vcc) through contact holes 129b and 129c formed on the silicon pillars 127a and 127b, respectively. The P+ layer 126a and the N+ layer 126b are connected to an output wiring metal layer 130c (Vo) through a contact hole 129d formed on a boundary portion of the two layers. A source of the N-channel SGT 125c is connected to a ground wiring metal layer 130d (Vss) through a contact hole 129e formed on the silicon pillar 127c.

FIG. 18C is a cross-sectional structural view taken along line J-J' in FIG. 18B. As illustrated in FIG. 18C, a planar silicon layer 132 is formed on an embedded oxide film 131. The planar silicon layer 132 includes a source P+ layer 126a and a source N+ layer 126b. A silicide layer 133 for directly connecting the source P+ layer 126a to the source N+ layer 126b is formed on a surface near a boundary portion between the source P+ layer 126a and the source N+ layer 126b. The P-channel SGTs 125a and 125b are formed in silicon pillars 127a and 127b on the source P+ layer 126a, and the N-channel SGT 125c is formed in a silicon pillar 127c on the source N+ layer 126b. Gate insulating layers 136a, 136b, and 136c formed of high-k (high dielectric constant) films, such as HfO$_2$ films, are formed so as to surround the silicon pillars 127a, 127b, and 127c, respectively. Gate conductor layers 128a and 128b formed of metal films such as TaN or TiN films are formed so as to surround the gate insulating layers. A drain N+ layer 139 is formed in an upper region of the silicon pillar 127c forming the N-channel SGT 125c. Drain P+ layers 138a and 138b are respectively formed in upper regions of the silicon pillars 127a and 127b forming the P-channel SGTs 125a and 125b. Furthermore, a contact stopper SiN layer 140 is formed so as to cover these layers. An interlayer SiO$_2$ layer 141 is formed on the SiN layer 140. Furthermore, contact holes 129a, 129b, 129c, 129d, 129e, and 129f penetrating the planarized SiO$_2$ layer 141 are formed.

The silicide layer 133 in the boundary portion between the source P+ layer 126a and the source N+ layer 126b is connected to an output wiring metal layer 130c (Vo) through the contact hole 129d. The drain N+ layer 139 in the upper region of the silicon pillar 127c is connected to a ground wiring metal layer 130d (Vss) through the contact hole 129e. The drain P+ layers 138a and 138b in the upper region of the silicon pillars 127a and 127b forming the P-channel SGTs 125a and 125b are connected to a power supply wiring metal layer 130b (Vcc) through the contact holes 129b and 129c, respectively. The gate conductor layer 128a surrounding the silicon pillars 127a and 127b is connected to an input wiring metal layer 130a (Vi1) through the contact hole 129a. The gate conductor layer 128b surrounding the silicon pillar 127c is connected to an input wiring metal layer 130e (Vi2) through the contact hole 129f.

As is understood from FIG. 18C, regarding the heights of the contact holes 129a, 129f, 129b, 129c, 129d, and 129e respectively connected to the input wiring metal layers 130a (Vi1) and 130e (Vi2), 130b (Vcc), 130c (Vo), and 130d (Vss), the contact holes 129a and 129f are the deepest, the contact hole 129d is the second deepest, and the contact holes 129b, 129c, and 129e have the same depth and are the shallowest. In addition, the materials of the gate conductor layers 128a and 128b, the drain P+ layers 138a and 138b, the drain IN layer 139, and the silicide layer 133 that are respectively connected to the bottoms of the contact holes 129a, 129f, 129b, 129c, 129e, and 129d are different. Therefore, as in the case of the solid-state imaging device described above, the number of steps is increased because the contact holes are separately formed, and the degree of circuit integration is decreased by ensuring the margins of mask alignment in forming the respective contact holes. Alternatively, in the case where the contact holes 129a, 129b, 129c, 129d, 129e, and 129f are formed by reactive ion etching (RIE) or the like, it is necessary to stop etching with good controllability on the surfaces of the gate conductor layer 128a and 128b, the drain P+ layers 138a and 138b, the drain N+ layer 139, and the silicide layer 133. In addition, in terms of manufacturing, it may be difficult to remove a mask layer for etching after the RIE etching and to remove etching residue, for example. Furthermore, the contact hole 129d is provided between the silicon pillar 127c of the N-channel SGT 125c and the silicon pillars 127a and 127b of the P-channel SGTs 125a and 125b, and thus the gate conductor layers 128a and 128b cannot be formed on the contact hole 129d. Accordingly, the gate conductor layer 128a of the P-channel SGTs 125a and 125b and the gate conductor layer 128b of the N-channel SGT 125c are respectively connected to the separate input wiring metal layers 130a (Vi1) and 130e (Vi2) through the separate contact holes 129a and 129f. This connection structure decreases the degree of integration of the CMOS inverter circuit illustrated in FIG. 18A.

SUMMARY OF THE INVENTION

In the pixels of the solid-state imaging devices illustrated in FIGS. 17A to 17D, and the semiconductor device using SGTs illustrated in FIGS. 18A to 18C, a pixel or an SGT is formed in a silicon pillar. In the case where a pixel or an SGT is formed in a silicon pillar, diffusion layers that are doped with a donor impurity or an acceptor impurity and located in an upper portion of the silicon pillar and in a lower region of the silicon pillar are connected to an upper wiring metal layer through contact holes. This structure results in a difference between the depth of the contact hole connected to the upper portion of the silicon pillar and the depth of the contact hole connected to the lower region of the silicon pillar, the difference corresponding to the height of the silicon pillar. As a result, it is necessary to separately form contact holes having different depths. In this case, the number of steps is increased, and the degree of circuit integration is decreased by separately ensuring the margins of mask alignment in forming the respective contact holes. Furthermore, in the case where such two contact holes are formed at the same time, in terms of manufacturing, it may be difficult to stop etching with good controllability on the surfaces of a semiconductor layer and a conductor layer by reactive ion etching (RIE) or the like. Furthermore, in the case where two contact holes are formed at the same time, it is difficult to form a thick mask layer for etching such as RIE so as to form a deep contact hole, to remove the mask layer for etching after the RIE etching, and, furthermore, to remove etching residue. To solve these problems, a semiconductor device and a method for producing a semiconductor device, in which an increase in the number of steps is suppressed, a decrease in the degree of circuit integration is prevented, and contact holes can be easily formed, have been desired. Furthermore, the degree of circuit integration is decreased when a conductor wiring layer is formed on the outer periphery of a silicon pillar while bypassing a contact hole-forming region where a diffusion layer doped with a donor or acceptor impurity and located in the lower portion of the silicon pillar is connected to an upper wiring metal layer. Thus, it is desirable to prevent such a decrease in the degree of circuit integration.

The present invention has been made in view of the above circumstances, and an object of the present invention is to provide a semiconductor device and a method for producing a semiconductor device in which a decrease in the degree of circuit integration can be prevented.

To achieve the above object, a method for producing a semiconductor device according to a first aspect of the present invention includes a pillar-shaped semiconductor-forming step of forming a first pillar-shaped semiconductor and a second pillar-shaped semiconductor on a substrate at the same time so as to have the same height; a pillar-shaped semiconductor bottom-connecting step of forming a first semiconductor layer by doping, with a donor or acceptor impurity, at least one of a bottom region of the first pillar-shaped semiconductor and a region that contacts the bottom region at a lower position to connect the first semiconductor layer and the second pillar-shaped semiconductor to each other; a circuit element-forming step of forming a circuit element including an upper semiconductor region by doping an upper region of the first pillar-shaped semiconductor with a donor or acceptor impurity to form the upper semiconductor region; a conductor layer-forming step of forming a first conductor layer in the second pillar-shaped semiconductor; a contact hole-forming step of forming a first contact hole and a second contact hole that are respectively connected to the first pillar-shaped semiconductor and the second pillar-shaped semiconductor; a wiring metal layer-forming step of forming a wiring metal layer that is connected to each of the upper semiconductor region and the first conductor layer through the first contact hole and the second contact hole, respectively; a step of forming a first insulating layer so as to surround the first pillar-shaped semiconductor; and a pillar-shaped-semiconductor-connecting conductor layer-forming step of forming a pillar-shaped-semiconductor-connecting conductor layer so as to surround the first insulating layer and the second pillar-shaped semiconductor and to connect the first pillar-shaped semiconductor to the second pillar-shaped semiconductor.

The method may further include a step of forming a second conductor layer on the same surface as the upper semiconductor region so as to be connected to the upper semiconductor region, wherein, in the contact hole-forming step, the first contact hole and the second contact hole are respectively formed on the second conductor layer and the second pillar-shaped semiconductor so as to be connected to the second conductor layer and the second pillar-shaped semiconductor, and in the wiring metal layer-forming step, a wiring metal layer that is connected to the second conductor layer and the first conductor layer through the first contact hole and the second contact hole, respectively, is formed.

The conductor layer-forming step may include a step of doping, with a donor or acceptor impurity, the second pillar-shaped semiconductor to form the first conductor layer or a step of embedding any one of a polycrystalline semiconductor layer doped with a donor or acceptor, a silicide layer, and a metal layer in the second pillar-shaped semiconductor to form the first conductor layer.

In the pillar-shaped-semiconductor-connecting conductor layer-forming step, a second insulating layer may be further formed so as to surround the second pillar-shaped semiconductor, and the pillar-shaped-semiconductor-connecting conductor layer may be formed so as to surround the first and second insulating layers and to connect the first pillar-shaped semiconductor to the second pillar-shaped semiconductor.

The method may further include a step of forming a pillar-shaped-semiconductor-connecting upper conductor layer above the pillar-shaped-semiconductor-connecting conductor layer so as to surround the first and second insulating layers and to connect the first pillar-shaped semiconductor to the second pillar-shaped semiconductor.

The pillar-shaped semiconductor bottom-connecting step may be a step of doping, with a donor or acceptor impurity, at least one of a bottom region of the first pillar-shaped semiconductor and a region that contacts the bottom region at a lower position to form a first semiconductor layer, and connecting the first semiconductor layer to the second pillar-shaped semiconductor by forming a fourth conductor layer on the substrate.

The second insulating layer may be formed using an insulating material having a capacitance lower than that of the first insulating layer.

The method may further include a step of forming the first pillar-shaped semiconductor and a third pillar-shaped semiconductor at the same time so as to have the same height; a step of forming, in the third pillar-shaped semiconductor, an impurity diffusion layer containing a donor or acceptor impurity, a silicide layer, or a metal layer; and a step of forming the pillar-shaped-semiconductor-connecting conductor layer on the outer periphery of the first pillar-shaped semiconductor, with the first insulating layer therebetween, so as to extend from the outer periphery of the first pillar-shaped semiconductor to the third pillar-shaped semiconductor, to surround the third pillar-shaped semiconductor, and to connect, in a lower region of the third pillar-shaped semiconductor, to the impurity diffusion layer containing a donor or acceptor impurity, the silicide layer, or the metal layer that is formed in the third pillar-shaped semiconductor.

A semiconductor device according to a second aspect of the present invention includes a substrate; a first pillar-shaped semiconductor and a second pillar-shaped semiconductor that are formed on the substrate and that have the same height; a first semiconductor layer doped with a donor or acceptor impurity and formed in at least one of a bottom region of the first pillar-shaped semiconductor and a region that contacts the bottom region at a lower position, the first semiconductor layer and the second pillar-shaped semiconductor being connected to each other; a circuit element including an upper semiconductor region doped with a donor or acceptor impurity, the circuit element being formed in an upper region of the first pillar-shaped semiconductor; a first conductor layer formed in the second pillar-shaped semiconductor; a first contact hole and a second contact hole that are respectively connected to the first pillar-shaped semiconductor and the second pillar-shaped semiconductor; a wiring metal layer that is connected to the upper semiconductor region and the first conductor layer through the first contact hole and the second contact hole, respectively; a first insulating layer and a second insulating layer that are formed so as to respectively surround the first pillar-shaped semiconductor and the second pillar-shaped semiconductor; and the pillar-shaped-semiconductor-connecting conductor layer that surrounds at least the first insulating layer out of the first and second insulating layers and that extends to the second insulating layer.

A height of the pillar-shaped-semiconductor-connecting conductor layer on the outer periphery of the second pillar-shaped semiconductor may be smaller than a height of the pillar-shaped-semiconductor-connecting conductor layer on the outer periphery of the first pillar-shaped semiconductor and may be larger than a thickness of the pillar-shaped-semiconductor-connecting conductor layer.

The semiconductor device may be a solid-state imaging device, and a pixel of the solid-state imaging device may include the first pillar-shaped semiconductor and the second pillar-shaped semiconductor, and have the circuit element. The pixel may include a bottom semiconductor layer functioning as the first semiconductor layer formed on the substrate, a second semiconductor layer formed on the bottom semiconductor layer in the first pillar-shaped semiconductor and composed of a semiconductor having a conductivity type opposite to that of the bottom semiconductor layer or an intrinsic semiconductor, the pillar-shaped-semiconductor-connecting conductor layer formed on the outer periphery of the second semiconductor layer, with the first insulating layer therebetween, so as to be located above the bottom semiconductor layer, a third semiconductor layer formed on an outer peripheral portion of the second semiconductor layer so as to be located above the pillar-shaped-semiconductor-connecting conductor layer, the third semiconductor layer having the same conductivity type as that of the first semiconductor layer, and a fourth semiconductor layer functioning as the upper semiconductor region connected to the second semiconductor layer and formed on the third semiconductor layer, the fourth semiconductor layer having a conductivity type opposite to that of the bottom semiconductor layer. A bottom region of the first pillar-shaped semiconductor and the first conductor layer in the second pillar-shaped semiconductor may be connected to each other through the bottom semiconductor layer.

The semiconductor device may include a surrounding gate transistor (SGT), and the SGT may be formed as the circuit element in the first pillar-shaped semiconductor. The SGT may include a bottom semiconductor region functioning as the first semiconductor layer and formed on the substrate, a channel semiconductor layer connected to an upper portion of the bottom semiconductor region and composed of a semiconductor having a conductivity type opposite to that of the bottom semiconductor region or an intrinsic semiconductor, an insulating layer formed on the outer periphery of the channel semiconductor layer, and a conductor layer formed on the outer periphery of the channel semiconductor layer with the insulating layer therebetween. The upper semiconductor region may be connected to an upper portion of the channel semiconductor layer and may have a conductivity type the same as that of the bottom semiconductor region, and the upper semiconductor region may function as a drain when the bottom semiconductor region functions as a source of the SGT while the upper semiconductor region may function as a source when the bottom semiconductor region functions as a drain of the SGT. The bottom semiconductor region and the first conductor layer in the second pillar-shaped semiconductor may be connected to each other.

The semiconductor device may be a solid-state imaging device, and, in a pixel region where a plurality of the pixels are arranged, the first pillar-shaped semiconductors that form the respective pixels and the second pillar-shaped semiconductors may be two-dimensionally arranged in a vertical (column) direction and in a horizontal (row) direction.

The semiconductor device may be a solid-state imaging device, the bottom semiconductor layer functioning as the first semiconductor layer may be connected, for each column in which the first pillar-shaped semiconductors are arranged in the vertical direction, to bottom regions of the first pillar-shaped semiconductors in the column and extends in the vertical (column) direction to form a first semiconductor-layer-connecting conductor layer, the first semiconductor-layer-connecting conductor layer may be connected to bottom regions of the second pillar-shaped semiconductors adjacent to the corresponding first pillar-shaped semiconductors on the first semiconductor-layer-connecting conductor layer, the pillar-shaped-semiconductor-connecting conductor layers of the first pillar-shaped semiconductors may be connected to each other so as to block light incident between the first pillar-shaped semiconductors adjacent to each other in the row direction to form a second semiconductor-layer-connecting conductor layer extending in the horizontal (row) direction, and the semiconductor device may include a third semiconductor-layer-connecting conductor layer that extends in the horizontal (row) direction so as to block light incident between the first pillar-shaped semiconductors adjacent to each other in the column direction and that is connected to the fourth semiconductor layer of each of the first pillar-shaped semiconductors. A plurality of the second pillar-shaped semiconductors may be formed in a region where at least one of the second semiconductor-layer-connecting conductor layer and the third semiconductor-layer-connecting conductor layer is formed, a contact hole may be formed on each of the second pillar-shaped semiconductors, and the first semiconductor-layer-connecting conductor layer and the wiring metal layer may be connected to each other through the contact hole and the first conductor layer in each of the second pillar-shaped semiconductors.

The semiconductor device may be a solid-state imaging device, in a pixel region where the pixels are arranged, the bottom semiconductor layer functioning as the first semiconductor layer may extend, for each column in which the first pillar-shaped semiconductors are arranged in the vertical direction, in the vertical (column) direction to form a first semiconductor-layer-connecting conductor layer, the pillar-shaped-semiconductor-connecting conductor layers of the first pillar-shaped semiconductors may be connected to each other to form a second semiconductor-layer-connecting conductor layer extending in the horizontal (row) direction, and the semiconductor device may include a third semiconductor-layer-connecting conductor layer that is connected to the fourth semiconductor layer of the first pillar-shaped semiconductors and that extends in the horizontal (row) direction. The second semiconductor-layer-connecting conductor layer and the third semiconductor-layer-connecting conductor layer may be formed so as to have a portion where the second semiconductor-layer-connecting conductor layer and the third semiconductor-layer-connecting conductor layer overlap each other when viewed from a direction in which electromagnetic energy waves are incident, and the second pillar-shaped semiconductors may be formed on the first semiconductor-layer-connecting conductor layer and between the first pillar-shaped semiconductors adjacent to each other in the horizontal (row) direction.

The semiconductor device may include a surrounding gate transistor (SGT), a plurality of the first pillar-shaped semiconductors may be arranged, the pillar-shaped-semiconductor-connecting conductor layer of the first pillar-shaped semiconductors may extend so as to connect the plurality of first pillar-shaped semiconductors to each other, the second pillar-shaped semiconductor may be formed in a region where the pillar-shaped-semiconductor-connecting conductor layer is formed, a second insulating layer may be formed so as to surround the second pillar-shaped semiconductor, and the pillar-shaped-semiconductor-connecting conductor layer may be formed on the outer periphery of the second pillar-shaped semiconductor with the second insulating layer therebetween.

The first pillar-shaped semiconductor, the second pillar-shaped semiconductor, and a third pillar-shaped semiconductor, the whole of which is covered with a third insulating layer, may be formed on the substrate, a sixth semiconductor layer may be formed in an upper region of the first pillar-shaped semiconductor, and a seventh semiconductor layer may be formed in a lower region of the first pillar-shaped semiconductor, a first insulating layer and a second insulating layer may be formed so as to respectively surround the first pillar-shaped semiconductor and the second pillar-shaped semiconductor, the pillar-shaped-semiconductor-connecting conductor layer may include at least one layer, and may be formed on the outer periphery of the first pillar-shaped semiconductor so as to surround the first insulating layer and on the outer periphery of the second pillar-shaped semiconductor so as to surround the second insulating layer, and the pillar-shaped-semiconductor-connecting conductor layer may be connected to a top surface of the third pillar-shaped semiconductor, contact holes may be formed so as to be connected to each of the third pillar-shaped semiconductor, the sixth semiconductor layer on the first pillar-shaped semiconductor, and the second pillar-shaped semiconductor, and the semiconductor device may include a wiring metal layer that is connected to the sixth semiconductor layer, the seventh semiconductor layer, and the pillar-shaped-semiconductor-connecting conductor layer through the contact holes.

A first insulating layer and a second insulating layer may be formed so as to respectively surround the first pillar-shaped semiconductor and the second pillar-shaped semiconductor, and the pillar-shaped-semiconductor-connecting conductor layer may be connected to the first conductor layer on an upper portion of the second pillar-shaped semiconductor.

The first pillar-shaped semiconductor and a third pillar-shaped semiconductor may be formed at the same time so as to have the same height, an impurity diffusion layer containing a donor or acceptor impurity, a silicide layer, or a metal layer may be formed in the third pillar-shaped semiconductor, and the pillar-shaped-semiconductor-connecting conductor layer may extend to the third pillar-shaped semiconductor, surrounds the third pillar-shaped semiconductor, and may be connected to the impurity diffusion layer containing a donor or acceptor impurity, the silicide layer, or the metal layer formed in the third pillar-shaped semiconductor in a lower region of the third pillar-shaped semiconductor.

According to a method for producing a semiconductor device and a semiconductor device according to the present invention, an upper region and a lower region of a pillar-shaped semiconductor that forms a circuit element can be easily connected to a wiring layer arranged above the pillar-shaped semiconductor, and high integration, high-speed driving, and stable operation of a semiconductor device including a circuit element can be realized.

BRIEF DESCRIPTION OF THE DRAWINGS

FIG. 1A is a plan view illustrating a solid-state imaging device according to a first embodiment of the present invention;

FIG. 1B is a cross-sectional structural view illustrating the solid-state imaging device according to the first embodiment;

FIG. 8A is a plan view illustrating a solid-state imaging device according to a sixth embodiment of the present invention;

FIG. 9B is a cross-sectional structural view illustrating the solid-state imaging device according to the seventh embodiment;

FIG. 11C is a cross-sectional structural view illustrating the CMOS inverter circuit using SGTs according to the ninth embodiment, the CMOS inverter circuit being formed by a known technique;

FIG. 11D is a cross-sectional structural view illustrating the CMOS inverter circuit using SGTs according to the ninth embodiment, the CMOS inverter circuit being formed by a known technique;

DETAILED DESCRIPTION OF THE PREFERRED EMBODIMENTS

Figure 2A:
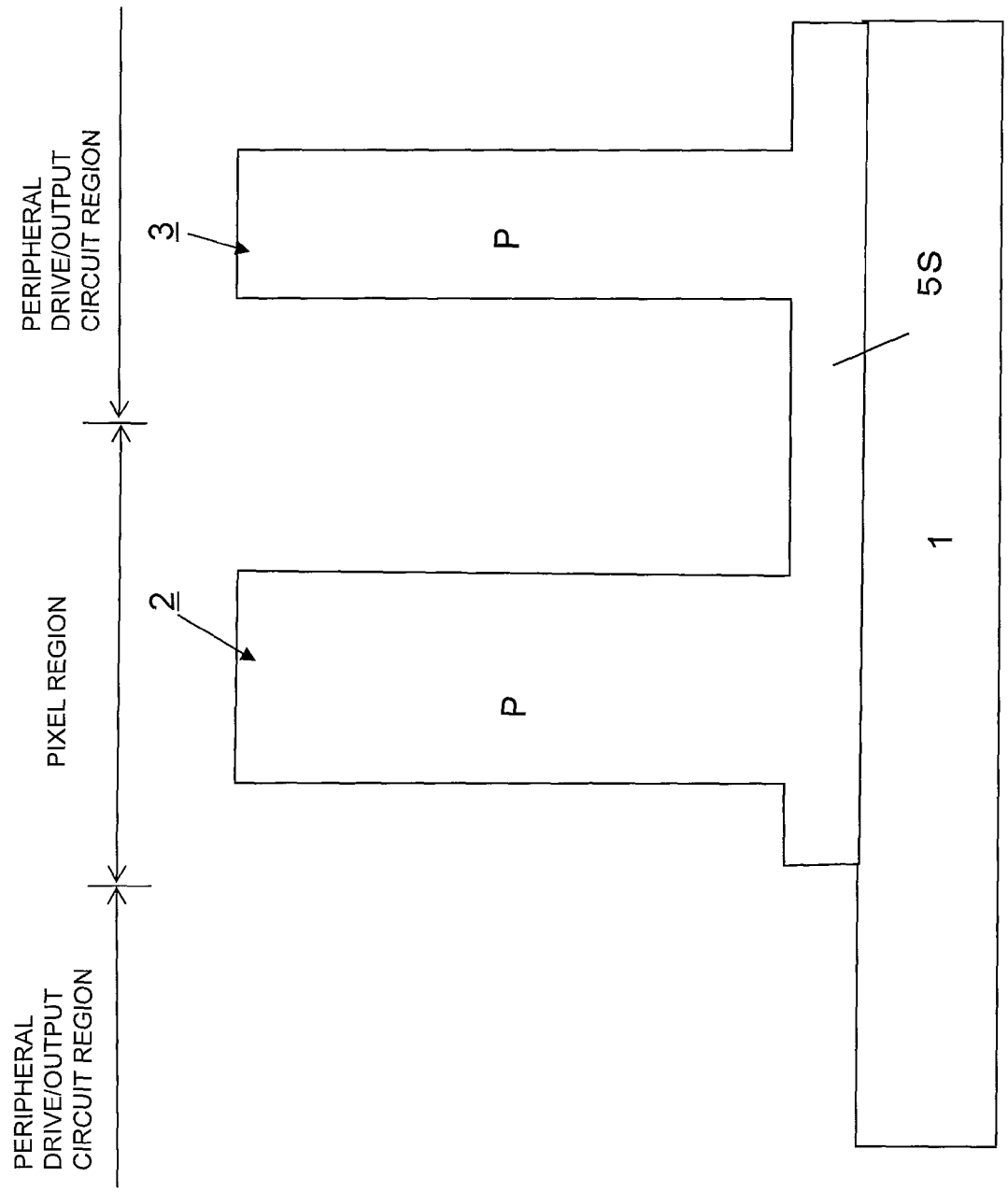
FIG. 2A is a cross-sectional structural view illustrating a method for producing a solid-state imaging device according to the first embodiment.

Methods for producing a semiconductor device according to embodiments of the present invention and semiconductor devices produced by the production methods will now be described with reference to the drawings.

First Embodiment

A solid-state imaging device according a first embodiment of the present invention, and a method for producing the solid-state imaging device will now be described with reference to FIGS. 1A, 1B, and 2A to 2F.

FIG. 1A is a plan view of a solid-state imaging device according to this embodiment. In a pixel region of the solid-state imaging device, silicon pillars $P_{11}$ to $P_{33}$ that form pixels are arranged in a vertical (column) direction and a horizontal (row) direction two-dimensionally (in a matrix). These silicon pillars $P_{11}$ to $P_{33}$ are formed on signal line $N^+$ layers $5a$, $5b$, and $5c$ that are formed on a silicon oxide substrate 1 and that extend in the vertical (column) direction of the figure and to a peripheral drive/output circuit region. The signal line $N^+$ layers $5a$, $5b$, and $5c$ are respectively connected to signal line metal layers $26a$, $26b$, and $26c$ through contact holes SCa, SCb, and SCc that are respectively formed on second silicon pillars Ca, Cb, and Cc in the peripheral drive/output circuit region provided in an upper part and a left part of the figure. The silicon pillars $P_{11}$ to $P_{33}$ are surrounded by reset MOS gate conductor layers $7a$, $7b$, and $7c$ extending in the horizontal (row) direction. Pixel selection line conductor layers $14a$, $14b$, and $14c$ extend to the peripheral drive/output circuit region in the horizontal (row) direction of the figure, and respectively connected to pixel selection line metal layers $17aa$, $17ab$, and $17ac$ through contact holes $16aa$, $16ab$, and $16ac$ in the peripheral drive/output circuit region.

FIG. 1B is a cross-sectional structural view taken along line A-A' in FIG. 1A. A planar signal line $N^+$ layer 5 ($5a$) is formed on a silicon oxide substrate 1. A first silicon pillar 2 ($P_{11}$) that forms a pixel and a second silicon pillar 3 (Ca) that establishes contact are formed on the signal line $N^+$ layer 5 ($5a$). The signal line $N^+$ layer 5 ($5a$) is formed in a lower region of the first silicon pillar 2 ($P_{11}$) and the second silicon pillar 3 (Ca) by thermal diffusion of a donor impurity. Insulating layers $4b$ and $4c$ composed of silicon oxide ($SiO_2$) are formed so as to cover the first silicon pillar 2 ($P_{11}$), the second silicon pillar 3 (Ca), and the signal line $N^+$ layer 5 ($5a$). This insulating layer $4b$ is a gate insulating layer. A $SiO_2$ layer 6 is formed on the silicon oxide substrate 1, and a reset MOS gate conductor layer 7 ($7a$) is formed on the $SiO_2$ layer 6 and the outer periphery of the gate insulating layer $4b$ of the first silicon pillar 2 ($P_{11}$). A photodiode N layer 9 is formed on an outer peripheral portion of a P layer $8a$, the outer peripheral portion being located in an upper portion of the first silicon pillar 2 ($P_{11}$), so as to be adjacent to the reset MOS gate conductor layer 7 ($7a$). A $SiO_2$ layer 10 is formed on the $SiO_2$ layer 6. A pixel selection $P^+$ layer 11 is formed in an upper region of the first silicon pillar 2 ($P_{11}$). A conductor $N^+$ layer 13 is formed by introducing a donor impurity into the second silicon pillar 3 (Ca). In addition, a pixel selection line conductor layer 14 ($14a$) connected to the pixel selection $P^+$ layer 11 is formed. Furthermore, a $SiO_2$ layer 15 is deposited so as to cover the whole structure. Contact holes $16a$ ($16aa$) and $16b$ (SCa) are formed in the $SiO_2$ layer 15. The pixel selection line conductor layer 14 ($14a$) is connected to a pixel selection line metal layer $17a$ ($17aa$) through the contact hole $16a$ ($16aa$). The conductor $N^+$ layer 13 is connected to a signal line metal layer $17b$ ($26a$) through the contact hole $16b$ (SCa). In this embodiment, the contact holes $16a$ ($16aa$) and $16b$ (SCa) having the same depth are formed on the first silicon pillar 2 ($P_{11}$) and the second silicon pillar 3 (Ca).

A method for producing a solid-state imaging device according to this embodiment will now be described with reference to FIGS. 2A to 2F. This production method is a method for producing the solid-state imaging device illustrated in the cross-sectional structural view of FIG. 1B.

The method for producing a solid-state imaging device of this embodiment includes a pillar-shaped semiconductor-forming step of forming a planer silicon layer 5S on a silicon oxide substrate 1, and forming, on the planer silicon layer 5S, a first silicon pillar 2 that forms a pixel of a solid-state imaging device and a second silicon pillar 3 that establishes contact at the same time so as to have the same height; a pillar-shaped semiconductor bottom-connecting step of doping, with a donor or acceptor impurity, at least one of a bottom region of the first silicon pillar 2 and a region that contacts the bottom region at a lower position to form a signal line $N^+$ layer 5, and connecting the signal line $N^+$ layer 5 and the second silicon pillar 3 to each other; a circuit element-forming step of forming a circuit element including a $P^+$ layer 11 formed by doping an upper region of the first silicon pillar 2 with a donor or acceptor impurity; a conductor layer-forming step of forming a conductor $N^+$ layer 13 in the second silicon pillar 3; a pixel selection line conductor layer-forming step of forming a pixel selection line conductor layer 14 that is connected to the $P^+$ layer 11 formed in the upper region of the first silicon pillar 2 and that is flush with the $P^+$ layer 11; a contact hole-forming step of forming contact holes $16a$ and $16b$ that are respectively connected to the first silicon pillar 2 or the pixel selection line conductor layer 14 and the second silicon pillar 3; a wiring metal layer-forming step of forming a pixel selection line metal layer $17a$ connected to the $P^+$ layer 11 in the upper region of the first silicon pillar 2 or the pixel selection line conductor layer 14 connected to the $P^+$ layer 11 through the contact hole $16a$ and forming a signal line metal layer $17b$ connected to the conductor $N^+$ layer 13 of the second silicon pillar 3 through the contact hole $16b$; a step of forming $SiO_2$ layers $4b$ and $4c$ so as to respectively surround the first silicon pillar 2 and the second silicon pillar 3; and a step of forming a gate conductor layer 7 including at least one layer so as to surround at least the $SiO_2$ layer $4b$ out of the $SiO_2$ layers $4b$ and $4c$ and to be connected to the $SiO_2$ layer $4c$. Here, the gate conductor layer 7 formed on the outer periphery of the P layer $8a$, with the $SiO_2$ layer $4b$ therebetween, and a photodiode including the P layer $8a$, which is formed on the signal line $N^+$ layer 5, and the N layer 9, which is formed on an outer peripheral portion of the P layer $8a$ so as to be adjacent to the gate conductor layer 7, form a pixel functioning as a circuit element.

The method for producing a solid-state imaging device according to this embodiment will now be described in more detail with reference to FIGS. 2A to 2F. As illustrated in FIG. 2A, in a pixel region of a solid-state imaging device of this embodiment, a planar silicon layer 5S is formed on a silicon oxide substrate 1, and a first silicon pillar 2 that forms a pixel is formed on the planar silicon layer 5S. In a peripheral drive/output circuit region, a second silicon pillar 3 that establishes contact is formed. Thus, the first silicon pillar 2 and the second silicon pillar 3 are connected to each other through the planar silicon layer 5S. As illustrated in FIG. 2A, a silicon layer having a height of the first silicon pillar 2 and the second silicon pillar 3 and formed on the silicon oxide substrate 1 is etched to a height of the planar silicon layer 5S by Si etching by RIE using a Si oxide film ($SiO_2$ film) and a Si nitride film ($Si_3N_4$ film) as a mask. Thus, the first silicon pillar 2 and the second silicon pillar 3 are formed at the same time so as to have the same height.

Figure 2B:
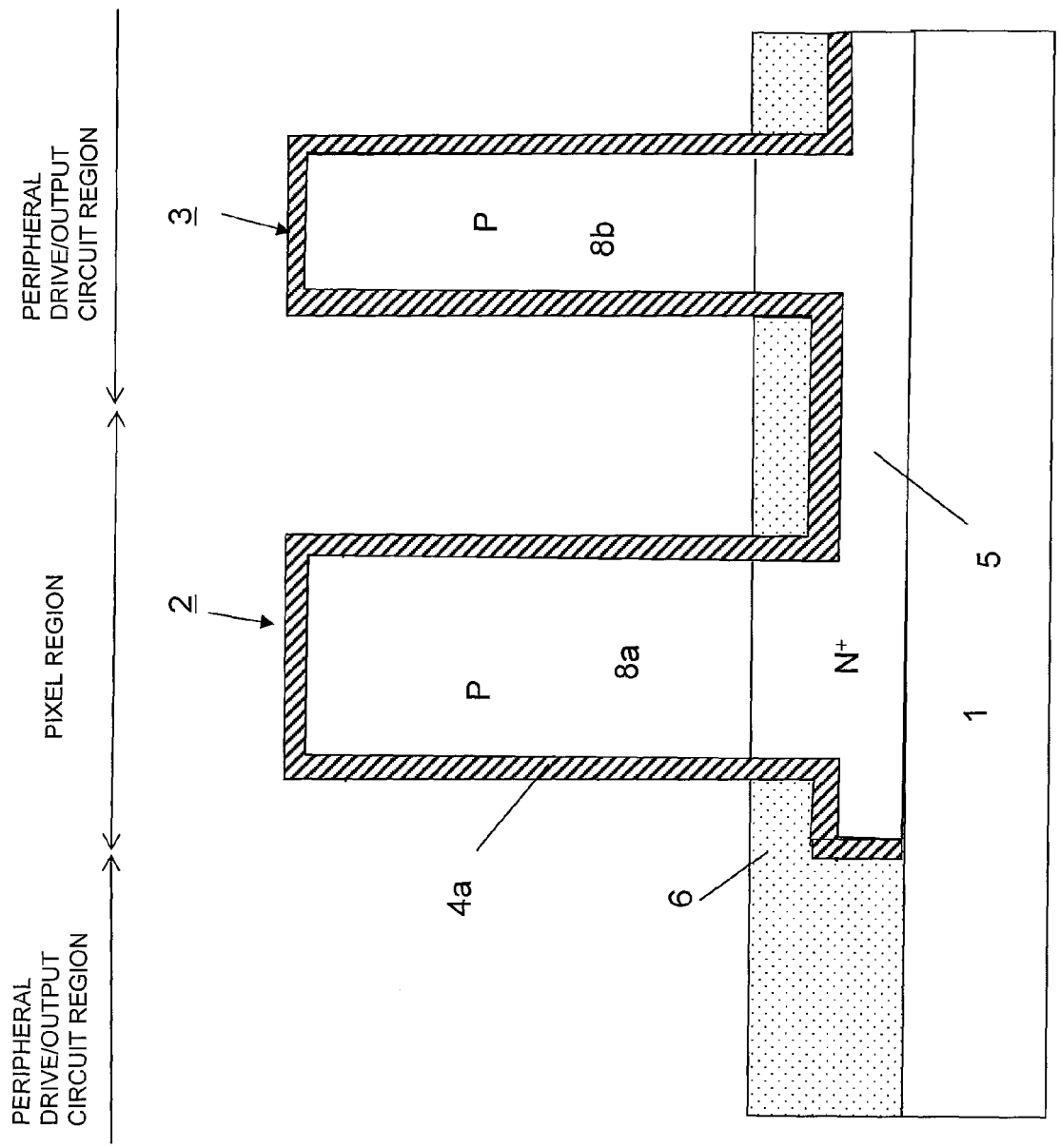
FIG. 2B is a cross-sectional structural view illustrating the method for producing a solid-state imaging device according to the first embodiment.

Subsequently, as illustrated in FIG. 2B, a $SiO_2$ layer 4a is formed on the surfaces of the first silicon pillar 2 and the second silicon pillar 3 and on the surface of a silicon layer located between the first silicon pillar 2 and the second silicon pillar 3. Subsequently, as illustrated in FIG. 2B, the silicon layer located between the first silicon pillar 2 and the second silicon pillar 3 is subjected to ion implantation and thermal diffusion of a donor impurity such as As or P. Thus, an $N^+$ layer 5 to be formed into a signal line is formed in the planar silicon layer 5S and lower regions of the first silicon pillar 2 and the second silicon pillar 3. Subsequently, as illustrated in FIG. 2B, a $SiO_2$ layer 6a is deposited by chemical vapor deposition (CVD) and etched back, thus forming a $SiO_2$ layer 6 on the silicon oxide substrate 1 between the first silicon pillar 2 and the second silicon pillar 3.

Figure 2C:
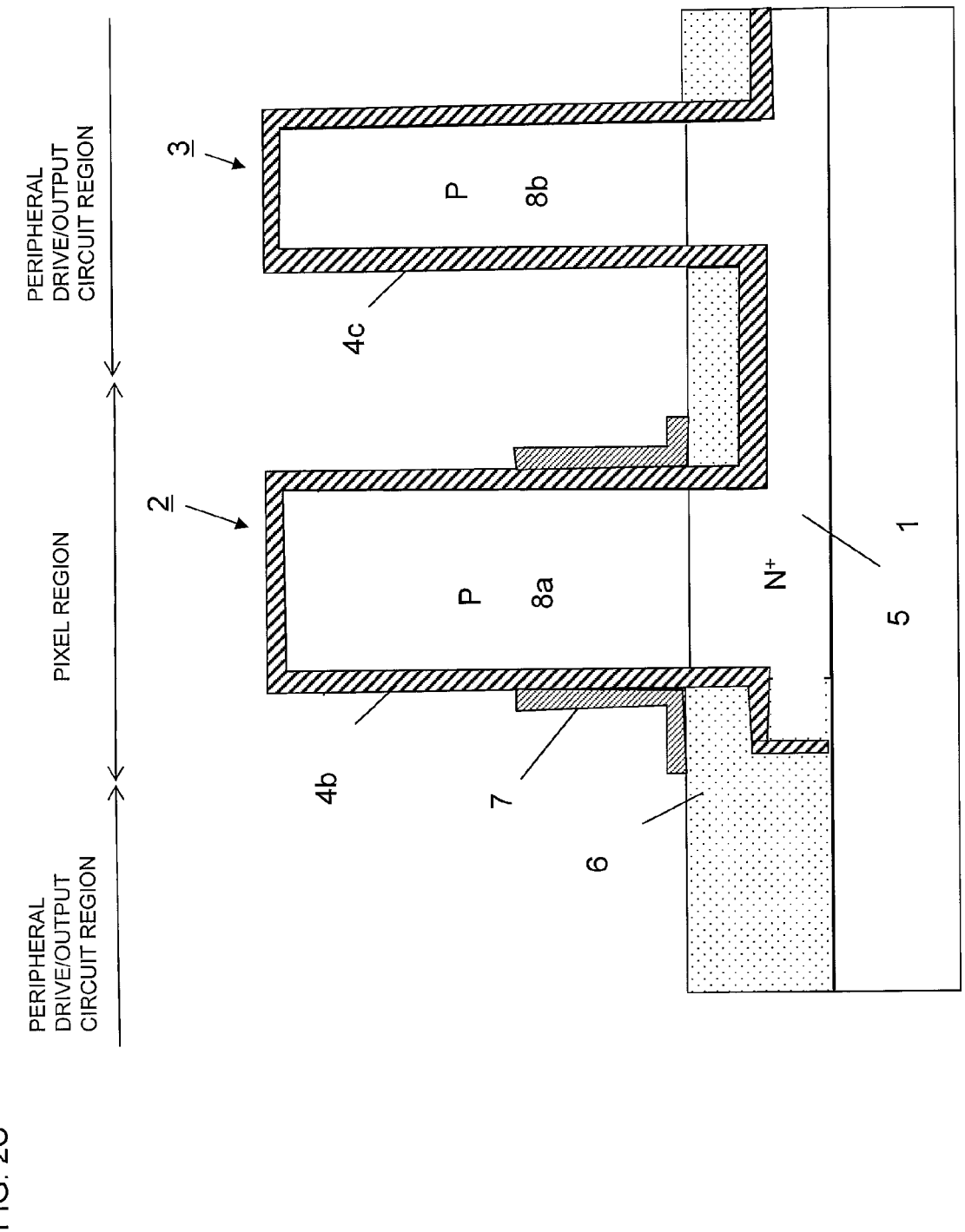
FIG. 2C is a cross-sectional structural view illustrating the method for producing a solid-state imaging device according to the first embodiment.

Subsequently, the $SiO_2$ layer 4a is removed, and as illustrated in FIG. 2C, the surfaces of the first silicon pillar 2 and the second silicon pillar 3 are oxidized to form a gate $SiO_2$ layer 4b of a MOS transistor on the surface of the first silicon pillar 2 and a $SiO_2$ layer 4c on the surface of the second silicon pillar 3. A gate conductor layer 7 of the MOS transistor is formed using tungsten (W), nickel (Ni), cobalt (Co), titanium (Ti) or a nitride thereof.

Figure 2D:
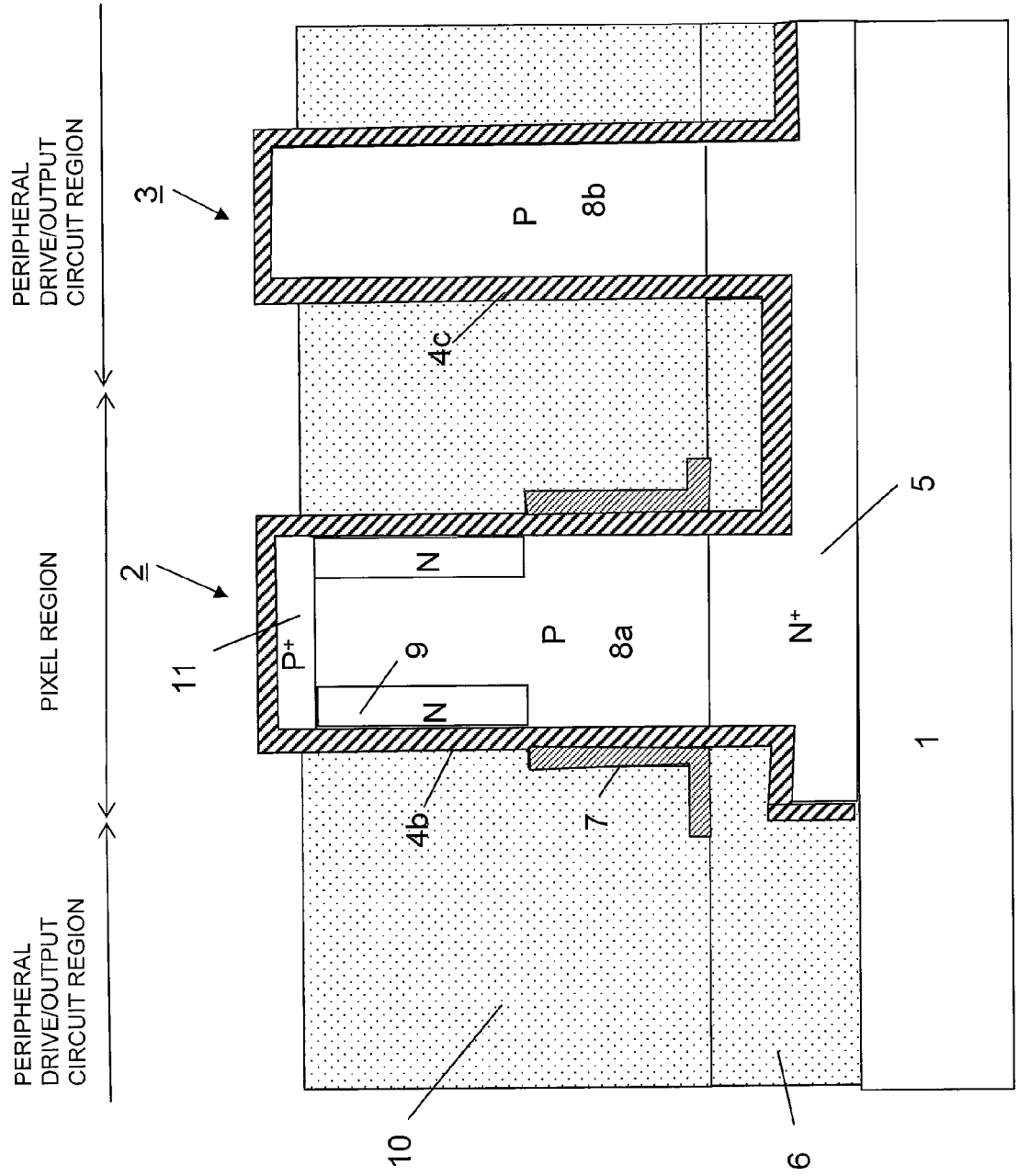
FIG. 2D is a cross-sectional structural view illustrating the method for producing a solid-state imaging device according to the first embodiment.

Subsequently, as illustrated in FIG. 2D, an N layer 9 that forms a photodiode is formed on an outer peripheral portion of a P layer 8 of the first silicon pillar 2 so as to be adjacent to the gate conductor layer 7 using, as a diffusion source, a CVD $SiO_2$ film in which a donor impurity such as arsenic (As) is introduced by ion implantation or doping. Subsequently, as illustrated in FIG. 2D, a $SiO_2$ layer 10 is deposited by CVD and etched back to planarize the surface of the $SiO_2$ film 10. Subsequently, a pixel selection $P^+$ layer 11 is formed in an upper region of the first silicon pillar 2 on the P layer 8a and the N layer 9 by ion implantation of an acceptor impurity.

Figure 2E:
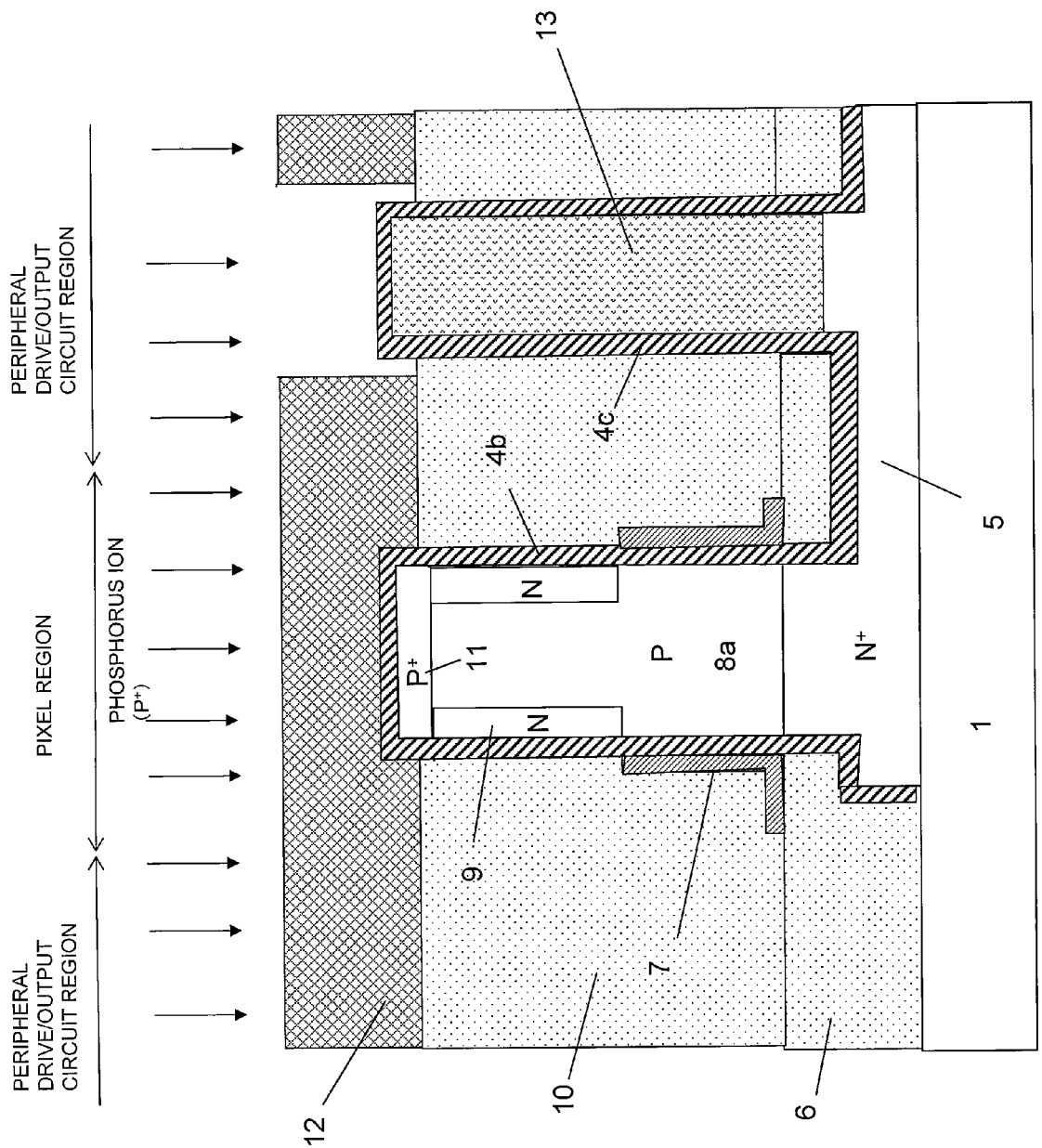
FIG. 2E is a cross-sectional structural view illustrating the method for producing a solid-state imaging device according to the first embodiment.

Subsequently, as illustrated in FIG. 2E, a photoresist layer 12 having a through-hole in an upper region of the second silicon pillar 3 is formed by photolithography, and the second silicon pillar 3 is subjected to ion implantation of a donor impurity such as phosphorus (P) to form a conductor $N^+$ layer 13. In this embodiment, since the conductor $N^+$ layer 13 is formed in the whole second silicon pillar 3 as described above, it is desirable to employ an ion implantation method that utilizes a channeling phenomenon with which an impurity can be deeply introduced into Si at the same acceleration voltage. Subsequently, the photoresist layer 12 is removed, and an activation heat treatment of the donor impurity introduced by ion implantation is conducted.

Figure 2F:
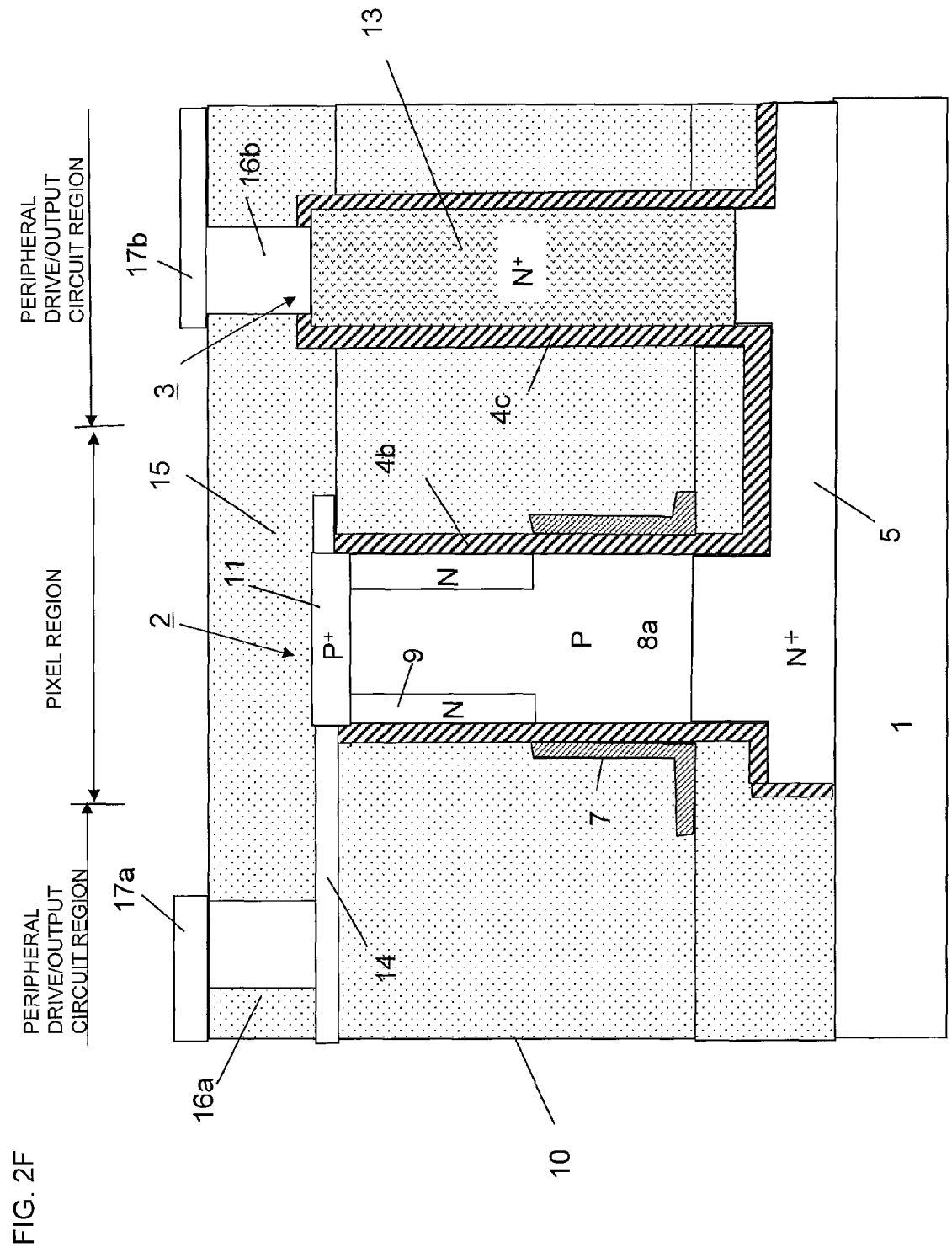
FIG. 2F is a cross-sectional structural view illustrating the method for producing a solid-state imaging device according to the first embodiment.

Subsequently, as illustrated in FIG. 2F, a pixel selection line conductor layer 14 connected to the pixel selection $P^+$ layer 11 of the first silicon pillar 2 is formed. Subsequently, as illustrated in FIG. 2F, a $SiO_2$ layer 15 is formed on the $SiO_2$ layer 10 by CVD, and contact holes 16a and 16b are formed in the $SiO_2$ layer 15. Subsequently, as illustrated in FIG. 2F, the pixel selection line conductor layer 14 is connected to a pixel selection line metal layer 17a through the contact hole 16a, and the conductor $N^+$ layer 13 is connected to a signal line metal layer 17b through the contact hole 16b. In this embodiment, the signal line $N^+$ layer 5 located in the lower region of the first silicon pillar 2 is connected to the signal line metal layer 17b through the conductor $N^+$ layer 13 formed in the second silicon pillar 3.

Thus, the pixel selection $P^+$ layer 11 located in the upper region of the first silicon pillar 2 that forms a pixel and the signal line $N^+$ layer 5 located in the lower region of the first silicon pillar 2 are respectively connected to the pixel selection line metal layer 17a and the signal line metal layer 17b through the contact holes 16a and 16b having the same depth.

The pixel selection line conductor layer 14 connected to the $P^+$ layer 11 of the first silicon pillar 2 is connected to the $P^+$ layer 11 on a side face of the $P^+$ layer 11 formed in the upper region of the first silicon pillar 2. The contact hole 16a on the pixel selection line conductor layer 14 and the contact hole 16b on the second silicon pillar 3 are formed so as to have substantially the same depth.

Figure 17A:
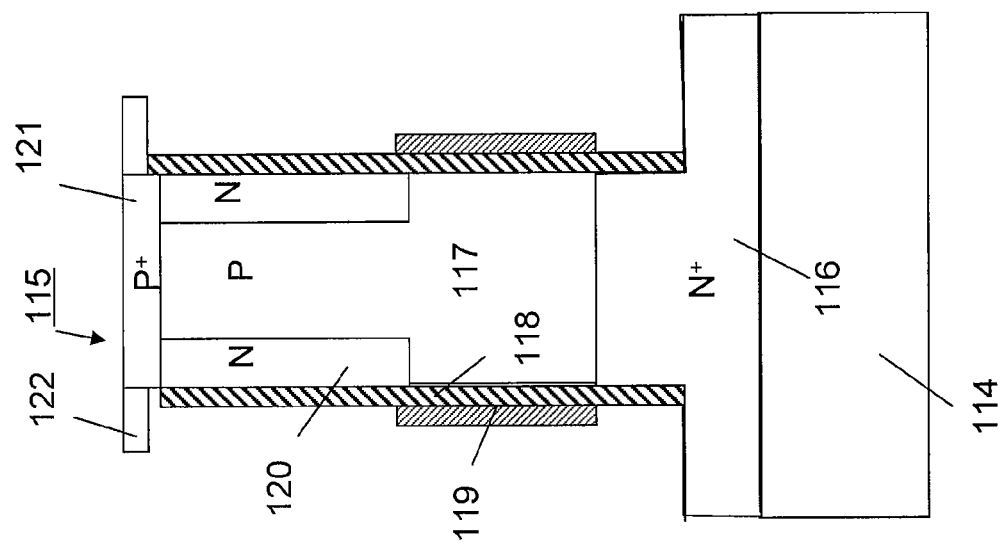
FIG. 17A is a cross-sectional structural view of a pixel, and the cross-sectional structural view illustrating an example of a solid-state imaging device in the related art.
Figure 17B:
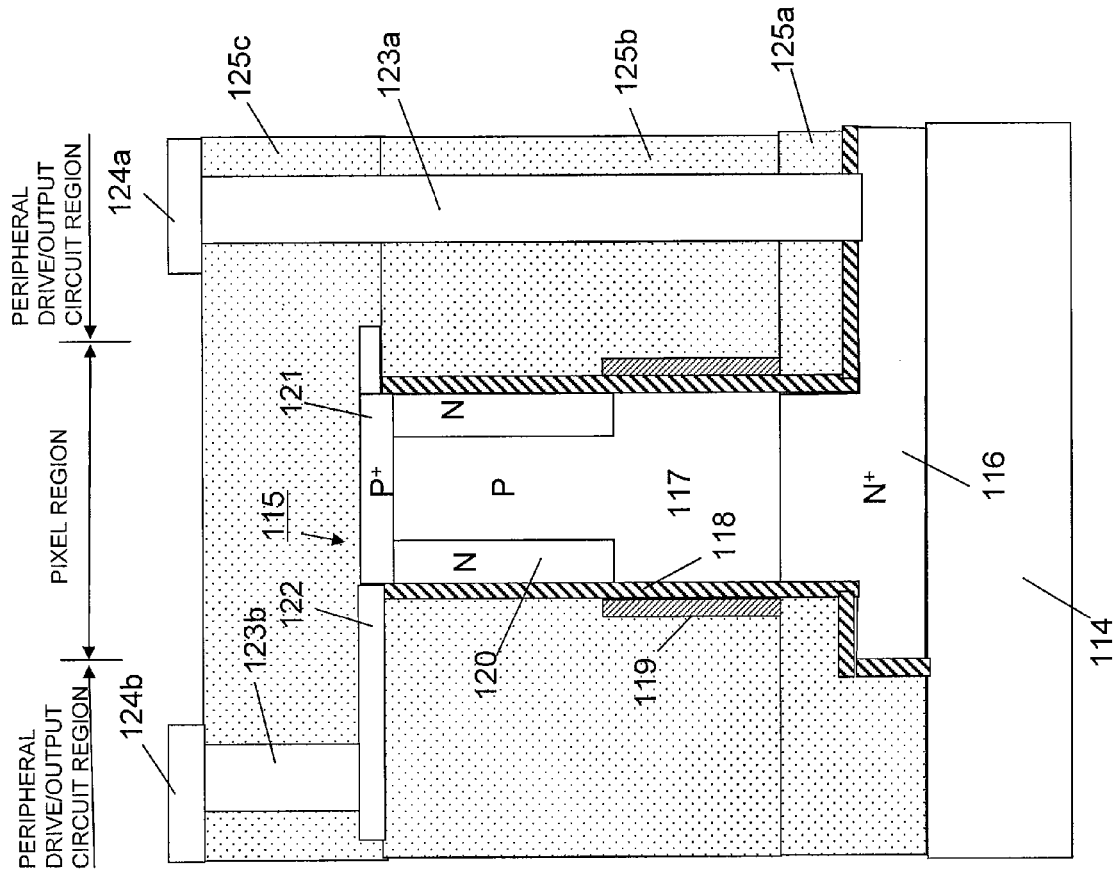
FIG. 17B is a cross-sectional structural view illustrating an example of a solid-state imaging device in the related art, the solid-state imaging device including a wiring metal layer.

According to this embodiment, the first silicon pillars 2, $P_{11}$ to $P_{33}$ that form pixels (circuit elements) of the solid-state imaging device and the second silicon pillars 3, Ca (3), Cb, and Cc that establish contact are formed at the same time so as to have the same height. Thus, it is possible to make the depths of the contact holes 16a, 16b, SCa, SCb, SCc, 16aa, 16ab, and 16ac the same, the contact holes 16a, 16b, SCa, SCb, SCc, 16aa, 16ab, and 16ac respectively connecting the signal line $N^+$ layer 5, 5a, 5b, and 5c located in the lower region of the first silicon pillars 2, $P_{11}$ to $P_{33}$ and the pixel selection $P^+$ layer 11 located in the upper region of the first silicon pillars 2, $P_{11}$ to $P_{33}$ (located on the top surfaces of the first silicon pillars 2, $P_{11}$ to $P_{33}$ in FIG. 1A) to the signal line metal layers 17b, 26a, 26b, and 26c and the pixel selection line metal layers 17a, 17aa, 17ab, and 17ac. Furthermore, unlike the contact hole 123a in an example of the related art illustrated in FIG. 17B, the contact holes 16b, SCa (16b), SCb, and SCc need not be deep contact holes. Accordingly, it is possible to easily realize the connection between the signal line $N^+$ layers 5, 5a (5), 5b, and 5c located in the lower region of the first silicon pillar 2 and upper signal line metal layers 17b, 26a, 26b, and 26c through the contact hole 16b and the connection between the pixel selection $P^+$ layer 11 (located on the top surfaces of the first silicon pillars $P_{11}$ to $P_{33}$ in FIG. 1A) and the pixel selection line metal layers 17a, 17aa, 17ab, and 17ac through the contact hole 16a.

In general, in order to improve the red-wavelength sensitivity of a solid-state imaging device, it is necessary to increase the length of a photodiode functioning as a photoelectric conversion region by increasing the height of each of the first silicon pillars 2, $P_{11}$ to $P_{33}$ that form pixels. This is because red wavelength light is absorbed at a deep position of Si from a light incident surface, as compared with blue wavelength light and green wavelength light, and generates signal charges. Thus, in order to efficiently absorb incident red wavelength light with a photodiode, it is necessary to make the heights of the first silicon pillars 2, $P_{11}$ to $P_{33}$ high. However, in the related art, the depth of the contact hole 123a connecting the signal line $N^+$ layer 116 to the signal line metal layer 124a is further increased. In contrast, according to the solid-state imaging device obtained in this embodiment, all the contact holes 16b, SCa, SCb, SCc, 16a, 16aa, 16ab, and 16ac respectively connected to the signal line metal layers 17b, 26a, 26b, and 26c and the pixel selection line metal layers 17a, 17aa, 17ab, and 17ac have a small height and are formed so as to have the same height. Accordingly, the solid-state imaging device of this embodiment is particularly effective to obtain a solid-state imaging device having high red-wavelength sensitivity.

Second Embodiment

Figure 3A:
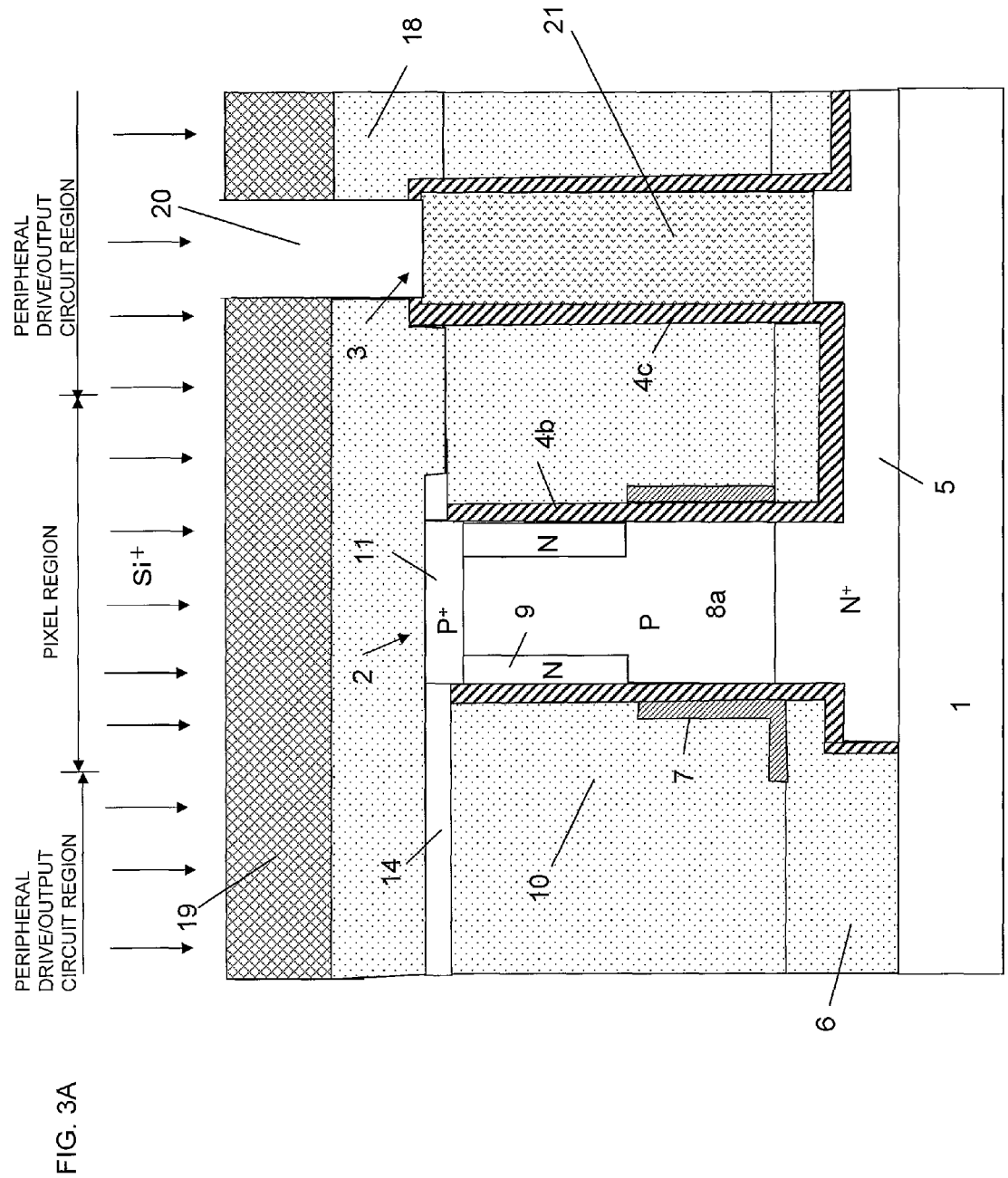
FIG. 3A is a cross-sectional structural view illustrating a method for producing a solid-state imaging device according to a second embodiment of the present invention.
Figure 3B:
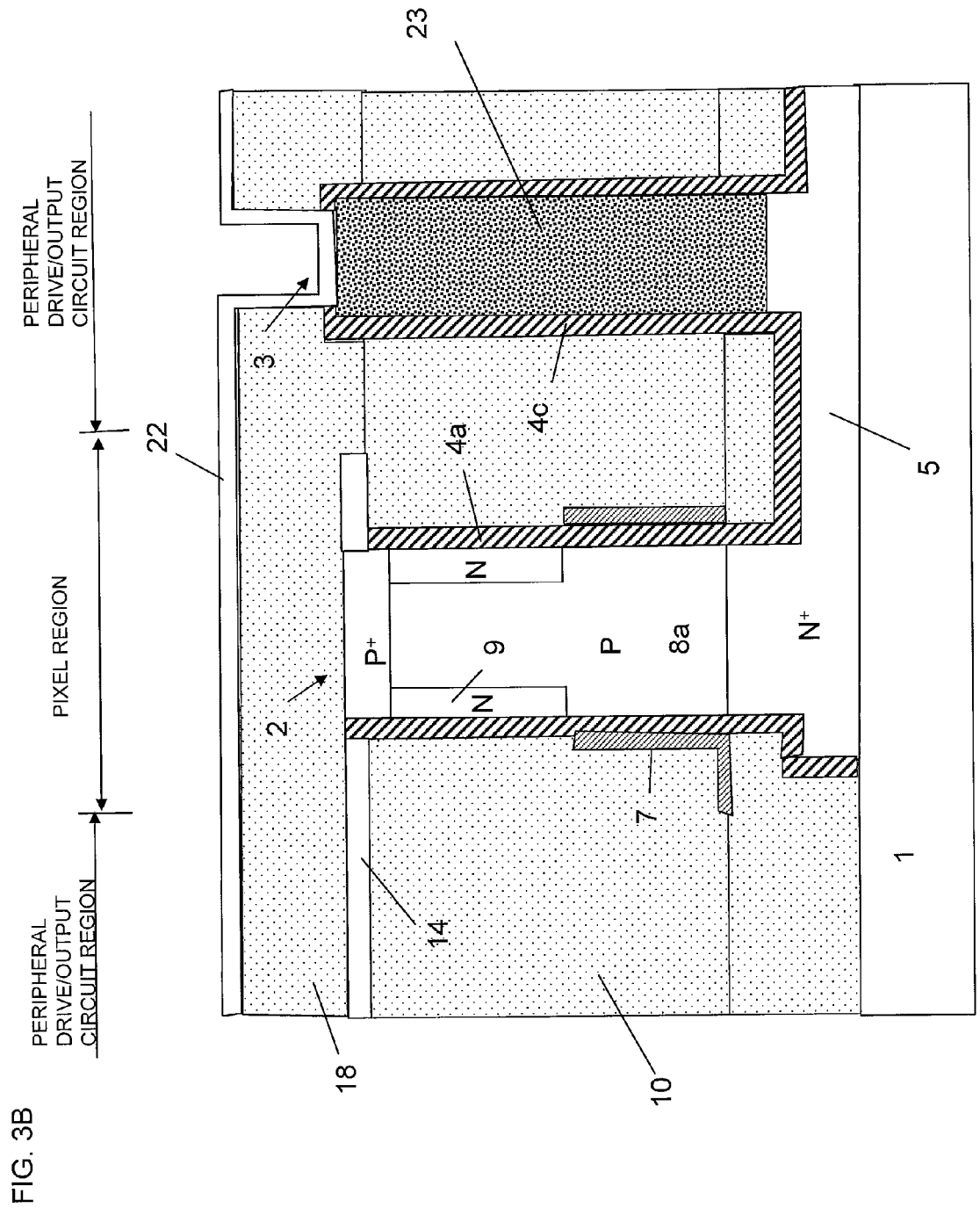
FIG. 3B is a cross-sectional structural view illustrating the method for producing a solid-state imaging device according to the second embodiment.
Figure 3C:
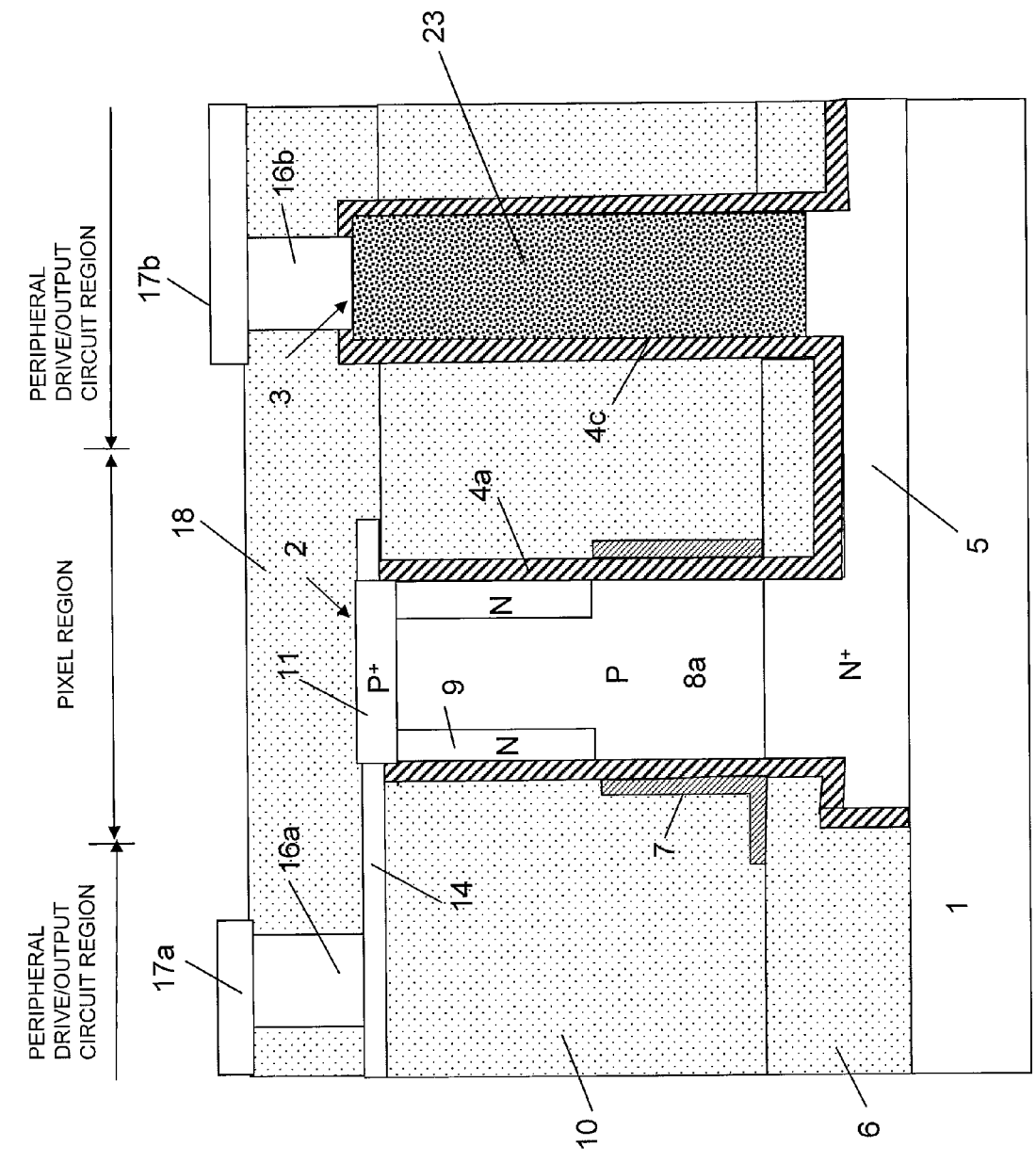
FIG. 3C is a cross-sectional structural view illustrating the method for producing a solid-state imaging device according to the second embodiment.

FIGS. 3A to 3C illustrate a method for producing a solid-state imaging device according to this embodiment. In this embodiment, the electrical resistance between a signal line $N^+$ layer 5 and a signal line metal layer 17b is decreased by forming a silicide layer 23 instead of the conductor $N^+$ layer 13 of the second silicon pillar 3 that establishes contact in FIG. 1B.

In this embodiment, first, the steps illustrated in FIGS. 2A to 2D in the first embodiment are performed. Subsequently, as illustrated in FIG. 3A, a pixel selection line conductor layer 14 connected to a $P^+$ layer 11 of a first silicon pillar 2 is formed. A SiO$_2$ layer 18 and a photoresist layer 19 are formed by CVD, and a through-hole 20 is formed on a second silicon pillar 3 by photolithography and etching. Subsequently, as illustrated in FIG. 3A, an impurity such as silicon (Si) or hydrogen (H), which does not function as a donor or an acceptor, is introduced into the second silicon pillar 3 by ion implantation to form an amorphous or porous silicon layer 21 in the second silicon pillar 3. The photoresist layer 19 is then removed.

Subsequently, as illustrated in FIG. 3B, a metal layer 22 composed of nickel (Ni), cobalt (Co), tantalum (Ta), tungsten (W), or titanium (Ti) is formed by an evaporation method, and is heat-treated. Thus, a silicide layer 23 is formed by silicidation of the amorphous or porous silicon layer 21. The metal layer 22 is then removed. The silicide layer 23 is composed of a material such as $NiSi_2$, $CoSi_2$, $TaSi_2$, $WSi_2$, or $TiS_2$.

Subsequently, as illustrated in FIG. 3C, contact holes 16a and 16b are formed in the SiO$_2$ layer 18. A pixel selection line metal layer 17a to which the pixel selection line conductor layer 14 is connected through the contact hole 16a is formed. Furthermore, a signal line metal layer 17b which is connected to the silicide layer 23 through the contact hole 16b of the second silicon pillar 3 is formed.

According to this embodiment, the silicide layer 23 having a low resistance is provided instead of the conductor $N^+$ layer 13 formed in the second silicon pillar 3 in the first embodiment. Thus, the resistance between the signal line $N^+$ layer 5 and the signal line metal layer 17b can be reduced. A pixel-driving speed increases with a decrease in the product RC of a resistance R between the signal line $N^+$ layer 5 and the signal line metal layer 17b and a capacitance C between the signal line $N^+$ layer 5 and the signal line metal layer 17b. Thus, the formation of the silicide layer 23 can realize high-speed driving of the solid-state imaging device.

Third Embodiment

A method for producing a solid-state imaging device according to this embodiment will now be described with reference to FIGS. 4A to 4D and FIG. 5. In this embodiment, the resistance between a signal line $N^+$ layer 5 and a signal line metal layer 73b is decreased by forming a metal layer 70a or 70b composed of tungsten (W), copper (Cu), or the like instead of the conductor $N^+$ layer 13 of the second silicon pillar 3 that establishes contact in FIG. 1B.

Figure 4A:
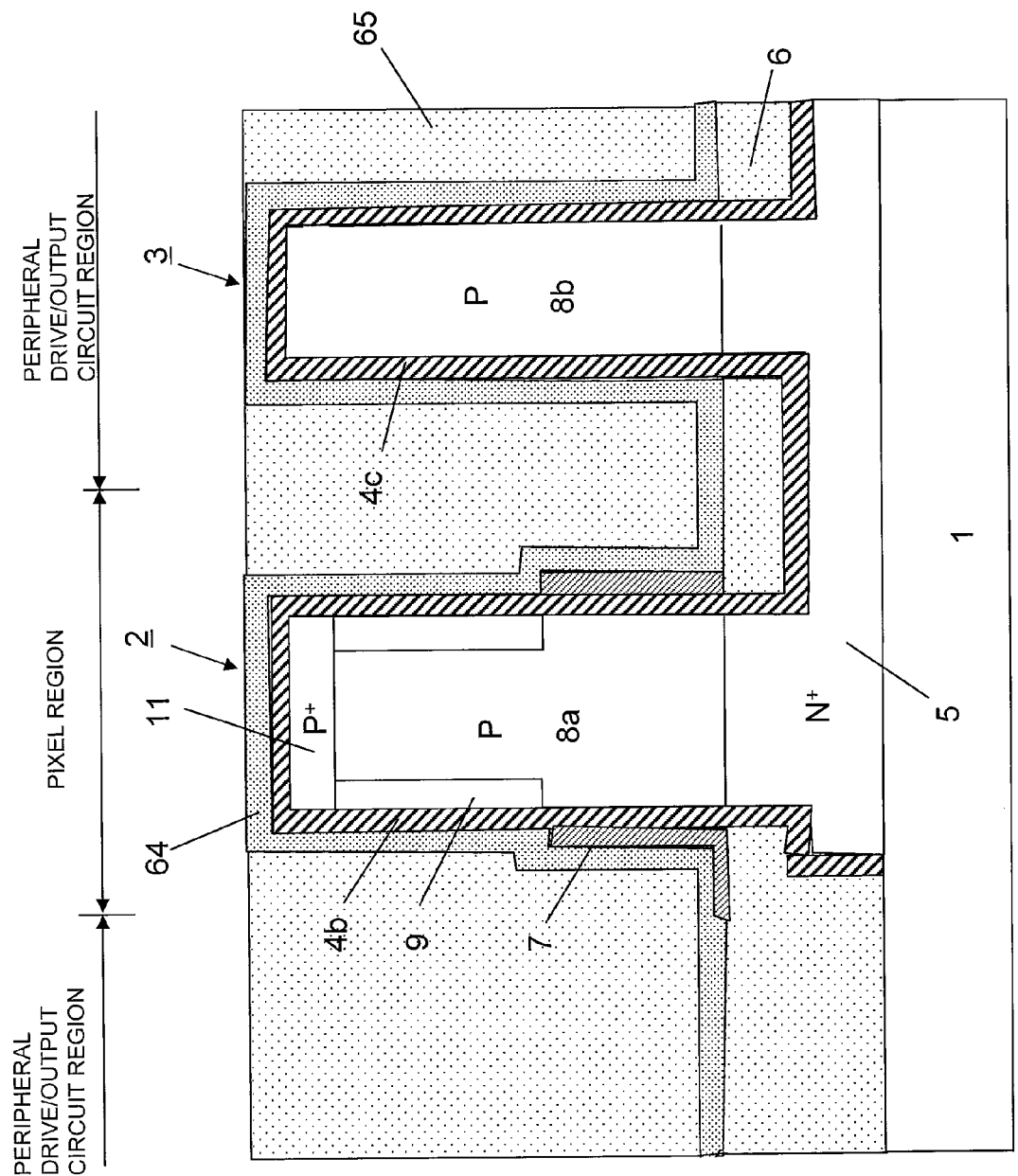
FIG. 4A is a cross-sectional structural view illustrating a method for producing a solid-state imaging device according to a third embodiment of the present invention.

In this embodiment, first, the steps illustrated in FIGS. 2A to 2C in the first embodiment are performed. Subsequently, as illustrated in FIG. 4A, an N layer 9 that forms a photodiode is formed on an outer peripheral portion of a first silicon pillar 2. A Si nitride (SiN) layer 64 is formed on the first silicon pillar 2, a second silicon pillar 3, and a SiO$_2$ layer 6 by CVD. Subsequently, as illustrated in FIG. 4A, the whole structure is covered with a SiO$_2$ layer 65, and the surface of the SiO$_2$ layer 65 is polished by chemical mechanical polishing (CMP) until the surface of the SiN layer 64 on the first silicon pillar 2 and the second silicon pillar 3 is exposed.

Figure 4B:
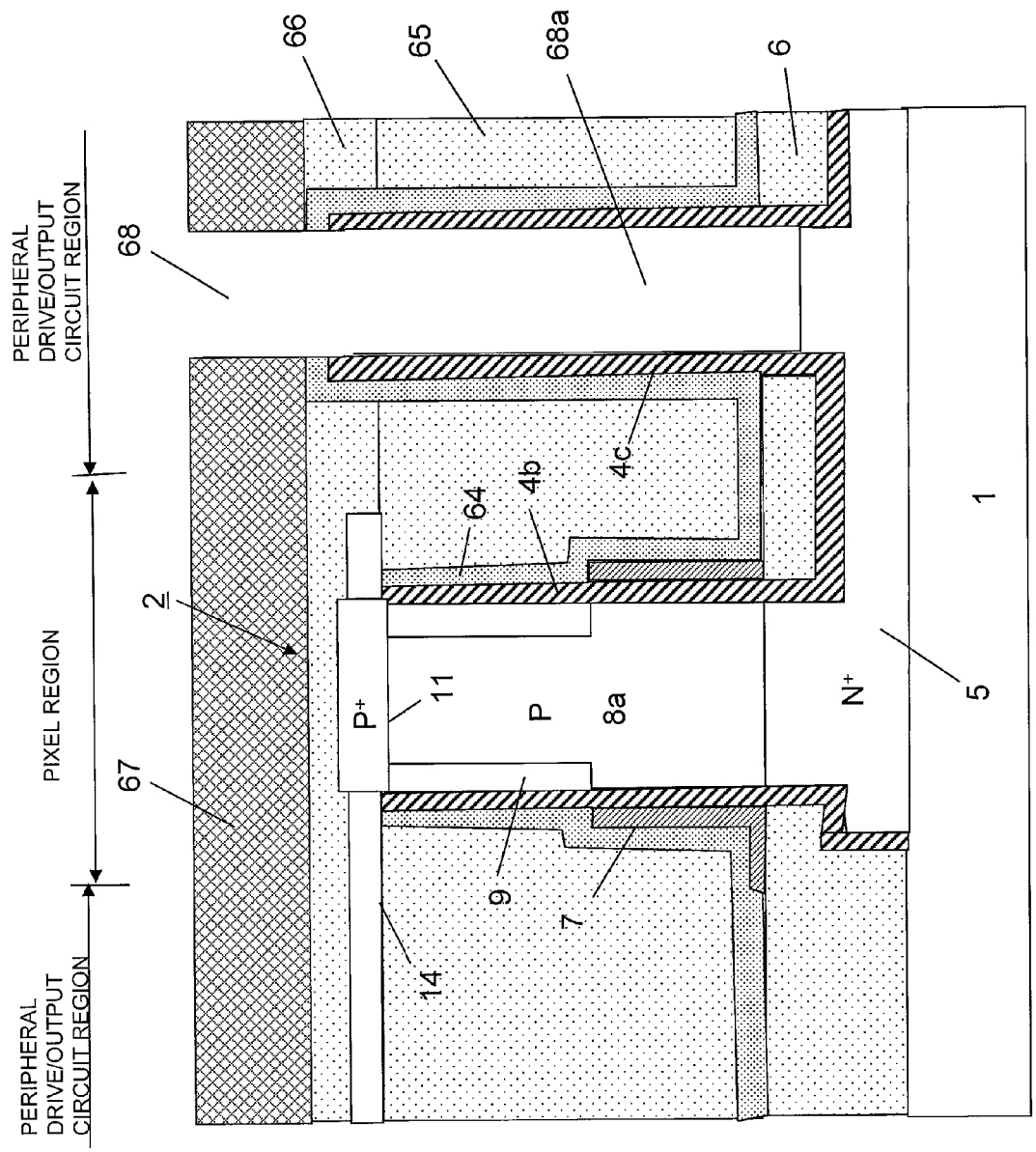
FIG. 4B is a cross-sectional structural view illustrating the method for producing a solid-state imaging device according to the third embodiment.

Subsequently, as illustrated in FIG. 4B, the SiO$_2$ layer 65 is etched back by RIE until the top of the first silicon pillar 2 and the second silicon pillar is exposed. A SiO$_2$ layer 4b and the SiN layer 64 that cover the exposed first silicon pillar 2 are removed by etching. Thus, a pixel selection $P^+$ layer 11 is formed. Subsequently, as illustrated in FIG. 4B, a pixel selection line conductor layer 14 is formed so as to be connected to the pixel selection $P^+$ layer 11, and a SiO$_2$ layer 66 is formed by CVD so as to cover the whole structure. Subsequently, as illustrated in FIG. 4B, the SiO$_2$ layer 66 is polished by CMP until the surface of the SiN layer 64 on the second silicon pillar 3 is exposed. Subsequently, as illustrated in FIG. 4B, a through-hole 68 is formed in a photoresist layer 67 at a position corresponding to the second silicon pillar 3 by photolithography. A through-hole 68a is formed by etching the SiN layer 64 and the SiO$_2$ layer 4c located on the second silicon pillar 3, and a silicon layer of the second silicon pillar 3 using the photoresist layer 67 as an etching mask.

Figure 4C:
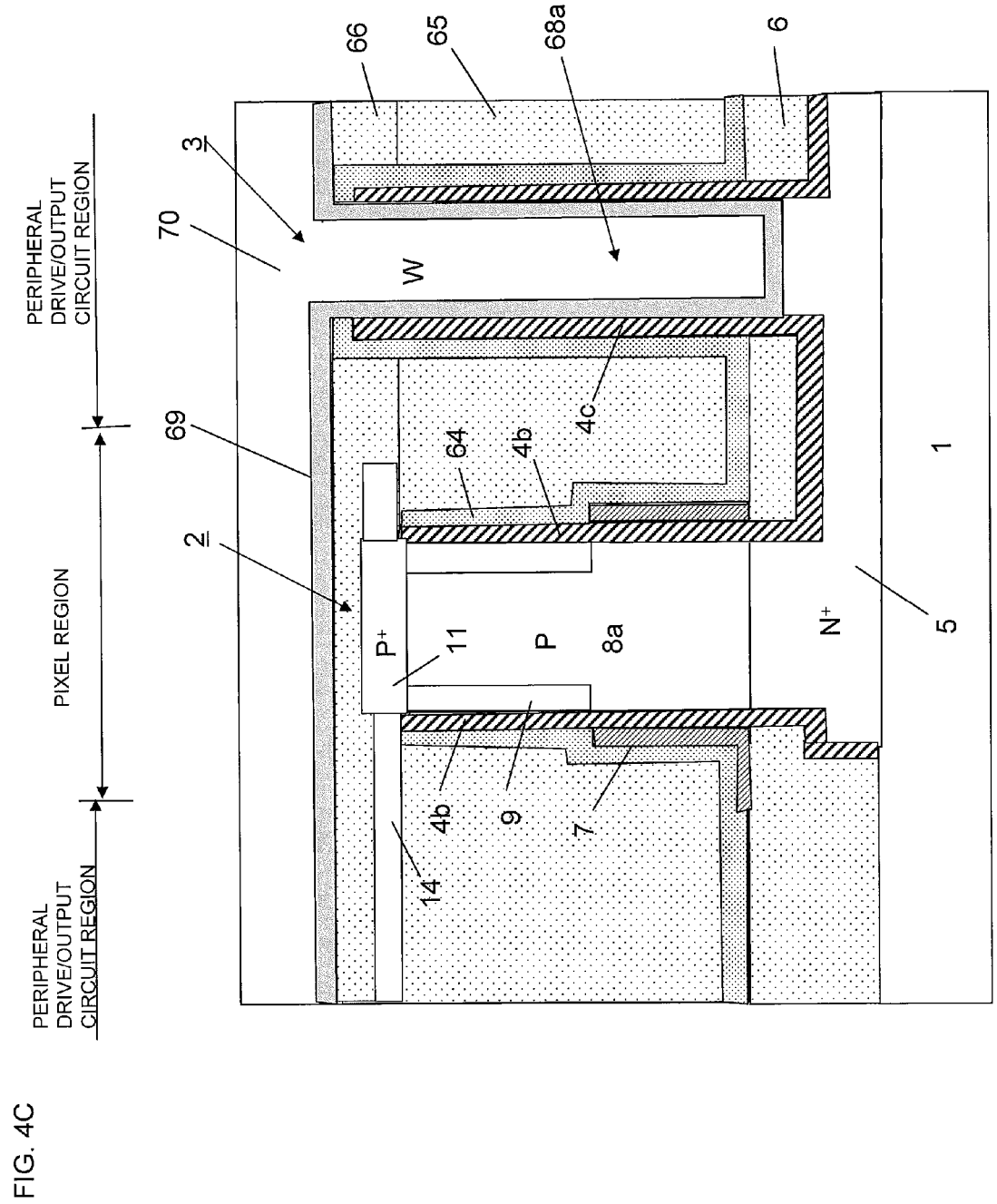
FIG. 4C is a cross-sectional structural view illustrating the method for producing a solid-state imaging device according to the third embodiment.

Subsequently, as illustrated in FIG. 4C, the photoresist layer 67 is removed, and a titanium nitride (TiN) layer 69 is formed on the bottom of the through-hole 68a and a surface of the SiO$_2$ layer 4c, the surface being a side wall of the through-hole 68a. A tungsten (W) layer 70 is deposited on the top surface of the TiN layer 69 by CVD.

Figure 4D:
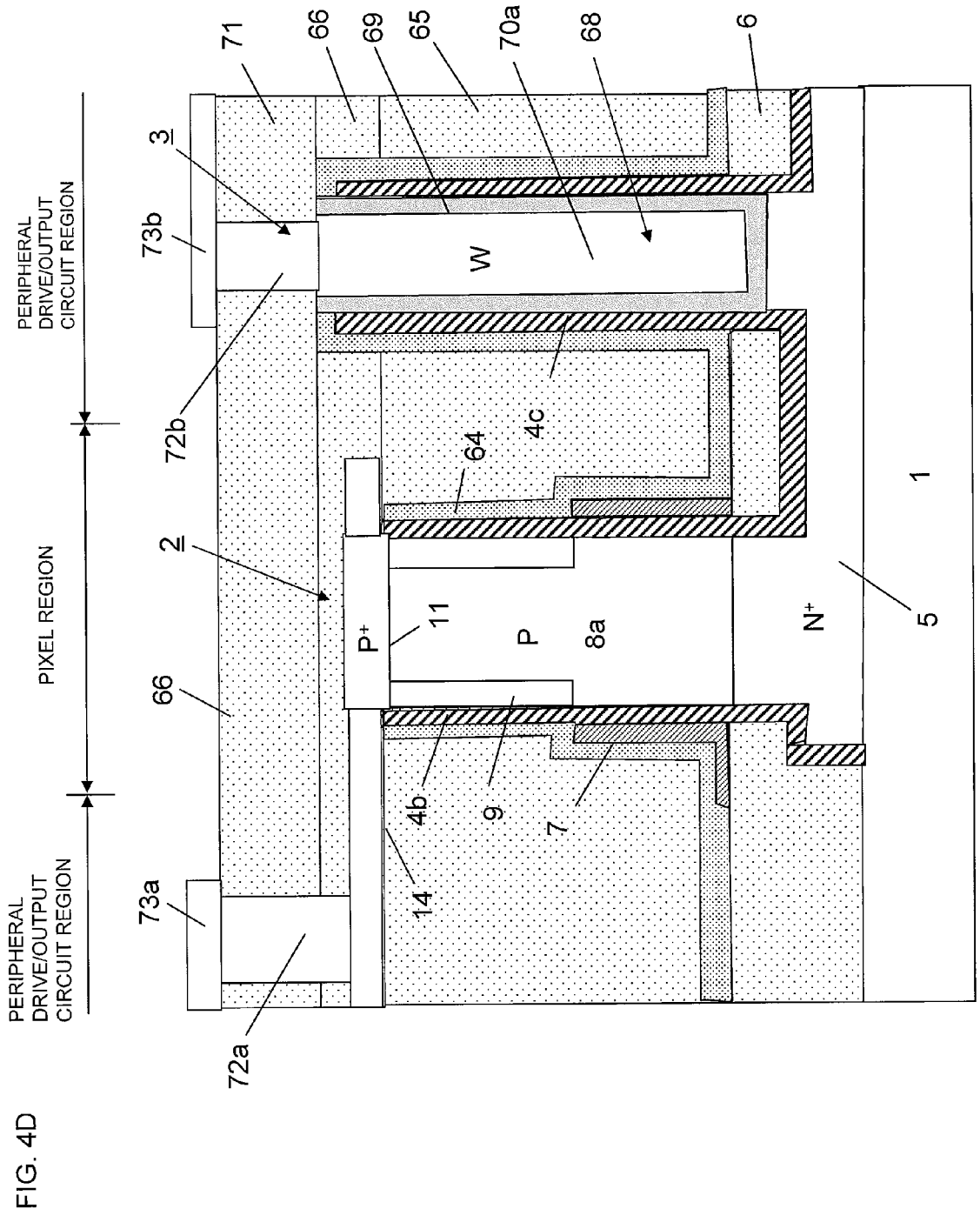
FIG. 4D is a cross-sectional structural view illustrating the method for producing a solid-state imaging device according to the third embodiment (in which tungsten (W) is used as a conductor layer)

Subsequently, as illustrated in FIG. 4D, the W layer 70 is polished by CMP until the surface of the SiO$_2$ layer 66 is exposed. A SiO$_2$ layer 71 is deposited over the entire surface by CVD, and contact holes 72a and 72b are formed. Subsequently, as illustrated in FIG. 4D, the pixel selection line conductor layer 14 is connected to a pixel selection line metal layer 73a through the contact hole 72a, and the W layer 70a is connected to a signal line metal layer 73b through the contact hole 72b.

As described above, the conductor layer formed in the second silicon pillar 3 is the conductor $N^+$ layer 13 in the structure illustrated in FIG. 2F, and the silicide layer 23 in the structure illustrated in FIG. 3C. On the other hand, in this embodiment, the conductor layer formed in the second silicon pillar 3 is the W layer 70a having a lower electrical resistance.

Figure 5:
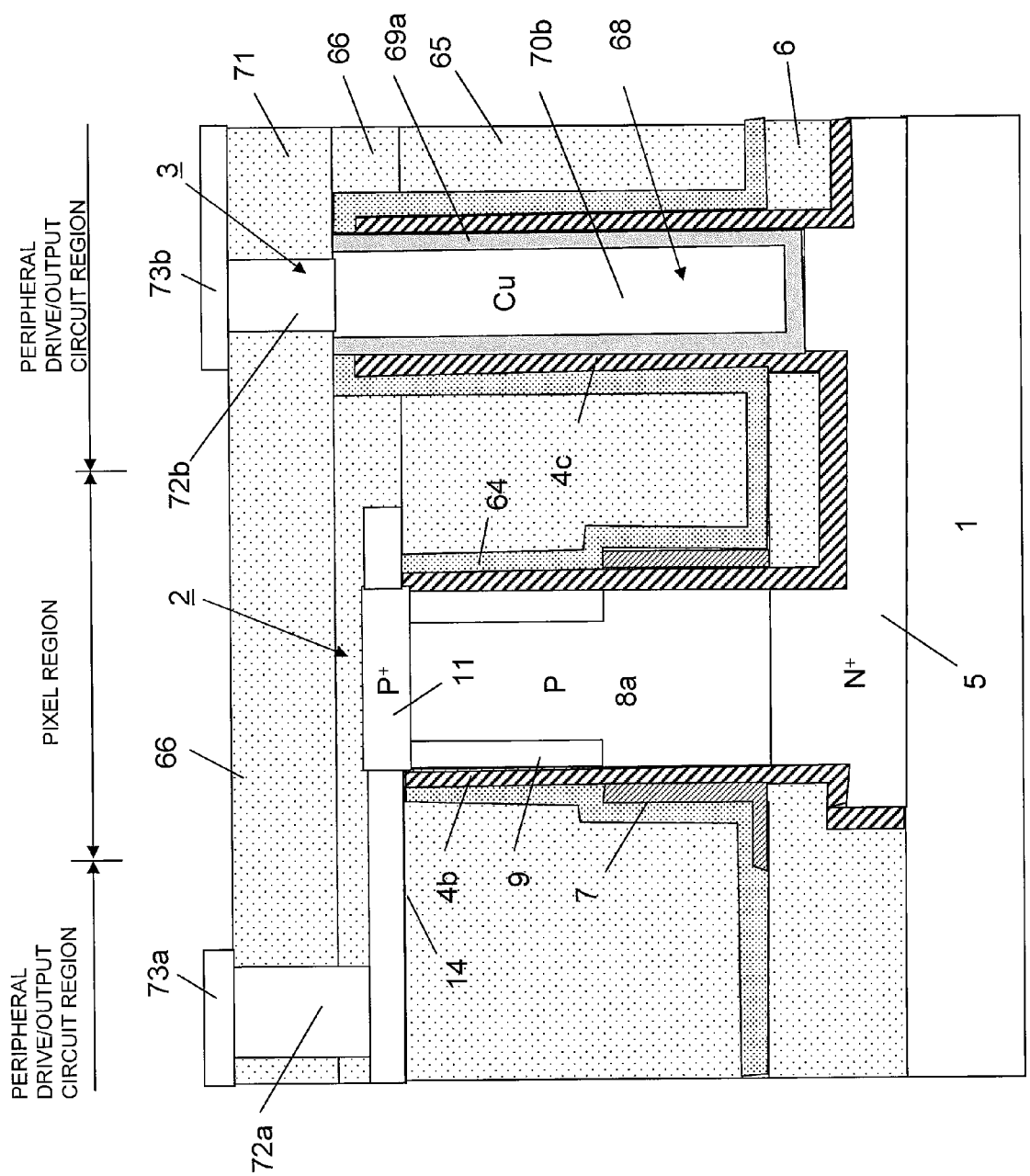
FIG. 5 is a cross-sectional structural view illustrating a case where copper (Cu) is used as a conductor layer in the method for producing a solid-state imaging device according to the third embodiment.

FIG. 5 illustrates a structure in which, instead of the W layer 70a described above, a copper (Cu) layer 70b is formed as the conductor layer provided in the second silicon pillar 3. The W layer 70a is formed by CVD, whereas the Cu layer 70b is formed by electrolytic plating (electrochemical deposition). In the formation of the W layer 70a, the TiN layer 69 is used as a primer of the W layer 70 in order to improve the adhesion between the SiO$_2$ layers 66 and 4b and the W layer 70. On the other hand, in the formation of the Cu layer 70b, a barrier-seed layer 69a is used as a primer of the Cu layer 70b. The barrier-seed layer 69a includes a barrier layer composed of TiN, TaN, or the like for preventing Cu from diffusing into the SiO$_2$ layers 4b, 65, and 66 and a seed layer composed of Cu and formed by sputtering, the seed layer functioning as an electrode for Cu electrolytic plating. Furthermore, a SiO$_2$ layer 71 is deposited by CVD, and contact holes 72a and 72b are formed in the SiO$_2$ layer 71. A pixel selection line conductor layer 14 is connected to a pixel selection line metal layer 73a through the contact hole 72a, and the Cu layer 70b is connected to a signal line metal layer 73b through the contact hole 72b.

Fourth Embodiment

A method for producing a solid-state imaging device according to this embodiment will now be described with reference to FIG. 6. In the cross-sectional structure illustrated in FIG. 1B in the first embodiment, the first silicon pillar 2 and the second silicon pillar 3 are formed on the signal line $N^+$ layer 5 (5a). In this embodiment, a conductor layer formed on a silicon oxide substrate 1 and composed of a metal material such as W, Co, or Ti or a material containing any of these metals is formed instead of the signal line $N^+$ layer 5 (5a).

Figure 6:
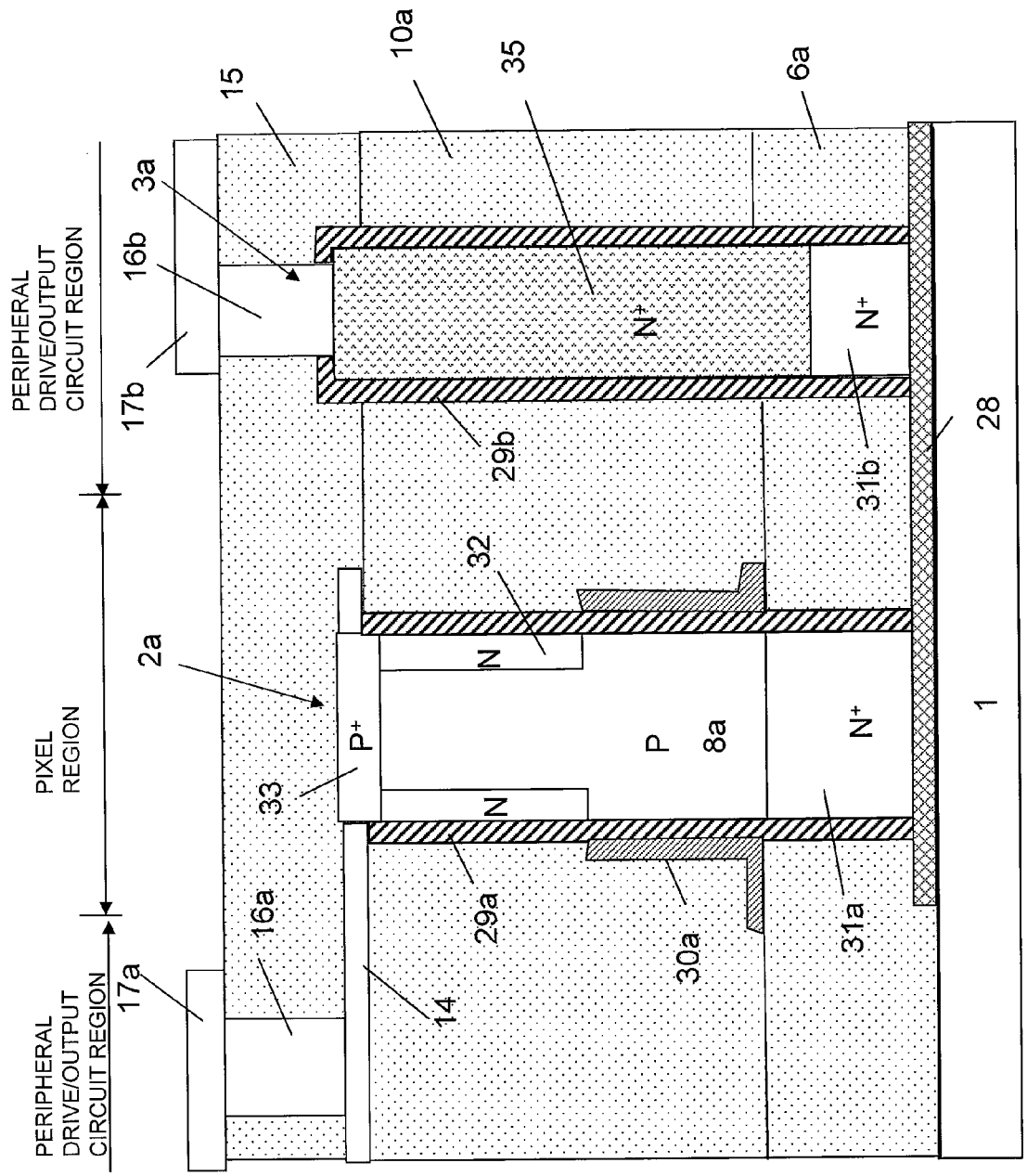
FIG. 6 is a cross-sectional structural view illustrating a solid-state imaging device according to a fourth embodiment of the present invention.

FIG. 6 is a cross-sectional structural view of a solid-state imaging device corresponding to FIG. 1B. Referring to FIG. 6, a signal line conductor layer 28 composed of a metal material such as W, Co, or Ti or a material containing any of these metals is formed on a silicon oxide substrate 1 by CVD. Subsequently, a first silicon pillar 2a that forms a pixel and a second silicon pillar 3a that establishes contact are formed on the signal line conductor layer 28, and $SiO_2$ layers 29a and 29b are formed so as to surround the first silicon pillar 2a and the second silicon pillar 3a, respectively. Subsequently, a gate conductor layer 30a is formed on a lower region of the first silicon pillar 2a with the $SiO_2$ layer 29a therebetween so as to surround the first silicon pillar 2a. Furthermore, $N^+$ layers 31a and 31b connected to the signal line conductor layer 28 are formed in lower regions of the first silicon pillar 2a and the second silicon pillar 3a. Subsequently, an N layer 32 that forms a photodiode is formed on an outer peripheral portion of the first silicon pillar 2a, the outer peripheral portion being located above the gate conductor layer 30a. Subsequently, a $SiO_2$ layer 10a is formed between the first silicon pillar 2a and the second silicon pillar 3a by CVD, and a pixel selection $P^+$ layer 33 is formed in an upper region of the first silicon pillar 2a, the upper region being located above the N layer 32. Subsequently, a pixel selection line conductor layer 14 is formed so as to be connected to the pixel selection $P^+$ layer 33. Subsequently, a conductor layer 35 is formed in an inner portion of the second silicon pillar 3a, the inner portion extending to the top surface of the second silicon pillar 3a, by doping the inner portion with a donor or acceptor impurity or by siliciding the inner portion. Subsequently, a $SiO_2$ layer 15 is formed on upper regions of the $SiO_2$ layer 10a, the first silicon pillar 2a, and the second silicon pillar 3a. A contact hole 16a is formed on a pixel selection line conductor layer 14, and a contact hole 16b is formed on the second silicon pillar 3a. Subsequently, a pixel selection line metal layer 17a is formed so as to be connected to the pixel selection line conductor layer 14 through the contact hole 16a, and a signal line metal layer 17b is formed so as to be connected to the conductor layer 35 through the contact hole 16b.

In the step illustrated in FIG. 1B, the first silicon pillar 2 in the pixel region and the second silicon pillar 3 that establishes contact and is provided in a peripheral drive/output circuit region are connected to each other through the signal line $N^+$ layer 5. In contrast, in this embodiment, the signal line $N^+$ layer 31a located in a lower region of the first silicon pillar 2a is connected through the signal line conductor layer 28 composed of a metal such as W, Ni, or Co or a silicide thereof having an electrical resistance lower than that of the $N^+$ layer 5. Accordingly, it is possible to lower the electrical resistance of a signal line connecting between a drive/output circuit provided in the vicinity of a pixel region and a pixel provided in the pixel region. As a result, high-speed driving of the solid-state imaging device can be realized.

Fifth Embodiment

Figure 17C:
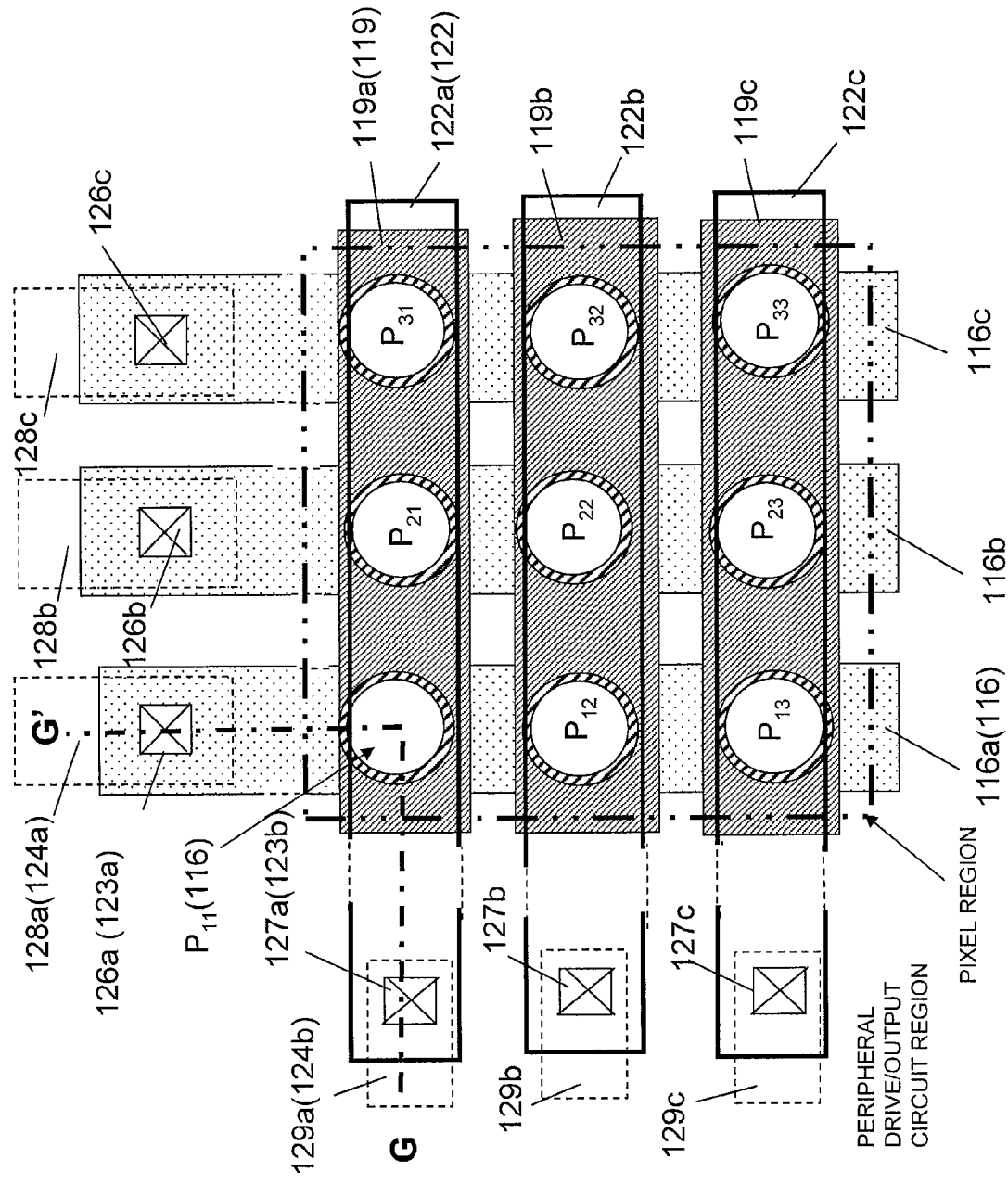
FIG. 17C is a plan view illustrating an example of a solid-state imaging device in the related art.
Figure 17D:
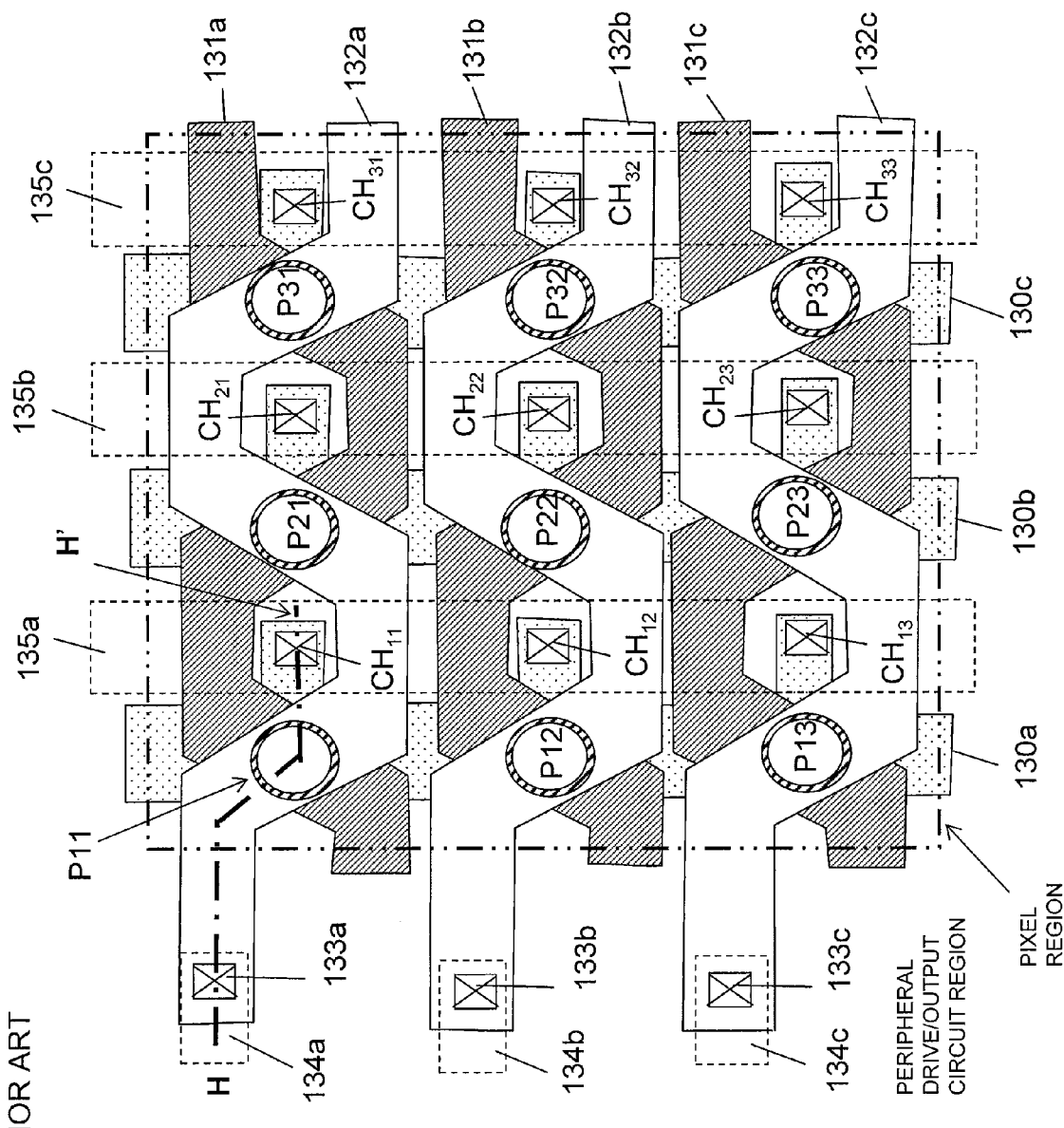
FIG. 17D is a plan view illustrating an example of a solid-state imaging device in the related art in which a contact hole connecting a signal line $N^+$ layer to a signal line metal layer is formed in a pixel region.

A solid-state imaging device according to this embodiment will now be described with reference to FIGS. 7A to 7D. According to this embodiment, it is possible to improve the problem regarding the realization of high-speed driving in the example of the solid-state imaging device in the related art illustrated in FIG. 17C, and the problem regarding the realization of a high degree of pixel integration in the example of the solid-state imaging device in the related art illustrated in FIG. 17D.

Figure 7A:
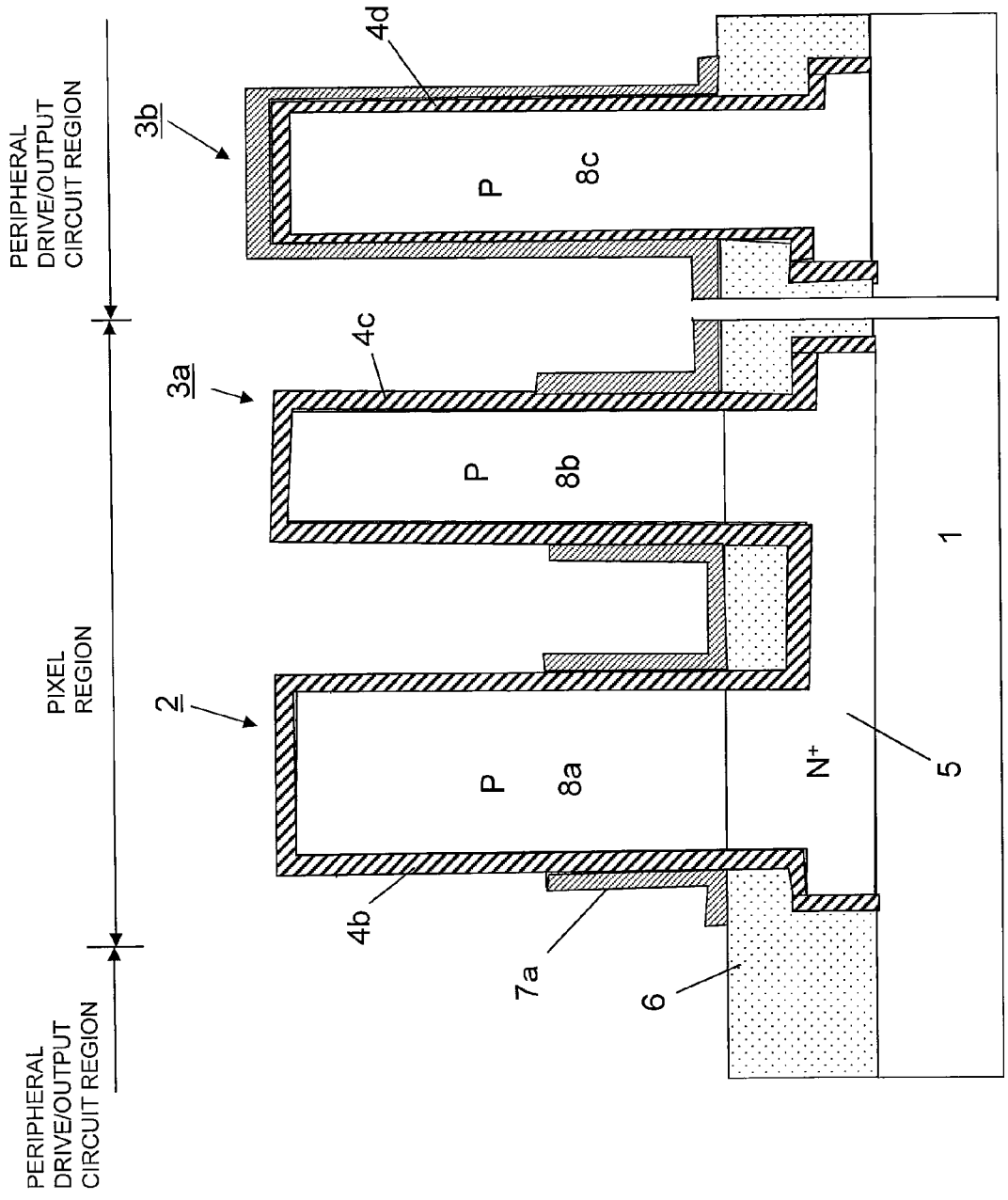
FIG. 7A is a cross-sectional structural view illustrating a method for producing a solid-state imaging device according to a fifth embodiment of the present invention.

FIG. 7A is a view illustrating a cross-sectional structure formed through the same steps as the production steps illustrated in FIGS. 2A to 2C. In this embodiment, a second silicon pillar 3a that establishes contact is formed in a pixel region so as to be adjacent to a first silicon pillar 2 that forms a pixel, and a third silicon pillar 3b that establishes contact is formed in a peripheral drive/output circuit region. The third silicon pillar 3b is formed so as to be separated from a signal line $N^+$ layer. A gate conductor layer 7a is formed so as to surround $SiO_2$ layers 4b, 4c, and 4d that respectively cover the first silicon pillar 2, the second silicon pillar 3a, and the third silicon pillar 3b. The gate conductor layer 7a is formed so as to connect the first silicon pillar 2, the second silicon pillar 3a, and the third silicon pillar 3b to each other and to cover the third silicon pillar 3b.

Figure 7B:
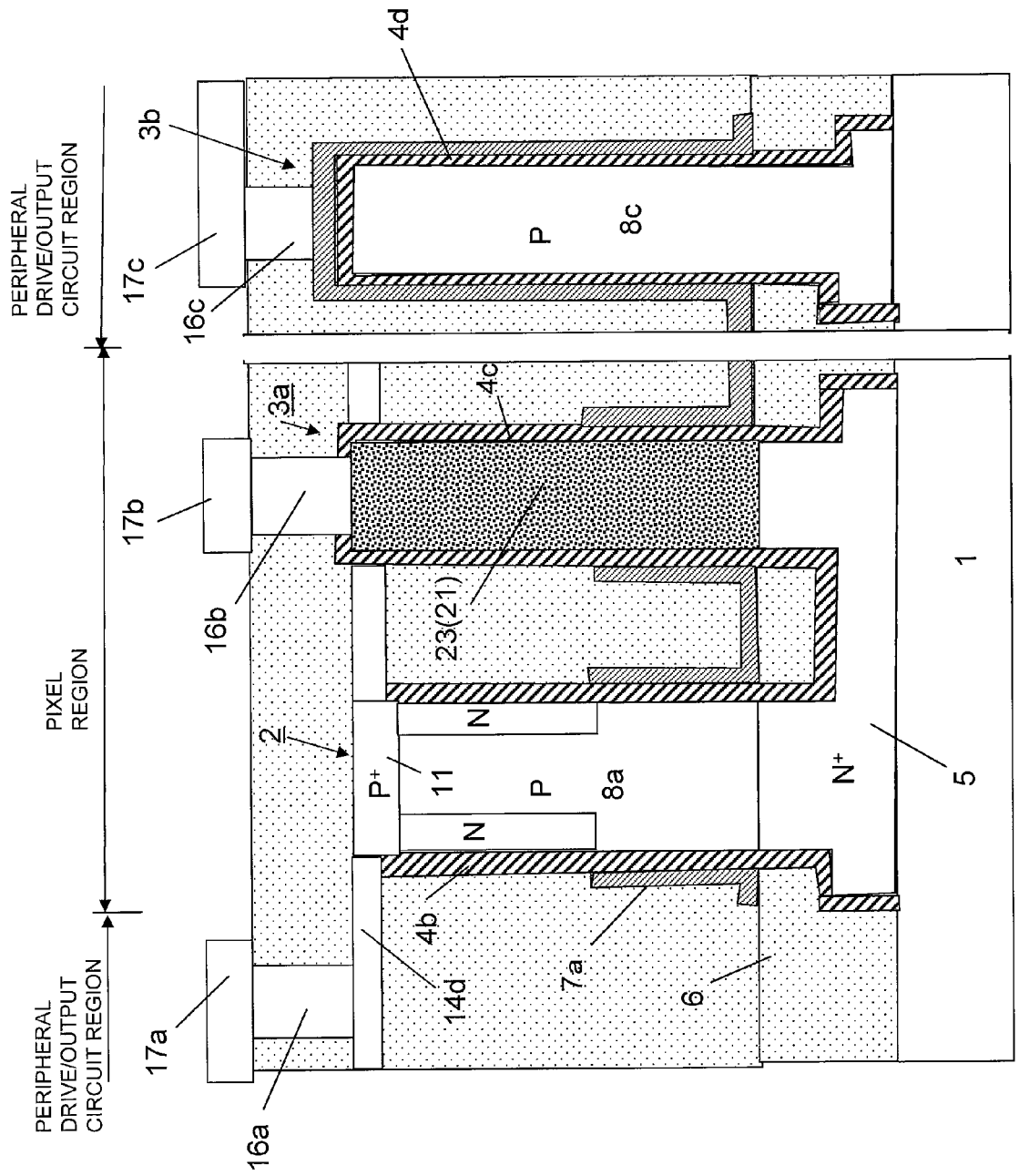
FIG. 7B is a cross-sectional structural view illustrating the method for producing a solid-state imaging device according to the fifth embodiment.

FIG. 7B is a view illustrating a cross-sectional structure formed by obtaining the structure illustrated in FIG. 7A, and then performing the same steps as the steps illustrated in FIGS. 2D, 2E, and 2F. In FIG. 2F, the pixel selection line conductor layer 14 is separated from the second silicon pillar 3 that establishes contact. In this embodiment, as illustrated in FIG. 7B, a pixel selection line conductor layer 14d is formed so as to extend from a pixel selection $P^+$ layer 11 on the first silicon pillar 2 to the outer periphery of the $SiO_2$ layer 4c surrounding the second silicon pillar 3a. The pixel selection line conductor layer 14d is connected to a pixel selection line metal layer 17a through a contact hole 16a. A signal line $N^+$ layer 5 is connected to a signal line metal layer 17b through a conductor layer 23 (21) of the second silicon pillar 3a that establishes contact and a contact hole 16b. Furthermore, the gate conductor layer 7a surrounds the outer periphery of the second silicon pillar 3a, extends to the third silicon pillar 3b, and further extends to the top surface of the third silicon pillar 3b. Furthermore, the gate conductor layer 7a is connected from the top of the third silicon pillar 3b to a gate conductor layer 17c through a contact hole 16c.

Figure 7C:
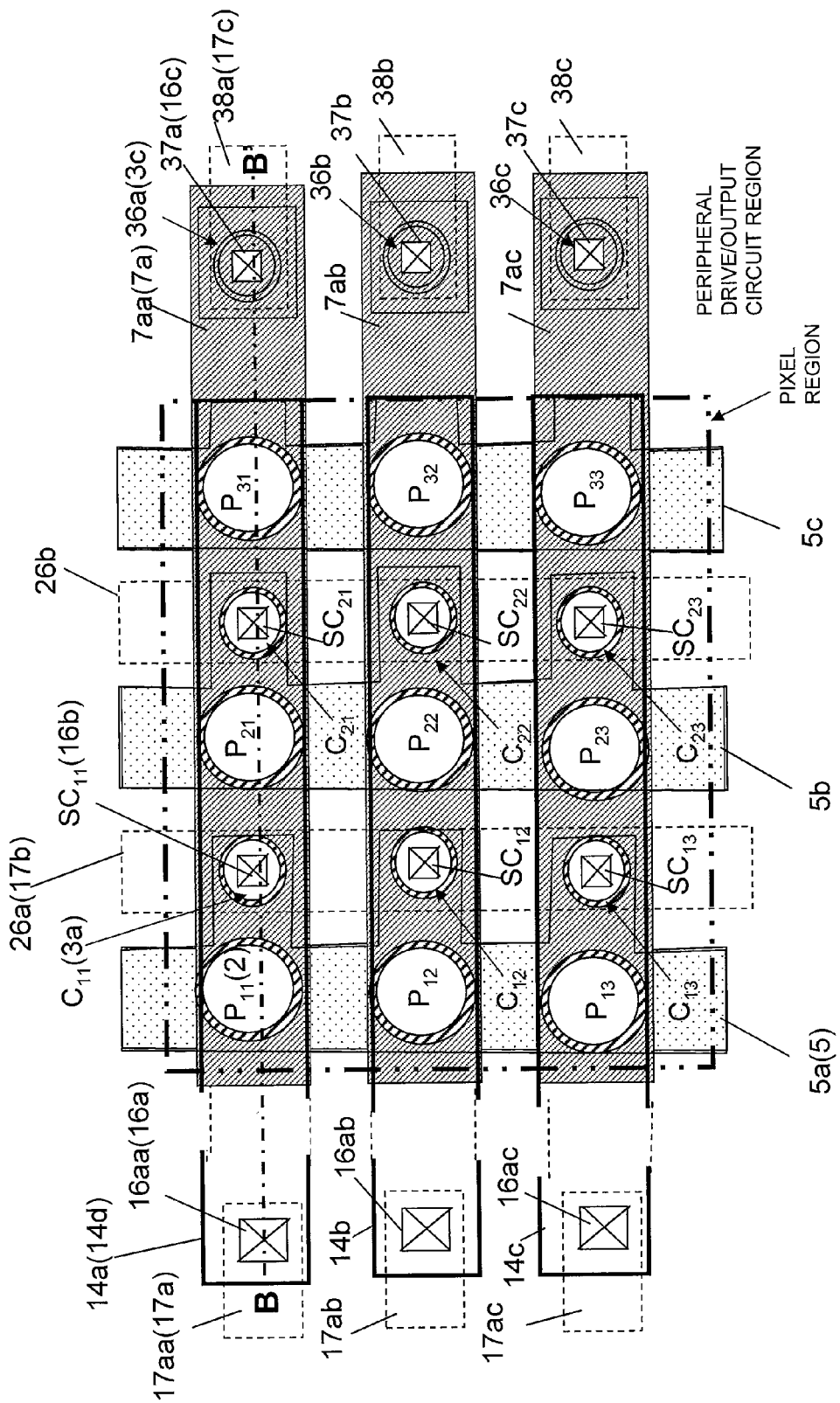
FIG. 7C is a plan view illustrating a solid-state imaging device according to the fifth embodiment.

FIG. 7C is a plan view of a structure illustrated in FIG. 7B, in which the gate conductor layer 7a is formed on the outer periphery of the second silicon pillar 3a that establishes contact. A cross-sectional structural view taken along line B-B' in FIG. 7C corresponds to FIG. 7B. In a pixel region illustrated in FIG. 7B, among first silicon pillars and second silicon pillars that are repeatedly arranged in the horizontal (row) direction of FIG. 7C, only a first silicon pillar $P_{11}$ that forms a first pixel on line B-B' (first silicon pillar 2 in FIG. 7B) and a second silicon pillar $C_{11}$ that establishes contact (second silicon pillar 3a in FIG. 7B) are illustrated. In the actual solid-state imaging device, the first silicon pillar $P_{11}$ that forms the a pixel and the second silicon pillar $C_{11}$ that establishes contact form a pair, and the pair of silicon pillars are two-dimensionally arranged in the vertical (column) direction and in the horizontal (row) direction. In the solid-state imaging device of this embodiment, signal line $N^+$ layers 5a (5), 5b, and 5c are formed so as to extend in the vertical (column) direction. First silicon pillars $P_{11}$ to $P_{33}$ and second silicon pillars $C_{11}$ to $C_{33}$ that establish contact are formed on the signal line $N^+$ layers 5a (5), 5b, and 5c so that the second silicon pillars $C_{11}$ to $C_{33}$ are respectively arranged adjacent to the first silicon pillars $P_{11}$ to $P_{33}$ in the horizontal (row) direction. At the same time, third silicon pillars 36a (3b), 36b, and 36c are formed so as to be respectively connected to gate conductor layers 7aa (7a), 7ab, and 7ac in a peripheral drive/output circuit region. Lower regions of the first silicon pillars $P_{11}$ to $P_{33}$ and the second silicon pillars $C_{11}$ to $C_{33}$ are connected to the signal line N+ layers 5a (5), 5b, and 5c. The gate conductor layers 7aa (7a), 7ab, and 7ac are formed on the outer peripheries of the first and second silicon pillars $P_{11}$ and $P_{33}$ to $C_{11}$ to $C_{33}$ so as to extend in the horizontal (row) direction. Furthermore, the gate conductor layers 7aa (7a), 7ab, and 7ac extend to the third silicon pillars 36a (3c), 36b, and 36c in the peripheral drive/output circuit region. Similarly, pixel selection line conductor layers 14a (14d), 14b, and 14c are formed on the outer peripheries of the first silicon pillars $P_{11}$ to $P_{33}$ and the second silicon pillars $C_{11}$ to $C_{33}$ so as to extend in the horizontal (row) direction in FIG. 7C. Furthermore, the pixel selection line conductor layers 14a (14d), 14b, and 14c are respectively connected to pixel selection line metal layers 17aa (17a), 17ab, and 17cc through contact holes 16aa (16a), 16ab, and 16ac. The gate conductor layers 7aa (7a), 7ab, and 7ac are respectively connected to gate conductor layers 38a (17c), 38b, and 38c through contact holes 37a (16c), 37b, and 37c that are respectively formed on the third silicon pillars 36a (3c), 36b, and 36c. The signal line N+ layers 5a (5), 5b, and 5c are connected to signal line metal layers 26a (17b), 26b, etc. through contact holes $SC_{11}$ to $SC_{23}$, etc. formed on the second silicon pillars $C_{11}$ to $C_{33}$ that establish contact. In the example of the solid-state imaging device in the related art illustrated in FIG. 17C, signal lines are led to the peripheral drive/output circuit region through the signal line N+ layers 116a, 116b, and 116c having a high resistance and formed at the bottom of the first silicon pillars $P_{11}$ to $P_{33}$ that form pixels in the pixel region. In contrast, in this embodiment, signal lines are led through the signal line metal layers 26a (17b) and 26b having a low electrical resistance. Consequently, according to the solid-state imaging device of this embodiment, high-speed driving can be realized, as compared with the example of the solid-state imaging device in the related art.

Furthermore, according to this embodiment, the degree of pixel integration in the pixel region can be improved. Specifically, in the related art illustrated in FIG. 17D, the contact holes $CH_{11}$ to $CH_{33}$, which connect the signal line N+ layers 130a, 130b, and 130c formed at the bottom of the first silicon pillars $P_{11}$ to $P_{33}$ that forms pixels to the signal line metal layers 135a, 135b, and 135c formed on the top, cannot be formed so as to overlap with the reset MOS gate conductor layers 131a, 131b, and 131c of a MOS transistor and the pixel selection line conductor N+ layers 132a, 132b, and 132c, all of which are formed above the signal line N+ layers 130a, 130b, and 130c, in plan view. Therefore, it is necessary to form the reset MOS gate conductor layers 131a, 131b, and 131c and the pixel selection line conductor IN layers 132a, 132b, and 132c so as to bypass the contact holes $CH_{11}$ to $CH_{33}$. In contrast, in this embodiment, the gate conductor layers 7aa (7a), 7ab, and 7ac and the pixel selection line conductor layers 14a (14d), 14b, and 14c can be formed along the outer peripheries of the second silicon pillars $C_{11}$ to $C_{33}$ that establish contact so as to overlap each other in plan view. Consequently, according to the solid-state imaging device of this embodiment, the degree of pixel integration in the pixel region can be improved, as compared with the example of the solid-state imaging device in the related art.

In the cross-sectional structure illustrated in FIG. 7B, the insulating layer 4c formed on the outer periphery of the second silicon pillar 3a that establishes contact is a layer composed of the same material as the gate insulating layer 4b formed on the outer periphery of the first silicon pillar 2. In general, a high-dielectric constant (High-K) material layer is used as the gate insulating layer 4b. Accordingly, coupling capacitances between the gate conductor layer 7a formed on the outer periphery of the second silicon pillar 3a that establishes contact and the conductor layer 23 (21) in the second silicon pillar 3a that establishes contact and between the pixel selection line conductor layer 14b and the conductor layer 23 (21) increase. Such an increase in the coupling capacitances between the gate line and the signal line and between the pixel selection line and the signal line impairs the effect of realizing high-speed driving of the solid-state imaging device. Furthermore, in this case, realization of stable driving of the solid-state imaging device is impaired by mixing of mutual pulse voltage noise between the gate line and the signal line and between the pixel selection line and the signal line. Accordingly, in order to realize high-speed driving and stable driving of a solid-state imaging device, it is desirable to reduce the capacitance between a reset gate line and a signal line and the capacitance between a pixel selection line and a signal line.

Figure 7D:
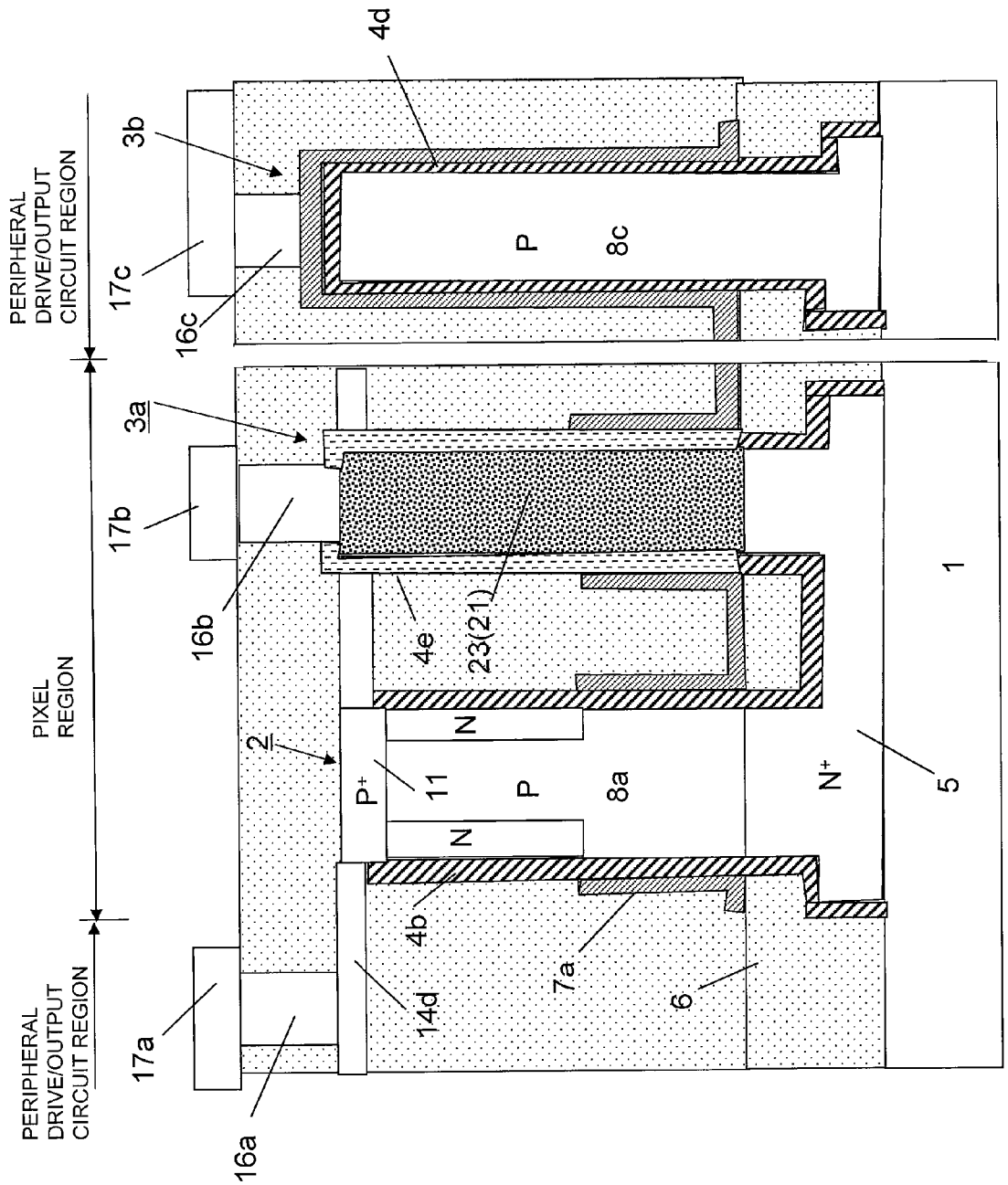
FIG. 7D is a cross-sectional structural view illustrating a solid-state imaging device according to the fifth embodiment.

FIG. 7D is a cross-sectional structural view of a solid-state imaging device in which the capacitance between a reset gate line and a signal line and the capacitance between a pixel selection line and a signal line are further reduced. The structure illustrated in FIG. 7D is the same as the structure illustrated in FIG. 7B except that a low-capacitance insulating layer 4e is formed so as to surround the conductor layer 23 (21) of the second silicon pillar 3a that establishes contact. The low-capacitance insulating layer 4e may be a low-dielectric constant (low-k) insulating layer such as an oxide film (SiOF or SiOC) containing fluorine (F) or carbon (C) or a porous $SiO_2$ film, a thick $SiO_2$ film, or a combination of an insulating film such as a $SiO_2$ film and a low-dielectric constant insulating film. This low-capacitance insulating layer 4e reduces the coupling capacitances formed between the gate conductor layer 7a and the conductor layer 23 (21) connected to the signal line N+ layer 5 and between the pixel selection line conductor layer 14d and the conductor layer 23 (21). Thus, high-speed driving and stable driving of the solid-state imaging device can be realized.

Sixth Embodiment

A solid-state imaging device according to this embodiment will now be described with reference to FIGS. 8A and 8B. In this embodiment, a decrease in the resolution of the solid-state imaging device is further suppressed, color-mixing characteristics in a color imaging device are further improved, and steps of forming contact holes can be easily performed, as compared with the fifth embodiment.

FIG. 8A is a plan view of a solid-state imaging device according to this embodiment. Signal line N+ layers 80a, 80b, and 80c are formed so as to extend in the vertical (column) direction. In a pixel region, first silicon pillars $P_{11}$ to $P_{33}$ that form pixels and second silicon pillars $C_{11}$ to $C_{33}$ that establish contact are formed on the signal line N+ layers 80a, 80b, and 80c. In addition to these silicon pillars, third silicon pillars 40a, 40b, and 40c that establish contact are respectively formed on planar silicon layers 39a, 39b, and 39c formed in a peripheral drive/output circuit region. The first silicon pillars $P_{11}$ to $P_{33}$ and the second silicon pillars $C_{11}$ to $C_{33}$ that establish contact are alternately arranged in the vertical (column) direction in the pixel region. Gate conductor layers 81a, 81b, and 81c are formed on the outer peripheries of the first silicon pillars $P_{11}$ to $P_{33}$ that form pixels so as to extend in the horizontal (row) direction while surrounding the second silicon pillars $C_{11}$ to $C_{33}$ formed between the first silicon pillars $P_{11}$ to $P_{33}$ so as to extend in the row direction. These gate conductor layers 81a, 81b, and 81c are respectively connected to gate conductor layers 42a, 42b, and 42c through contact holes 41a, 41b, and 41c formed on the third silicon pillars 40a, 40b, and 40c that establish contact and provided in the peripheral drive/output circuit region. Similarly, pixel selection line conductor layers 82a, 82b, and 82c are formed so as to extend in the horizontal (row) direction of FIG. 8A for each row of the first silicon pillars $P_{11}$ to $P_{33}$ extending in the row direction. The pixel selection line conductor layers 82a, 82b, and 82c extend to the outside of the pixel region and are respectively connected to pixel selection line metal layers 17aa, 17ab, and 17ac through contact holes 16aa, 16ab, and 16ac in the peripheral drive/output circuit region. The gate conductor layers 81a, 81b, and 81c are formed on the outer peripheries of the first silicon pillars $P_{11}$ to $P_{33}$ that form pixels and the second silicon pillars $C_{11}$ to $C_{33}$ that establish contact so that the gate conductor layers 81a, 81b, and 81c and the pixel selection line conductor layers 82a, 82b, and 82c alternately arranged so as to extend in the horizontal (row) direction. A signal line $N^+$ layer 80a and a signal line metal layer 83a, a signal line $N^+$ layer 80b and a signal line metal layer 83b, and a signal line $N^+$ layer 80c and a signal line metal layer 83c are connected to each other through contact holes $H_{11}$ to $H_{33}$ formed on the second silicon pillars $C_{11}$ to $C_{33}$ that establish contact. When viewed from the light incident surface side, except for the first silicon pillars $P_{11}$ to $P_{33}$ that form pixels, the pixel region is covered with the gate conductor layers 81a, 81b, and 81c and the pixel selection line conductor layers 82a, 82b, and 82c, all of which block light.

Figure 8B:
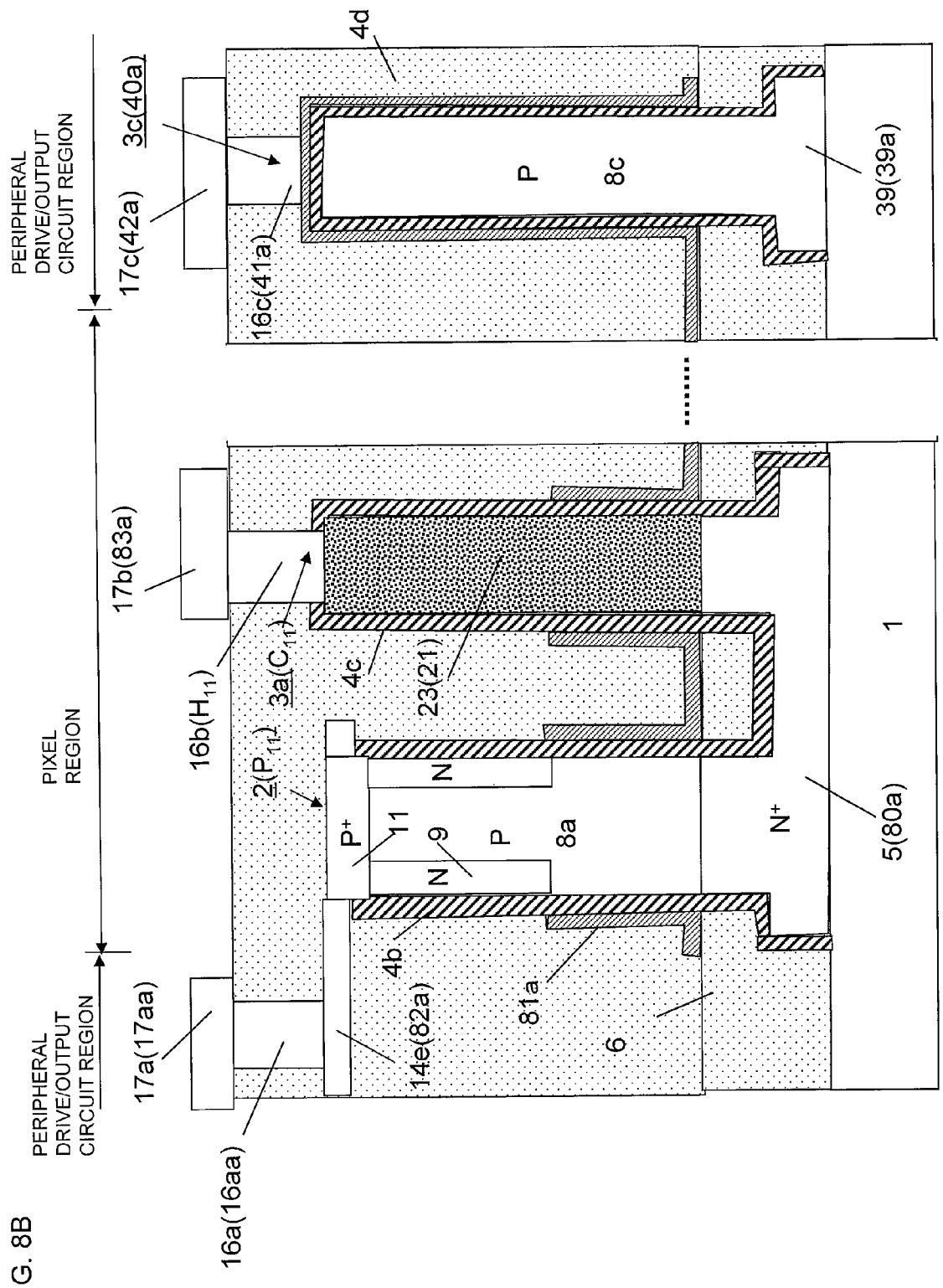
FIG. 8B is a cross-sectional structural view illustrating the solid-state imaging device according to the sixth embodiment.

FIG. 8B is a cross-sectional structural view taken along line C-C' in FIG. 8A. (In FIG. 8B, in a pixel region, only a first silicon pillar $P_{11}$ that forms a pixel and a second silicon pillar $C_{11}$ that establishes contact and that is formed below the first silicon pillar $P_{11}$ are illustrated, and illustration of contact pillars $C_{12}$ and $C_{13}$ is omitted.) The bottom of the first silicon pillar 2 ($P_{11}$) that forms a pixel is connected to the bottom of the second silicon pillar 3a ($C_{11}$) through a signal line $N^+$ layer 5 (80a). A gate conductor layer 81a formed on the outer periphery of a P layer 8a of the first silicon pillar 2 ($P_{11}$) with a gate insulating layer 4b therebetween is formed on the outer peripheries of the first silicon pillar 2 ($P_{11}$) and the second silicon pillar 3a ($C_{11}$) so as to connect the first silicon pillar 2 ($P_{11}$) to the second silicon pillar 3a ($C_{11}$). Regarding the second silicon pillar 3a ($C_{11}$), the gate conductor layer 81a is formed on the outer periphery of an insulating layer 4c. An N layer 9 of a photodiode is formed on an outer peripheral portion of the P layer 8a so as to be adjacent to the gate conductor layer 81a of the first silicon pillar 2 ($P_{11}$). A pixel selection line conductor layer 14e (82a) is connected to a $P^+$ layer 11 formed in an upper region of the N layer 9. Contact holes 16a (16aa) and 16b ($H_{11}$) having the same depth are respectively formed on the pixel selection line conductor layer 14e (82a) and the second silicon pillar 3a ($C_{11}$). Furthermore, the pixel selection line conductor layer 14e (82a) is connected to a pixel selection line metal layer 17a (17aa) through the contact hole 16a (16aa). A conductor layer 23 (21) of the second silicon pillar 3a ($C_{11}$) is connected to the signal line metal layer 17b (83a) through the contact hole 16b ($H_{11}$).

As described above, this embodiment has five features described below.

1. A signal current of a pixel or a reset current is extracted from the pixel region to the peripheral drive/output circuit region through the signal line metal layers 83a, 83b, and 83c having a low resistance. Thus, high-speed driving of the solid-state imaging device can be realized.

2. Light incident on the pixel region between the first silicon pillars $P_{11}$ to $P_{33}$ is blocked by the gate conductor layers 81a, 81b, and 81c and the pixel selection line conductor layers 82a, 82b, and 82c, all of which block light, thereby preventing the light from reaching the signal line $N^+$ layers 80a, 80b, and 80c. Thus, an improvement in the resolution and an improvement in color-mixing characteristics in color imaging can be realized. Degradation of the resolution and the color-mixing characteristics is caused as follows. Light that is originally incident on one pixel reaches the signal line $N^+$ layers 80a, 80b, and 80c and is incident on a photoelectric conversion region of an adjacent pixel by, for example, multiple reflection at material layers surrounding the signal line $N^+$ layers 80a, 80b, and 80c.

3. The second silicon pillars $C_{11}$ to $C_{33}$ that establish contact are formed in the regions of the gate conductor layers 81a, 81b, and 81c, whereby the arrangement of a wiring pattern of the gate conductor layers 81a, 81b, and 81c and the pixel selection line conductor layers 82a, 82b, and 82c for improving the resolution and the color-mixing characteristics can be realized without decreasing the degree of pixel integration.

4. Since the pixel selection line conductor layers 82a, 82b, and 82c are not formed on the outer peripheries of the second silicon pillars $C_{11}$ to $C_{33}$ that establish contact, the contact holes $H_{11}$ to $H_{33}$ provided on the second silicon pillars $C_{11}$ to $C_{33}$ that establish contact can be easily formed.

5. The contact holes 16aa, 16ab, 16ac, $H_{11}$ to $H_{33}$, 41a, 41b, and 41c having a small height and the same depth are respectively formed on the first silicon pillars $P_{11}$ to $P_{33}$, the second silicon pillars $C_{11}$ to $C_{33}$, and the third silicon pillars 40a, 40b, and 40c, and thus these contact holes can be easily produced.

Seventh Embodiment

A solid-state imaging device for color imaging according to this embodiment will now be described with reference to FIGS. 9A and 9B.

Figure 9A:
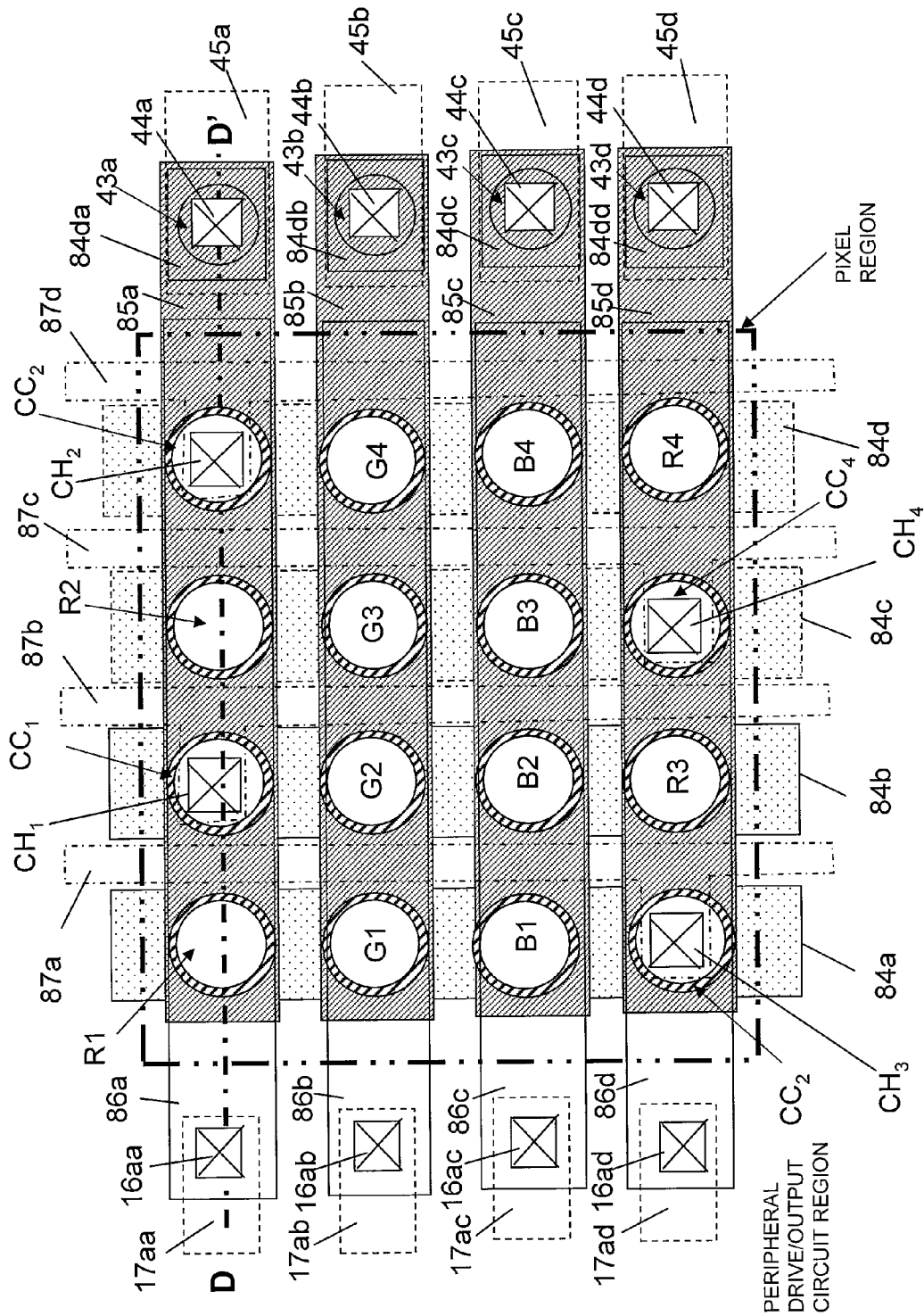
FIG. 9A is a plan view illustrating a solid-state imaging device according to a seventh embodiment of the present invention.

FIG. 9A is a plan view of a solid-state imaging device according to this embodiment. Signal line $N^+$ layers 84a, 84b, 84c, and 84d are formed so as to extend in the vertical (column) direction. First silicon pillars R1, R2, R3, and R4 (hereinafter abbreviated as "R1 to R4") that form pixels for a red signal, first silicon pillars G1, G2, G3, and G4 (hereinafter abbreviated as "G1 to G4") that form pixels for a green signal, and first silicon pillars B1, B2, B3, and B4 (hereinafter abbreviated as "B1 to B4") that form pixels for a blue signal are formed so as to be connected to the signal line $N^+$ layers. Second silicon pillars $CC_1$, $CC_2$, $CC_3$, and $CC_4$ (hereinafter abbreviated as "$CC_1$ to $CC_4$") that establish contact and that are formed at the same time of the formation of the first silicon pillars are connected to the signal line $N^+$ layers 84a, 84b, 84c, and 84d. Third silicon pillars 43a, 43b, 43c, and 43d that establish contact are formed on planar silicon layers 84da, 84db, 84dc, and 84dd provided in a peripheral drive/output circuit region. The second silicon pillars $CC_1$ and $CC_2$ that establish contact are formed in regions where pixels are to be formed, and specifically, arranged at positions in the column direction and between the first silicon pillars R1 and R2 that form pixels for a red signal and that are arranged in the horizontal (row) direction. Similarly, the second silicon pillars $CC_3$ and $CC_4$ that establish contact are formed in regions where pixels are to be formed, and specifically, arranged at positions in the column direction and between the first silicon pillars R3 and R4 that form pixels for a red signal and that are arranged in the horizontal (row) direction. Gate conductor layers 85a, 85b, 85c, and 85d are formed on the outer peripheries of the first silicon pillars R1 to R4, G1 to G4, and B1 to B4 that form pixels and the second silicon pillars $CC_1$ and $CC_4$ that establish contact, and formed so as to extend in the horizontal (row) direction. Similarly, pixel selection line conductor layers 86a, 86b, 86c, and 86d are formed on the outer peripheries of the first silicon pillars R1 to R4, G1 to G4, and B1 to B4 that form pixels and the second silicon pillars $CC_1$ and $CC_4$ that establish contact, and formed so as to extend in the horizontal (row) direction. The signal line N⁺ layer 84*a* and a signal line metal layer 87*a*, the signal line N⁺ layer 84*b* and a signal line metal layer 87*b*, the signal line N⁺ layer 84*c* and a signal line metal layer 87*c*, and the signal line N⁺ layer 84*d* and a signal line metal layer 87*d* are connected to each other through contact holes $CH_1$ to $CH_4$ that are respectively formed on the second silicon pillars $CC_1$ to $CC_4$ that establish contact. The gate conductor layers 85*a*, 85*b*, 85*c*, and 85*d* are respectively connected to gate conductor layers 45*a*, 45*b*, 45*c*, and 45*d* through contact holes 44*a*, 44*b*, 44*c*, and 44*d* respectively provided on the third silicon pillars 43*a*, 43*b*, 43*c*, and 43*d* that establish contact. The connection between the signal line N⁺ layers 84*a*, 84*b*, 84*c*, and 84*d* and the signal line metal layers 87*a*, 87*b*, 87*c*, and 87*d* is formed in each column formed by arranging the first Si pillars R1 to R4 that form pixels for a red signal in the horizontal direction in a pixel region. Accordingly, high-speed driving of the solid-state imaging device can be realized.

FIG. 9B is a cross-sectional structural view taken along line D-D' in FIG. 9A. In the actual solid-state imaging device, in addition to the first silicon pillars R1 to R4, G1 to G4, and B1 to B4 that form pixels and the second silicon pillars $CC_1$, $CC_2$, and $CC_3$ that establish contact, other first and second silicon pillars are further two-dimensionally arranged. Here, a description will be made of a case where only the first silicon pillars R1 and R3 and the second silicon pillars $CC_1$ and $CC_2$ that establish contact, the first and second silicon pillars being arranged along line D-D', are formed. In FIG. 9A, planar signal line N⁺ layers 84*a*, 84*b*, 84*c*, and 84*d*, which are formed in the vertical (column) direction, and a planer silicon layer 84*e* are formed on a silicon oxide substrate 1. The first silicon pillars R1 and R3 that form pixels and the second silicon pillars $CC_1$ and $CC_2$ that establish contact are respectively formed on the signal line N⁺ layers 84*a*, 84*c*, 84*b*, and 84*d*, and a third silicon pillar 43*a* that establishes contact is formed on the planer silicon layer 84*e*. P layers 8*a* and 8*c* are respectively formed on the signal line N⁺ layers 84*a* and 84*c* located at the bottom of the first silicon pillars R1 and R3 that form pixels. The gate conductor layer 85*a* is formed on the outer peripheries of the P layers 8*a* and 8*c* with gate insulating layers 4*b* and 4*d* therebetween, respectively. The gate conductor layer 85*a* also extends to the outer peripheries of the second silicon pillars $CC_1$ and $CC_2$ that establish contact. The gate conductor layer 85*a* connects the first silicon pillar R1, the second silicon pillar $CC_1$, the first silicon pillar R3, and the second silicon pillar $CC_2$ in that order. N layers 9 and 9*a* of photodiodes are respectively formed on the outer peripheries of the P layers 8*a* and 8*c* so as to be adjacent to the gate conductor layer 85*a* of the first silicon pillars R1 and R3. A pixel selection line conductor layer 86*a* that is connected to P⁺ layers 11 and 11*a* formed on the photodiodes extends so as to include the outer peripheries of the first and second silicon pillars R1, $CC_1$, R3, and $CC_2$. Regarding the second silicon pillars $CC_1$ and $CC_2$, the pixel selection line conductor layer 86*a* surrounds insulating layers 4*c* and 4*e*. The pixel selection line conductor layer 86*a* extends to a peripheral drive/output circuit region located outside a pixel region and is connected to a pixel selection line metal layer 17*aa* through a contact hole 16*aa*. Contact holes $SH_1$, $SH_2$, and 44*a* are respectively formed at the same time on conductor layers 23*a* and 23*b* of the second silicon pillars $CC_1$ and $CC_2$ and the third silicon pillar 43*a* so as to have the same depth as the depth of the contact hole 16*aa*. The conductor layers 23*a* and 23*b* are respectively connected to signal line metal layers 87*b* and 87*d* through the contact holes $SH_1$ and $SH_2$. In FIG. 9A, the signal line metal layers 87*a*, 87*b*, 87*c*, and 87*d* are formed so as to extend in the vertical (column) direction.

In the solid-state imaging device for color imaging according to this embodiment, the second silicon pillars $CC_1$, $CC_2$, $CC_3$, and $CC_4$ that establish contact can be treated as pseudo pixels by pixel signal processing. For example, the second silicon pillar $CC_1$ is assumed to be the same signal as the signal of the pixel R1 arranged in the same row, and the second silicon pillar $CC_2$ is assumed to be the same signal as the signal of the pixel R2 arranged in the same row. This structure utilizes the fact that the resolution for a red signal may be lower than that for a green signal because the signal band for the red signal is lower than the signal band for the green signal. In the solid-state imaging device of this embodiment, since the second silicon pillars $CC_1$ to $CC_4$ that establish contact are provided in the pixel region, high-speed driving can be realized without decreasing the degree of pixel integration.

Eighth Embodiment

A semiconductor device using a P-channel SGT according to this embodiment will now be described with reference to FIGS. 10A to 10C.

Figure 10A:
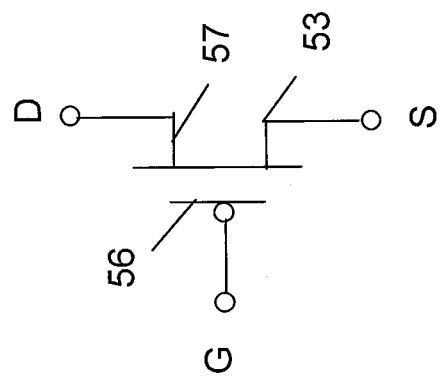
FIG. 10A is a circuit diagram of a P-channel SGT according to an eighth embodiment of the present invention.

FIG. 10A is a circuit diagram of a single P-channel SGT. This P-channel SGT includes a gate 56, a source 53, and a drain 57. Furthermore, the gate 56 is connected to a gate terminal G, the source 53 is connected to a source terminal S, and the drain 57 is connected to a drain terminal D.

Figure 10B:
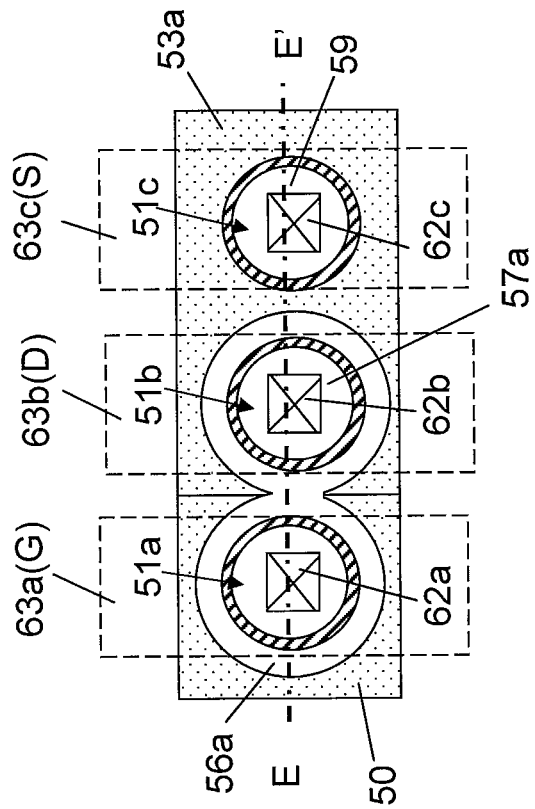
FIG. 10B is a plan view illustrating the P-channel SGT according to the eighth embodiment.

FIG. 10B is a plan view of the P-channel SGT illustrated in FIG. 10A. A source P⁺ layer 53*a* forming the source 53 is formed on a planar silicon layer 50. A first silicon pillar 51*b* that forms an SGT and a second silicon pillar 51*c* that establishes contact are formed on the source P⁺ layer 53*a*. A third silicon pillar 51*a* that is connected to a gate conductor layer 56*a* of the gate 56 and that establishes contact is formed so as to be adjacent to the first silicon pillar 51*b* that forms an SGT. The gate conductor layer 56*a* is formed so as to surround the outer periphery of the first silicon pillar 51*b* that forms an SGT and to cover the third silicon pillar 51*a* that establishes contact. Furthermore, a drain P layer 57*a* formed on the first silicon pillar 51*b* that forms an SGT is connected to a drain wiring metal layer 63*b* (D) through a contact hole 62*b*. The source P⁺ layer 53*a* is connected to a source wiring metal layer 63*c* (S) through a conductor layer 59 of the silicon pillar 51*c* that establishes contact and a contact hole 62*c*. The gate conductor layer 56*a* is connected from the top of the third silicon pillar 51*a* that establishes contact to a gate metal layer 63*a* (G) through a contact hole 62*a*.

Figure 10C:
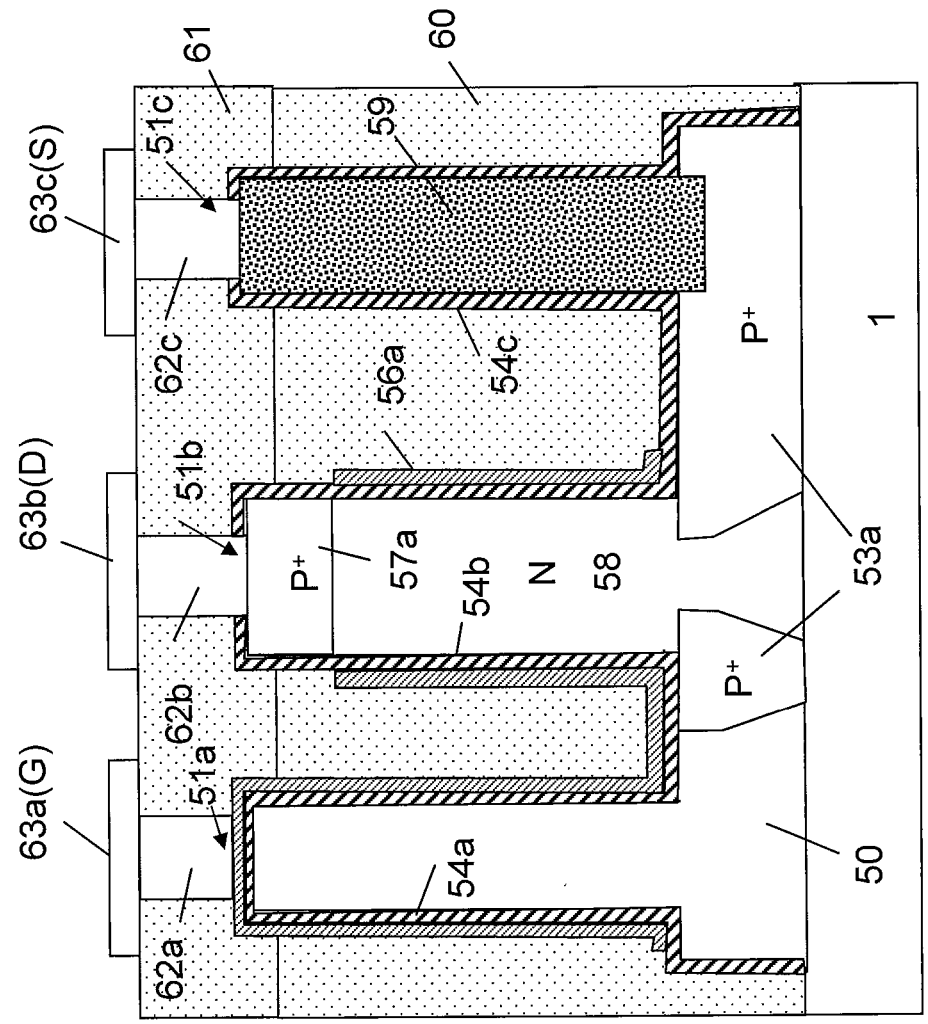
FIG. 10C is a cross-sectional structural view illustrating the P-channel SGT according to the eighth embodiment.

FIG. 10C is a cross-sectional structural view taken along line E-E' in the plan view illustrated in FIG. 10B. A planar silicon layer 50 is formed on a silicon oxide substrate 1. A first silicon pillar 51*b* that forms an SGT, a second silicon pillar 51*c* that establishes contact, and a third silicon pillar 51*a* are formed on the planar silicon layer 50. The planar silicon layer 50 and a silicon layer 58 of the first silicon pillar 51*b* are each an N-type or intrinsic-type semiconductor. Insulating layers 54*a*, 54*b*, and 54*c* are formed so as to cover the planar silicon layer 50 and exposed portions of the first silicon pillar 51*b*, the second silicon pillar 51*c*, and the third silicon pillar 51*a*. A gate conductor layer 56*a* is formed on the outer periphery of the first silicon pillar 51*b* with the insulating layer 54*b* therebetween. The gate conductor layer 56*a* extends to the top of the third silicon pillar 51*a*, the whole structure of which is covered with the insulating layer 54*a*. A source P⁺ layer 53*a* is formed in the planar silicon layer 50 in lower regions of the first silicon pillar 51*b* and the second silicon pillar 51*c*. Furthermore, a drain P⁺ layer 57*a* is formed in an upper region of the first silicon pillar 51*b* so as to be adjacent to the gate conductor layer 56a. The whole structure is then covered with an insulating layer 60, and a conductor layer 59 that is connected from the source P$^+$ layer 53a of the second silicon pillar to the top surface of the second silicon pillar 51c is formed. The resulting structure is covered with an insulating layer 61. Through the insulating layer 61, a contact hole 62a is formed on the third silicon pillar 51a, a contact hole 62b is formed on the first silicon pillar 51b, and a contact hole 62c is formed on the second silicon pillar 51c. The gate conductor layer 56a is connected to a gate metal layer 63a (G) through the contact hole 62a. The drain P$^+$ layer 57a is connected to a drain wiring metal layer 63b (D) through the contact hole 62b. The source P$^+$ layer 53a is connected to a source wiring metal layer 63c (S) through the conductor layer 59 formed in the second silicon pillar 51c and the contact hole 62c. In this structure, the contact holes 62b, 62c, and 62a that are respectively formed on the first silicon pillar 51b, the second silicon pillar 51c, and the third silicon pillar 51a are formed so as to have the same depth (height).

A method for producing the P-channel SGT includes a first to third silicon pillar-forming step of forming a first silicon pillar 51b that forms an SGT, a second silicon pillar 51c that establishes contact, and a third silicon pillar 51a, all of which are connected to a planer silicon layer 50 on a silicon oxide substrate 1, at the same time so as to have the same height; a first and second silicon pillar bottom connection-forming step of forming a source P$^+$ layer 53a of the SGT on the planer silicon layer 50 so as to surround the bottom of the first silicon pillar 51b, and connecting the source P$^+$ layer 53a to the bottom of the second silicon pillar 51c; a first silicon pillar SGT-forming step of respectively forming an insulating layers 54b on the outer periphery of the first silicon pillar 51b and an insulating layers 54c on the outer periphery of the second silicon pillar 51c, forming a gate conductor layer 56a so as to surround the gate insulating layers 54b, forming the gate conductor layer 56a so as to extend to the top of the third silicon pillar 51a that establishes contact and that is covered with an insulating layer 54a, and forming a drain P$^+$ layer 57a in an upper portion of the first silicon pillar 51b so as to be adjacent to the gate conductor layer 56a so that a silicon layer 58 of the first silicon pillar 51b, the silicon layer 58 being located between the drain P$^+$ layer 57a and the source P$^+$ layer 53a, functions as a channel; a second silicon pillar conductor layer-forming step of forming a conductor layer 59 in the second silicon pillar 51c that establishes contact, the conductor layer 59 being composed of a silicide or Si into which an acceptor impurity is introduced by ion implantation; a contact hole-forming step of forming insulating layers 60 and 61 so as to cover the first silicon pillar 51b, the second silicon pillar 51c, and the third silicon pillar 51a, and forming a contact hole 62a on the third silicon pillar 51a that establishes contact, a contact hole 62b on the first silicon pillar 51b that forms the SGT, and a contact hole 62c on the second silicon pillar 51c that establishes contact; and a wiring metal layer-forming step of connecting the gate conductor layer 56a to a gate metal layer 63a (G) through the contact hole 62a, the drain P$^+$ layer 57a to a drain wiring metal layer 63b (D) through the contact hole 62b, and the conductor layer 59 to a source wiring metal layer 63c (S) through the contact hole 62c.

In this SGT, when the drain P$^+$ layer 57a functions as a source, the source P$^+$ layer 53a functions as a drain. In an N-channel SGT, the drain and the source are each formed of an N$^+$ layer, and the channel is formed of a P-type or an intrinsic-type semiconductor.

Ninth Embodiment

Semiconductor devices using SGTs according to this embodiment will now be described with reference to FIGS. 11A to 11G.

Figure 11A:
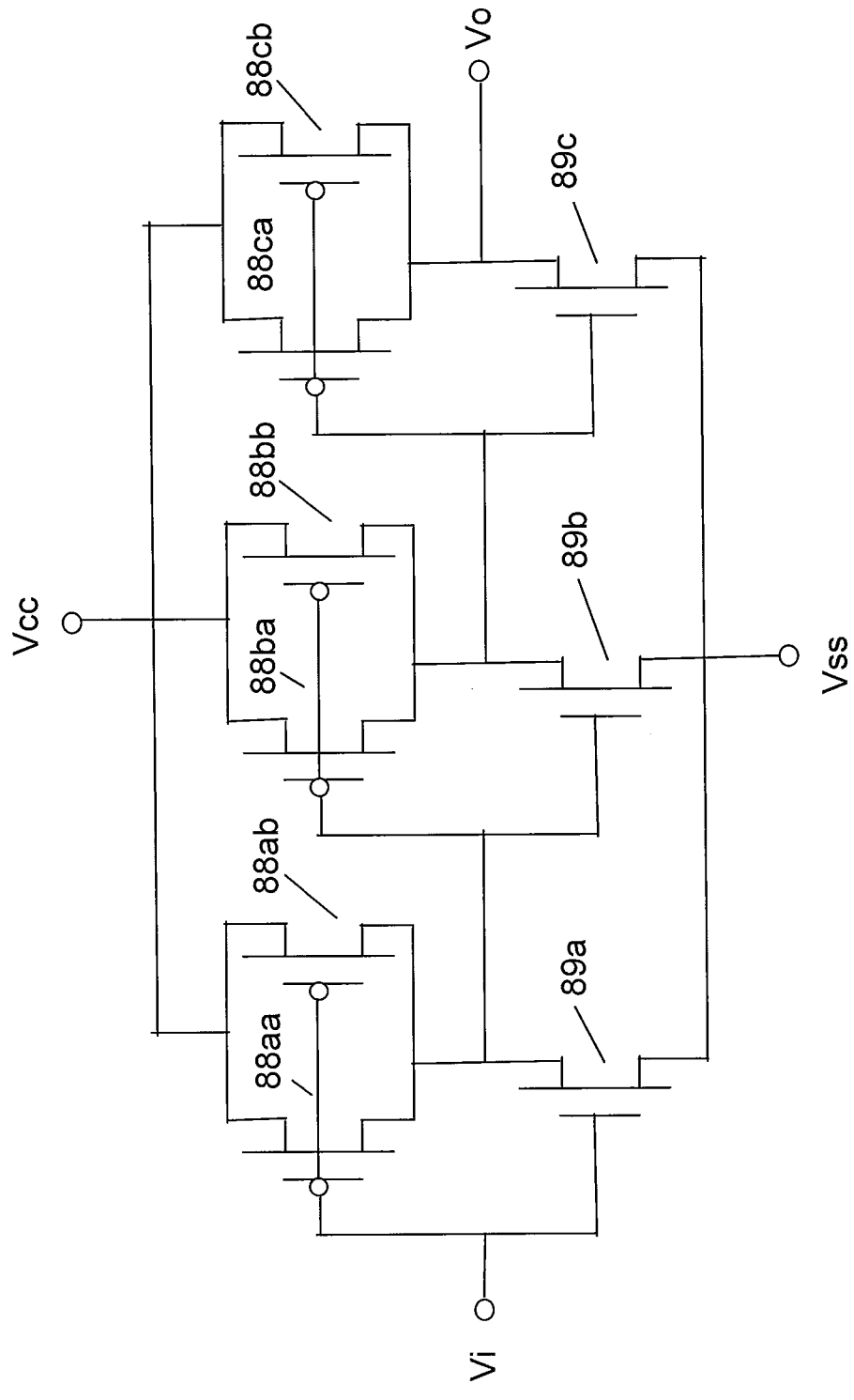
FIG. 11A is a circuit diagram illustrating a CMOS inverter circuit using SGTs according to a ninth embodiment of the present invention.

FIG. 11A is a three-stage CMOS inverter circuit diagram using SGTs. A first-stage inverter circuit includes two P-channel SGTs 88aa and 88ab and an N-channel SGT 89a. Gates of the SGTs 88aa, 88ab, and 89a are connected to an input terminal Vi. Drains of the P-channel SGTs 88aa and 88ab are connected to a power supply terminal Vcc. Sources of the P-channel SGTs 88aa and 88ab and a source of the N-channel SGT 89a are connected to each other to form a first-stage output terminal, and the first-stage output terminal is connected to an input terminal of a second-stage inverter circuit. Furthermore, a drain of the N-channel SGT 89a is connected to a ground terminal Vss. Similarly to the first-stage inverter circuit, the second-stage inverter circuit including P-channel SGTs 88ba and 88bb and an N-channel SGT 89b, and a third-stage inverter circuit including P-channel SGTs 88ca and 88cb and an N-channel SGT 89c are connected to each other. Drains of the P-channel SGTs 88ba, 88bb, 88ca, and 88cb of the second-stage and third-stage inverter circuits are connected to the power supply terminal Vcc. Drains of the N-channel SGTs 89b and 89c are connected to the ground terminal Vss. In this three-stage CMOS inverter circuit, a signal voltage input to the input terminal Vi is output as an inverted signal from an output terminal Vo while being delayed by 3-clock time.

Figure 11B:
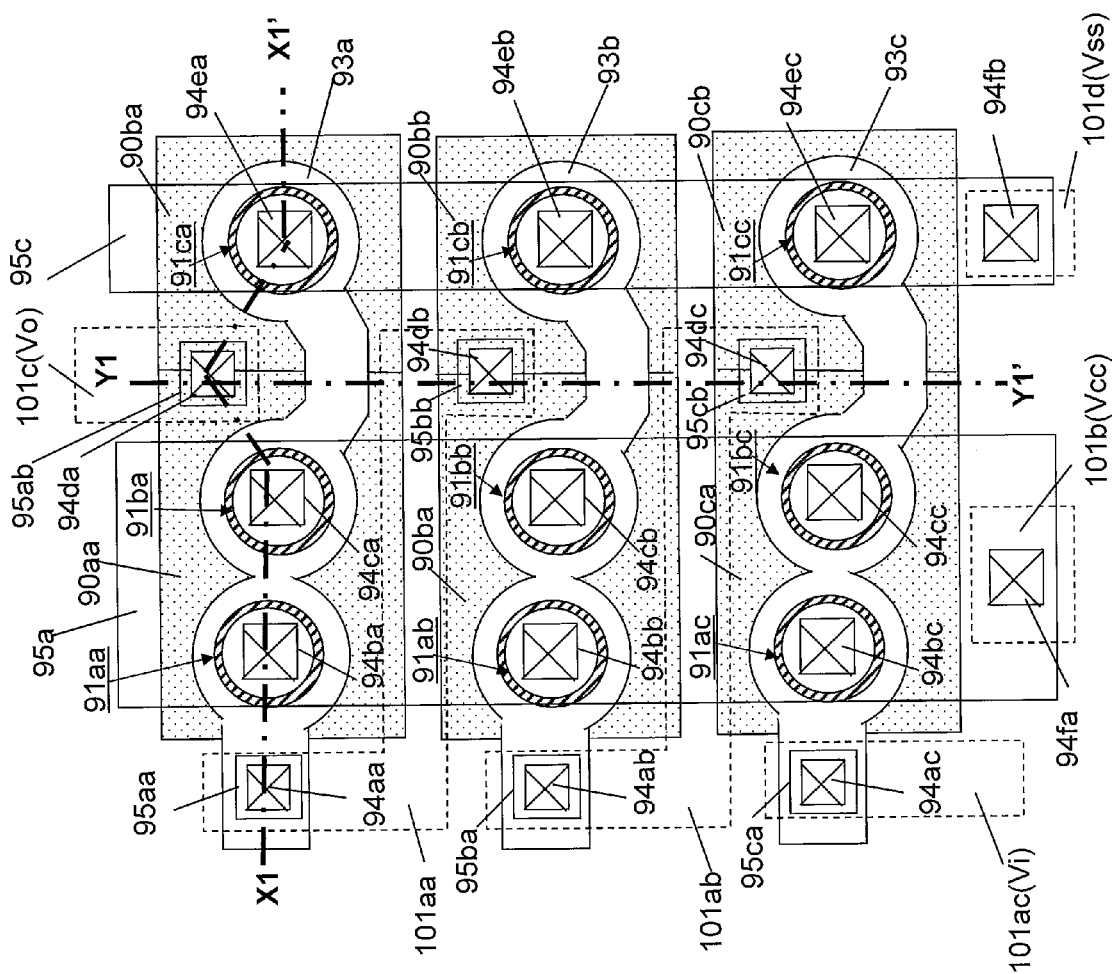
FIG. 11B is a plan view illustrating a CMOS inverter circuit using SGTs according to the ninth embodiment, the CMOS inverter circuit being formed by a known technique.

FIG. 11B is a plan view of a case where the three-stage CMOS inverter circuit illustrated in FIG. 11A is formed on a substrate using a known technique. A first-stage inverter circuit, a second-stage inverter circuit, and a third-stage inverter circuit are formed in that order from the lower part of FIG. 11B. The first-stage inverter circuit is formed by connecting a source P$^+$ layer 90ca of P-channel SGTs 88aa and 88ab and a source N$^+$ layer 90cb of an N-channel SGT 89a to each other. Silicon pillars 91ac and 91bc forming the P-channel SGTs 88aa and 88ab are formed on the source P$^+$ layer 90ca, and a silicon pillar 91cc forming the N-channel SGT 89a is formed on the N$^+$ layer 90cb. A gate conductor layer 93c of the SGTs 88aa, 88ab, and 89a is continuously formed so as to surround the silicon pillars 91ac, 91bc, and 91cc forming SGTs. The gate conductor layer 93c is connected to a first input wiring metal layer 95ca through a contact hole 94ac. Drains of the P-channel SGTs 88aa and 88ab are connected to a first power supply wiring metal layer 95a through contact holes 94bc and 94cc respectively formed on the silicon pillars 91ac and 91bc. The P$^+$ layer 90ca and the N$^+$ layer 90cb are each connected to a first output wiring metal layer 95cb through a contact hole 94dc formed on a boundary portion between the P$^+$ layer 90ca and the N$^+$ layer 90cb. A source of the N-channel SGT 89a is connected to a first ground wiring metal layer 95c through a contact hole 94ec formed on the silicon pillar 91cc. A second input wiring metal layer 101ac (Vi) is formed on the first input wiring metal layer 95ca so as to be connected to the first input wiring metal layer 95ca. A second output wiring metal layer 101ab that is connected to an input terminal of the second-stage inverter circuit is formed on the first output wiring metal layer 95cb so as to be connected to the first output wiring metal layer 95cb. In this first-stage inverter circuit, the gate conductor layer 93c is arranged so as to bypass the contact hole 94dc.

The second output wiring metal layer 101ab of the first-stage inverter circuit is connected to a first input wiring metal layer 95ba of the second-stage inverter circuit. The second-stage inverter circuit is formed so as to have the same arrangement as the first-stage inverter circuit. The second-stage inverter circuit includes a source P+ layer 90*ba* of P-channel SGTs 88*ba* and 88*bb*, a source N+ layer 90*bb* of an N-channel SGT 89*b*, silicon pillars 91*ab*, 91*bb*, and 91*cb*, a gate conductor layer 93*b*, contact holes 94*ab*, 94*bb*, 94*cb*, 94*db*, and 94*eb*, the first input wiring metal layer 95*ba*, the first power supply wiring metal layer 95*a*, the first ground wiring metal layer 95*c*, and a first output wiring metal layer 95*bb*. The first output wiring metal layer 95*bb* is connected to a second output wiring metal layer 101*aa*, and is connected to a first input wiring metal layer 95*aa* of the third-stage inverter circuit. The third-stage inverter circuit is formed so as to have the same arrangement as the first-stage and second-stage inverter circuits. The third-stage inverter circuit includes a source P+ layer 90*aa* of P-channel SGTs 88*ca* and 88*cb*, a source N+ layer 90*ba* of an N-channel SGT 89*c*, silicon pillars 91*aa*, 91*ba*, and 91*ca*, a gate conductor layer 93*a*, contact holes 94*aa*, 94*ba*, 94*ca*, 94*da*, and 94*ea*, the first input wiring metal layer 95*aa*, the first power supply wiring metal layer 95*a*, the first ground wiring metal layer 95*c*, and a first output wiring metal layer 95*ab*. The first output wiring metal layer 95*ab* is connected to a second output wiring metal layer 101*c* (Vo). Furthermore, the first power supply wiring metal layer 95*a* is connected to a second power supply wiring metal layer 101*b* (Vcc) through a contact hole 94*fa*, and the first ground wiring metal layer 95*c* is connected to a second ground wiring metal layer 101*d* (Vss) through a contact hole 94*fb*.

FIG. 11C is a cross-sectional structural view taken along line X1-X1' in FIG. 11B. Line X1-X1' extends from the contact hole 194*aa* to the silicon pillars 91*aa* and 91*ba* of the P-channel SGTs 88*ca* and 88*cb* in the horizontal (row) direction, bends, then extends the contact hole 94*da*, and extends to the silicon pillar 91*ca* that forms an N-channel SGT. FIG. 11C corresponds to the cross-sectional structure of the third-stage inverter circuit. A planar silicon layer 108 is formed on a silicon oxide substrate 1. Silicon pillars 91*aa* and 91*ba* of P-channel SGTs 88*ca* and 88*cb* and a silicon pillar 91*ca* of an N-channel SGT 89*c* are formed on the planar silicon layer 108. A source P+ layer 90*aa* is formed in the planar silicon layer 108 in a lower portion of the silicon pillars 91*aa* and 91*ba*, and a source N+ layer 90*ba* is formed in the planar silicon layer 108 in a lower portion of the silicon pillar 91*ca*. A gate insulating layer 110*b* is formed on the outer peripheries of the silicon pillars 91*aa* and 91*ba*, and a gate insulating layer 110*d* is formed on the outer periphery of the silicon pillar 91*ca*. A continuous gate conductor layer 93*a* is formed so as to surround the gate insulating layers 110*b* and 110*d*. A stopper SiN layer 112 is formed so as to cover the gate conductor layer 93*a*. A silicide layer 133*a* is formed at a boundary portion between the source P+ layer 90*aa* and the source N+ layer 90*ba*. A contact hole 94*da* is formed on the silicide layer 133*a*. A contact hole 94*aa* is formed on the gate conductor layer 93*a*. Contact holes 94*ba*, 94*ca*, and 94*ea* are respectively formed on the silicon pillars 91*aa*, 91*ba*, and 91*ca*. The gate conductor layer 93*a* and a first input wiring metal layer 95*aa*, a drain P+ layer 111*a* and a first power supply wiring metal layer 95*a*, the silicide layer 133*a* and the first output wiring metal layer 95*ab*, and a drain N+ layer 111*b* and a first ground wiring metal layer 95*c* are connected to each other through the contact holes 94*aa*, 94*ba* and 94*ca*, 94*da*, and 94*ea*, respectively. Furthermore, the first input wiring metal layer 95*aa* is connected to a second output wiring metal layer 101*aa* of the second-stage inverter circuit. The first output wiring metal layer 95*ab* is connected to a second output wiring metal layer 101*c* (Vo). The second output wiring metal layer 101*aa* of the second-stage inverter circuit and the second output wiring layer 101*c* (Vo) of the third-stage inverter circuit are each a copper (Cu) wiring layer formed by a dual damascene technique.

FIG. 11D is a cross-sectional structural view taken along line Y1-Y1' in FIG. 11B. Silicide layers 133*a*, 133*b*, and 133*c* are respectively formed in boundary portions between the source P+ layer 90*aa* and the source N+ layer 90*ba*, between the source P+ layer 90*ba* and the source N+ layer 90*bb*, and between the source P+ layer 90*ca* and the source N+ layer 90*cb* of the inverter circuits of the respective stages (line Y1-Y1' is located on the source P+ layer 90*aa*, 90*ba*, 90*ca* side). An insulating layer 110*b* is formed so as to cover the source P+ layers 90*aa*, 90*ba*, and 90*ca* and the source N+ layers 90*ba*, 90*bb*, and 90*cb*. Gate conductor layers 93*a*, 93*b*, and 93*c* are formed on the insulating layer 110*b*. An insulating layer 113*a* is deposited on the whole structure. Furthermore, contact holes 94*da*, 94*db*, and 94*dc* are formed on the silicide layers 133*a*, 133*b*, and 133*c*. The contact holes 94*da*, 94*db*, and 94*dc* are formed so as to be separated from the gate conductor layers 93*a*, 93*b*, and 93*c*, respectively. The silicide layers 133*a*, 133*b*, and 133*c* are respectively connected to first output wiring metal layers 95*ca*, 95*cb*, and 95*cc* through the contact holes 94*da*, 94*db*, and 94*dc*, respectively. Furthermore, an insulating film 113*b* is deposited on the whole structure. Second output wiring metal layers 101*c* (Vo), 101*aa*, and 101*ab* that are respectively connected to the first output wiring metal layers 95*ca*, 95*cb*, and 95*cc* are formed by, for example, a Cu dual damascene technique.

As illustrated in FIG. 11B, in the CMOS inverter circuit formed by the known technique, the contact holes 94*da*, 94*db*, and 94*dc* respectively connected to the first output wiring metal layers 95*ab*, 95*bb*, and 95*cb* are formed so as not to overlap with the gate conductor layers 93*a*, 93*b*, and 93*c* in plan view. However, this arrangement may decrease the degree of circuit integration. Furthermore, as illustrated in FIG. 11C, the structure formed by the known technique inevitably results in a difference between the depth of each of the contact holes 94*ba*, 94*ca*, and 94*ea* respectively formed on the silicon pillars 91*aa*, 91*ba*, and 91*ca* and the depth of the contact hole 94*da* on the silicide layer 133*a* connected to the bottoms of the silicon pillars 91*aa*, 91*ba*, and 91*ca*, the difference corresponding to the height of each of the silicon pillars 91*aa*, 91*ba*, and 91*ca*. Furthermore, the contact hole 94*da* on the silicide layer 133*a* has a depth that is also different from the depth of the contact hole 94*aa* on the gate conductor layer 93*a* (FIG. 11C). This structure makes the formation of the contact holes difficult.

Figure 11E:
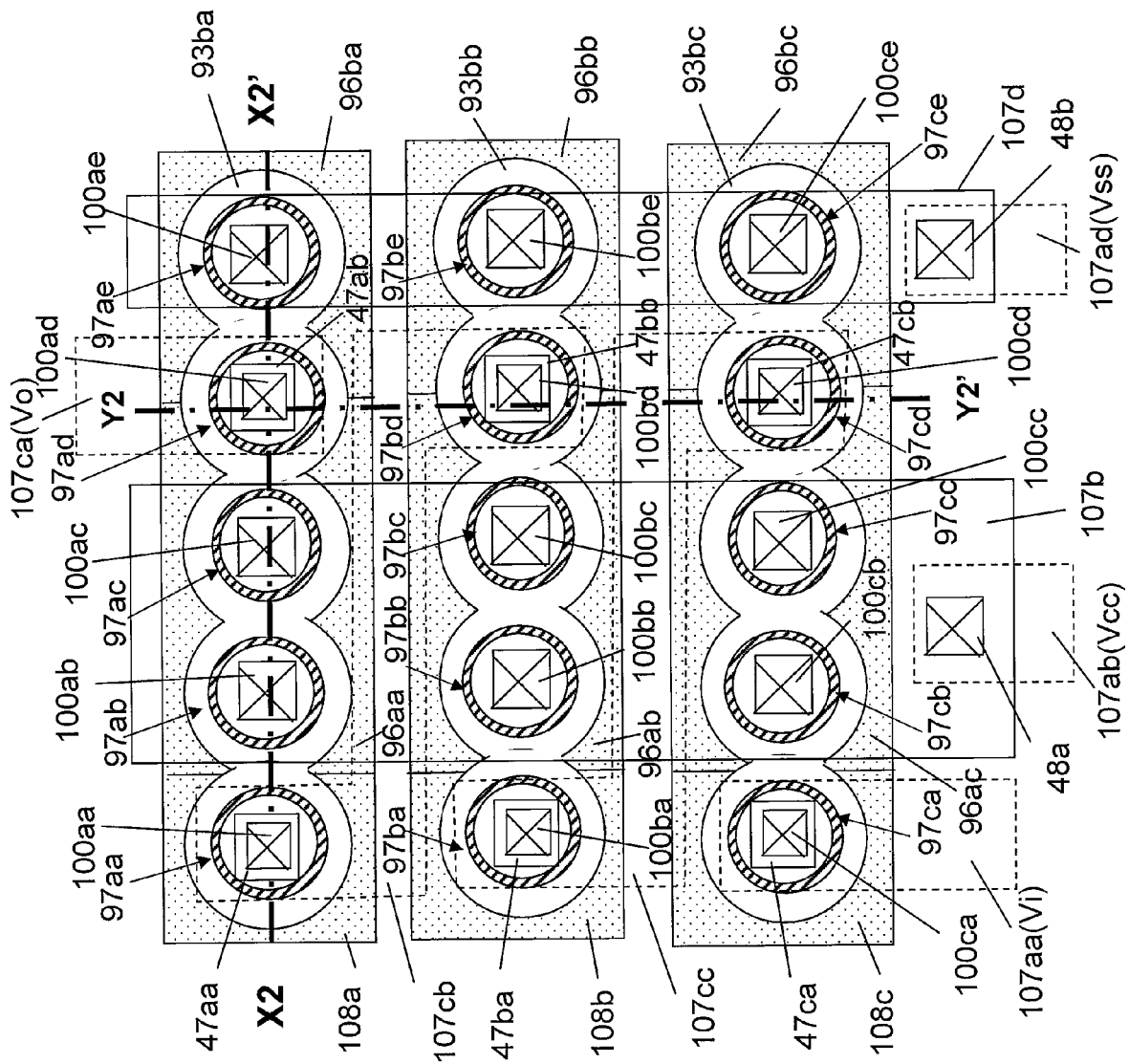
FIG. 11E is a plan view illustrating a CMOS inverter circuit using SGTs according to the ninth embodiment.

FIG. 11E is a plan view of a case where the three-stage CMOS inverter circuit illustrated in FIG. 11A is formed on a substrate, according to this embodiment. A first-stage inverter circuit, a second-stage inverter circuit, and a third-stage inverter circuit are formed in that order from the lower part of FIG. 11E. The first-stage inverter circuit is formed by connecting a source P+ layer 96*ac* of P-channel SGTs 88*aa* and 88*ab* and a source N+ layer 96*bc* of an N-channel SGT 89*a* to each other. Silicon pillars 97*cb* and 97*cc* that form the P-channel SGTs 88*aa* and 88*ab* are formed on the source P+ layer 96*ac*, and a silicon pillar 97*ce* that forms the N-channel SGT 89*a* is formed on the N+ layer 96*bc*. At the same time of the formation of these silicon pillars, a silicon pillar 97*cd* that establishes contact is formed on a boundary portion between the source P+ layer 96*ac* and the source N+ layer 96*bc*, and a silicon pillar 97*ca* that establishes contact is formed on an intrinsic silicon layer 108*c* contacting the source P+ layer 96*ac*. A gate conductor layer 93*bc* of the SGTs 88*aa*, 88*ab*, and 89*a* is continuously formed so as to surround the silicon pillars 97*ca*, 97*cb*, 97*cd*, and 97*ce*. The gate conductor layer 93*bc* is connected to a first input wiring metal layer 47*ca* through a contact hole 100ca formed on the silicon pillar 97ca that establishes contact. Drains of the P-channel SGTs 88aa and 88ab are connected to a first power supply wiring metal layer 107b through contact holes 100cb and 100cc that are respectively formed on the silicon pillars 97cb and 97cc. The P+ layer 96ac and the N+ layer 96bc are each connected to a first output wiring metal layer 47cb through a contact hole 100cd on the silicon pillar 97cd formed on a boundary portion between the P+ layer 96ac and the N+ layer 96bc. A source of the N-channel SGT 89a is connected to a first ground wiring metal layer 107d through a contact hole 100ce formed on the silicon pillar 97ce. A second input wiring metal layer 107aa (Vi) is formed on the first input wiring metal layer 47ca so as to be connected to the first input wiring metal layer 47ca. A second output wiring metal layer 107cc that is connected to the first output wiring metal layer 47cb and an input terminal of the second-stage inverter circuit is formed on the first output wiring metal layer 47cb.

The second output wiring metal layer 107cc of the first-stage inverter circuit is connected to a first input wiring metal layer 47ba of the second-stage inverter circuit. The second-stage inverter circuit is formed so as to have the same arrangement as the first-stage inverter circuit. The second-stage inverter circuit includes an intrinsic silicon layer 108b, a source P+ layer 96ab of P-channel SGTs 88ba and 88bb, a source N+ layer 96bb of an N-channel SGT 89b, silicon pillars 97ba, 97bb, 97bc, 97bd, and 97be, a gate conductor layer 93bb, contact holes 100ba, 100bb, 100bc, 100bd, and 100be, the first input wiring metal layer 47ba, the first power supply wiring metal layer 107b, the first ground wiring metal layer 107d, and a first output wiring metal layer 47bb. The first output wiring metal layer 47bb is connected to a second output wiring metal layer 107cb, and is connected to a first input wiring metal layer 47aa of the third-stage inverter circuit. The third-stage inverter circuit is formed so as to have the same arrangement as the first-stage and second-stage inverter circuits. The third-stage inverter circuit includes an intrinsic silicon layer 108a of P-channel SGTs 88ca and 88cb, a source P+ layer 96aa, a source N+ layer 96ba of an N-channel SGT 89c, silicon pillars 97aa, 97ab, 97ac, 97ad, and 97ae, a gate conductor layer 93ba, contact holes 100aa, 100ab, 100ac, 100ad, and 100ae, the first input wiring metal layer 47aa, the first power supply wiring metal layer 107b, the first ground wiring metal layer 107d, and a first output wiring metal layer 47ab. The first output wiring metal layer 47ab is connected to a second output wiring metal layer 107ca (Vo).

Figure 11F:
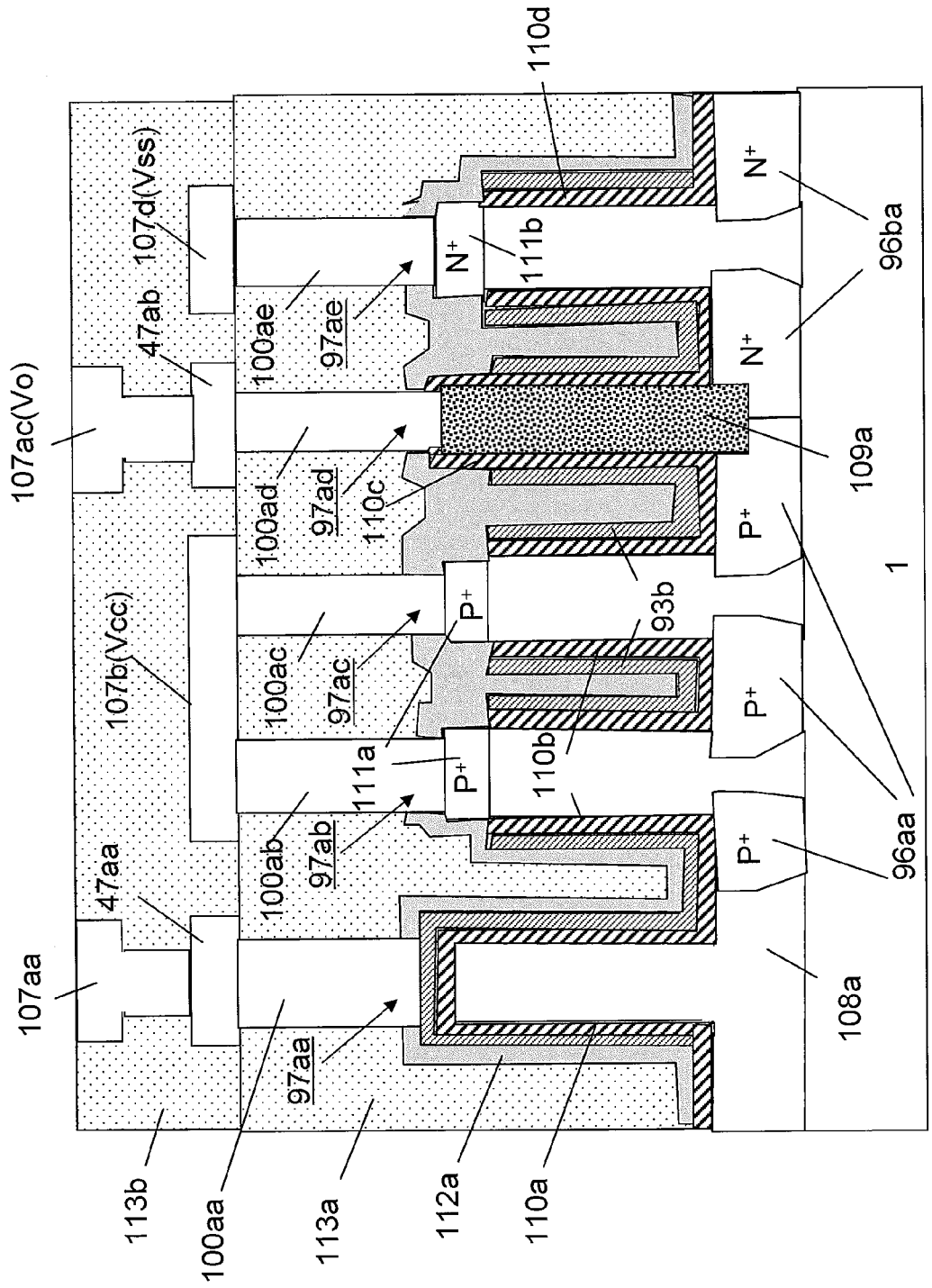
FIG. 11F is a cross-sectional structural view illustrating the CMOS inverter circuit using SGTs according to the ninth embodiment.

FIG. 11F is a cross-sectional structural view taken along line X2-X2' in FIG. 11E. This cross-sectional structural view illustrates a cross-sectional structure of the third-stage inverter circuit. A planar silicon layer 108a is formed on a silicon oxide substrate 1. Silicon pillars 97ab and 97ac of P-channel SGTs 88ca and 88cb, a silicon pillar 97ae of an N-channel SGT 89c, and silicon pillars 97aa and 97ad that establish contact are formed on the planar silicon layer 108a. A source P+ layer 96aa is formed in the planar silicon layer 108a in a lower portion of the silicon pillars 97ab and 97ac, and a source N+ layer 96ba is formed in the planar silicon layer 108a in a lower portion of the silicon pillar 97ae. The silicon pillar 97ad that establishes contact is formed on a boundary portion between the source P+ layer 96aa and the source N+ layer 96ba. A gate insulating layer 110b is formed on the outer peripheries of the silicon pillars 97ab and 97ac, and a gate insulating layer 110d is formed on the outer periphery of the silicon pillar 97ae. Insulating layers 110a and 110c are respectively formed on the outer peripheries of the silicon pillars 97aa and 97ad that establish contact. A continuous gate conductor layer 93b is formed on the outer peripheries of the gate insulating layers 110b and 110d and the insulating layers 110a and 110c. In the silicon pillar 97aa that establishes contact, the hole structure is covered with the insulating layer 110a. The gate conductor layer 93b is formed so as to cover the insulating layer 110a of the silicon pillar 97aa that establishes contact. Furthermore, a stopper SiN layer 112a is formed so as to cover the whole structure. Contact holes 100aa, 100ab, 100ac, 100ad, and 100ae are formed on the silicon pillars 97aa, 97ab, 97ac, 97ad, and 97ae. The gate conductor layer 93b and a first input wiring metal layer 47aa, a drain P+ layer 111a and a first power supply wiring metal layer 107b, a conductor layer 109a formed in the silicon pillar 97ad that establishes contact and a first output wiring metal layer 47ab, and a drain N+ layer 111b and a first ground wiring metal layer 107d are connected to each other through the contact holes 100aa, 100ab, 100ac, 100ad, and 100ae, respectively. Furthermore, the first input wiring metal layer 47aa is connected to a second output wiring metal layer 107aa of the second-stage inverter circuit. The first output wiring metal layer 47ab is connected to a second output wiring metal layer 107ac. The second output wiring metal layer 107aa of the second-stage inverter circuit and the second output wiring metal layer 107ac of the third-stage inverter circuit are each a copper (Cu) wiring layer formed by a dual damascene technique.

Figure 11G:
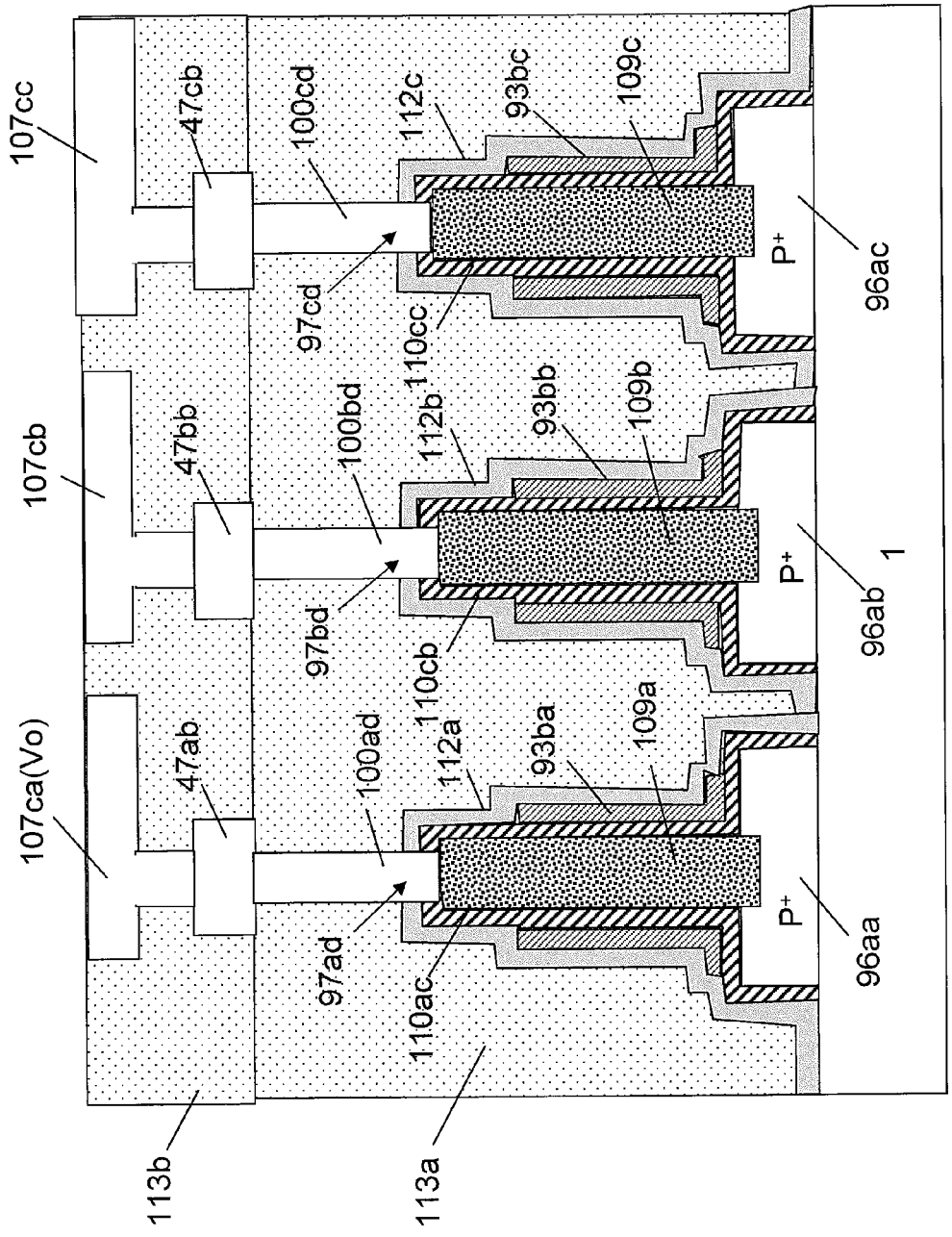
FIG. 11G is a cross-sectional structural view illustrating the CMOS inverter circuit using SGTs according to the ninth embodiment.

FIG. 11G is a cross-sectional structural view taken along line Y2-Y2' in FIG. 11E. Silicon pillars 97ad, 97bd, and 97cd that establish contact are respectively formed in boundary portions between the source P+ layer 96aa and the source N+ layer 96ba, between the source P+ layer 96ab and the source N+ layer 96bb, and between the source P+ layer 96ac and the source N+ layer 96bc of the inverter circuits of the respective stages (line Y2-Y2' is located on the source P+ layer 96aa, 96ab, 96ac side). An insulating layer 110ac is formed so as to cover the silicon pillar 97ad, the source P+ layer 96aa, and the source N+ layer 96ba. An insulating layer 110cb is formed so as to cover the silicon pillar 97bd, the source P+ layer 96ab, and the source N+ layer 96bb. An insulating layer 110cc is formed so as to cover the silicon pillar 97cd, the source P+ layer 96ac, and the source N+ layer 96bc. Gate conductor layers 93ba, 93bb, and 93bc are respectively formed on the outer peripheries of the insulating layers 110ac, 110cb, and 110cc of the silicon pillars 97ad, 97bd, and 97cd. Furthermore, stopper SiN layers 112a, 112b, and 112c and an insulating layer 113a are deposited on the whole structure. Furthermore, contact holes 100ad, 100bd, and 100cd are respectively formed on the silicon pillars 97ad, 97bd, and 97cd. Conductor layers 109a, 109b, and 109c are respectively connected to first output wiring metal layers 47ab, 47bb, and 47cb through the contact holes 100ad, 100bd, and 100cd, respectively. Furthermore, an insulating film 113b is deposited on the whole structure. Second output wiring metal layers 107ca, 107cb, and 107cc connected to the first output wiring metal layers 47ab, 47bb, and 47cb, respectively, are formed by, for example, a Cu dual damascene technique.

As illustrated in FIG. 11B, in the example of the CMOS inverter circuit in the related art, it is necessary to form the contact holes 94da, 94db, and 94dc respectively connected to the first output wiring metal layers 95ab, 95bb, and 95cb so as not to overlap with the gate conductor layers 93a, 93b, and 93c in plan view. This arrangement may decrease the degree of circuit integration. In contrast, in this embodiment, as illustrated in FIG. 11E, the gate conductor layers 93ba, 93bb, and 93bc are respectively formed on the silicon pillars 97ad, 97bd, and 97cd that establish contact. In plan view, since the contact holes 100ad, 100bd, and 100cd are respectively formed in the regions of the gate conductor layers 93ba, 93bb, and 93bc, the contact holes (100aa, 100ab, 100ac, 100ad, and 100ae), (100ba, 100bb, 100bc, 100bd, and 100be), and (100ca, 100cb, 100cc, 100cd, and 100ce) of respective stages can be linearly arranged in the horizontal (row) direction. Thus, the degree of circuit integration of the CMOS inverter circuit of this embodiment is improved. Furthermore, in this embodiment, as illustrated in FIG. 11F, the contact holes 100aa, 100ab, 100ac, 100ad, and 100ae connected to the first input wiring metal layer 47aa, the first power supply wiring metal layer 107b, the first output wiring metal layer 47ab, and the first ground wiring metal layer 107d are formed so as to have the same depth on the silicon pillars 97aa, 97ab, 97ac, 97ad, and 97ae. Accordingly, the CMOS inverter circuit can be easily produced.

Tenth Embodiment

A semiconductor device according to a tenth embodiment will now be described with reference to FIG. 12.

Figure 12:
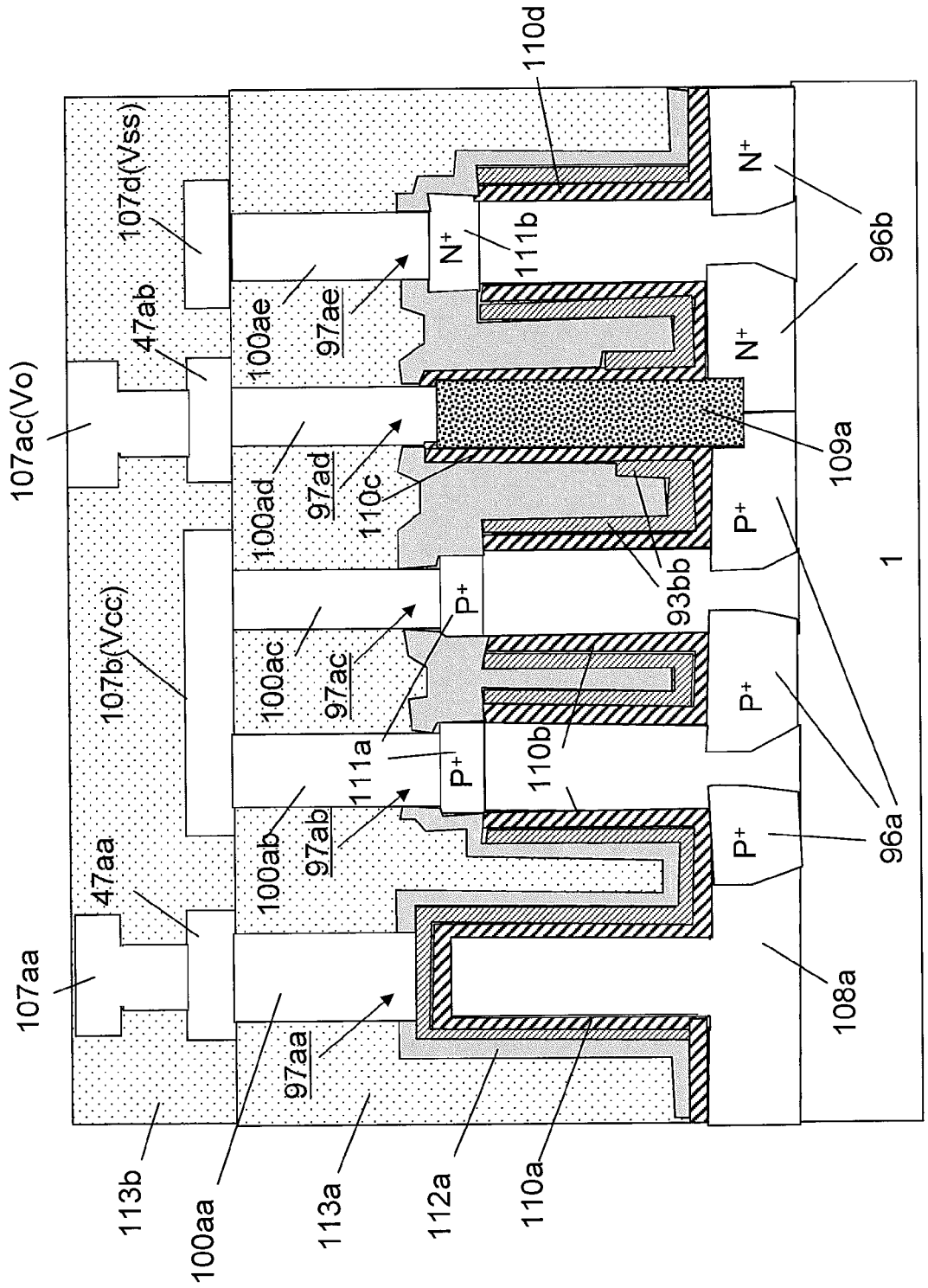
FIG. 12 is a cross-sectional structural view illustrating a CMOS inverter circuit using SGTs according to a tenth embodiment of the present invention.

FIG. 12 is a cross-sectional structural view corresponding to FIG. 11F in the case where this embodiment is applied to the three-stage CMOS inverter circuit illustrated in FIG. 11A. This cross-sectional structure is the same as the cross-sectional structure illustrated in FIG. 11F except for the gate conductor layer 93b. In this embodiment, a gate conductor layer 93bb provided on the outer periphery of a silicon pillar 97ad that establishes contact is formed so that the height thereof is smaller than the heights of silicon pillars 97ab, 97ac, and 97ae in which SGTs are formed and is at least the thickness of the gate conductor layer 93bb. With this structure, a coupling capacitance between the gate conductor layer 93bb and a conductor layer 109a of the silicon pillar 97ad that establishes contact can be made small. Since the conductor layer 109a is connected to a first output wiring metal layer 47ab and a second output wiring metal layer 107ac, a coupling capacitance between the gate conductor layer 93bb and the output wiring can be made small. Consequently, according to this embodiment, high-speed driving of an SGT circuit can be realized as compared with the circuit illustrated in FIG. 11F.

The height of the gate conductor layer 93bb formed on the outer periphery of the silicon pillar 97ad that establishes contact can be lowered to the thickness of the gate conductor layer 93bb in accordance with the performance required for the circuit.

Eleventh Embodiment

A solid-state imaging device according to this embodiment will now be described with reference to FIGS. 13A and 13B. This embodiment is characterized in that a gate conductor layer 7a and a pixel selection line conductor layer 104a are formed on the entire outer periphery of a second silicon pillar 3 that establishes contact and provided in a pixel region, and the gate conductor layer 7a and the pixel selection line conductor layer 104a are connected to gate conductor layers 106a and 106d and pixel selection line metal layers 106b and 106c through contact holes 105a, 105b, 105c, and 105d on third silicon pillars 102a, 102b, 102c, and 102d that establish contact and that are provided in a peripheral drive/output circuit region located on both sides in the horizontal (row) direction. With this structure, in particular, both-side driving of the pixel selection line conductor layer 104a and the gate conductor layer 7a can be realized without decreasing the degree of pixel integration.

Figure 13A:
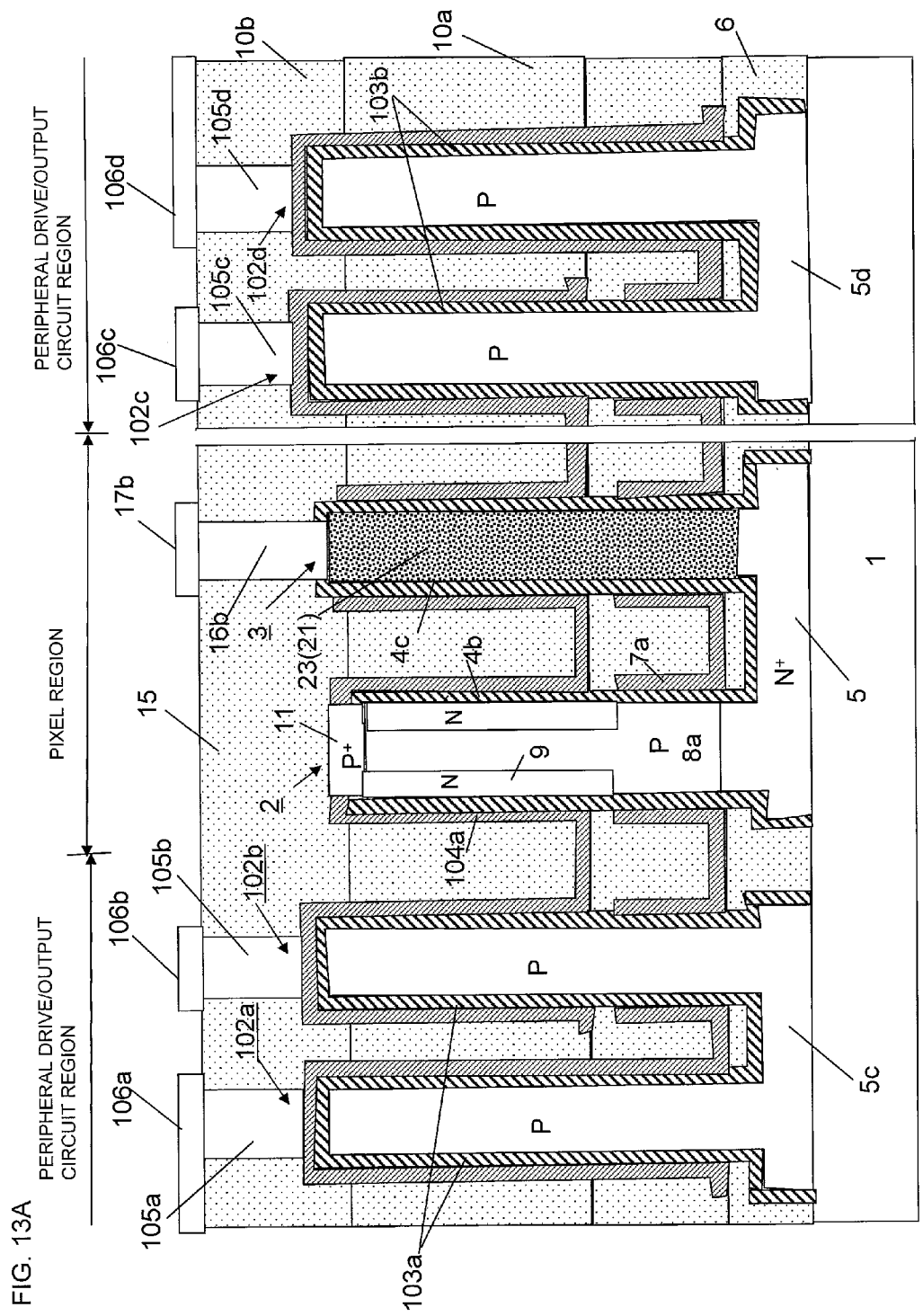
FIG. 13A is a cross-sectional structural view illustrating a solid-state imaging device according to an eleventh embodiment of the present invention.

FIG. 13A is a cross-sectional structural view of a solid-state imaging device according to this embodiment. Regarding this cross-sectional structure, the structure formed on a first silicon pillar 2 that forms a pixel and a second silicon pillar 3 that establishes contact is the same as the structure illustrated in FIG. 9B except for the pixel selection line conductor layer 104a. A first silicon pillar 2 that forms a pixel and a second silicon pillar 3 that establishes contact are formed in a pixel region. Third pillars 102a, 102b, 102c, and 102d that establish contact are formed on planar silicon layers 5c and 5d provided in a peripheral drive/output circuit region. Insulating layers 4b, 4c, 103a, and 103b are respectively formed on the outer peripheries of the first silicon pillar 2, the second silicon pillar 3, the third silicon pillars 102a and 102b, and the third silicon pillars 102c, and 102d. A gate conductor layer 7a is continuously formed along the outer peripheries of the insulating layers 4b and 4c and the insulating layers 103a and 103b of the third silicon pillars 102b and 102c. On the third silicon pillars 102a and 102d, the gate conductor layer 7a is formed so as to cover the entire upper portion of the third silicon pillars 102a and 102d. A pixel selection line conductor layer 104a connected to a P$^+$ layer 11 formed in an upper portion of the first silicon pillar 2 is formed so as to surround the outer periphery of a photodiode N layer 9 of the first silicon pillar 2. The pixel selection line conductor layer 104a is formed along the insulating layer 4c on the side face of the second silicon pillar 3. Regarding the third silicon pillars 102b and 102c, the pixel selection line conductor layer 104a is formed so as to cover the entire upper portions of the third silicon pillars 102b and 102c. In planarized portions formed between the silicon pillars 2, 3, 102a, 102b, 102c, and 102d, the gate conductor layer 7a is formed on a SiO$_2$ layer 6 and the pixel selection line conductor layer 104a is formed on a SiO$_2$ layer 10a. A signal line N$^+$ layer 5 is connected to a conductor layer 23 (21) of the second silicon pillar 3, and connected to a signal line metal layer 17b through a contact hole 16b. The gate conductor layer 7a is connected to the gate conductor layers 106a and 106d through contact holes 105a and 105d formed on the third silicon pillars 102a and 102d, respectively. The pixel selection line conductor layer 104a is connected to pixel selection line metal layers 106b and 106c through contact holes 105b and 105c formed on the third silicon pillars 102b and 102c, respectively.

With this structure, the contact holes 16b, 105a, 105d, 105b, and 105c for connecting the signal line N$^+$ layer 5, the gate conductor layer 7a, and the pixel selection line conductor layer 104a to the signal line metal layer 17b, the gate conductor layers 106a and 106d, and the pixel selection line metal layers 106b and 106c can be formed so as to have the same depth above the second silicon pillar 3, the third silicon pillars 102a and 102d, and the third silicon pillars 102b and 102c. Furthermore, the gate conductor layer 7a and the pixel selection line conductor layer 104a can be arranged along the side faces of silicon pillars that establish contact of other wiring lines, and thus the degree of pixel integration of the solid-state imaging device can be improved.

Figure 13B:
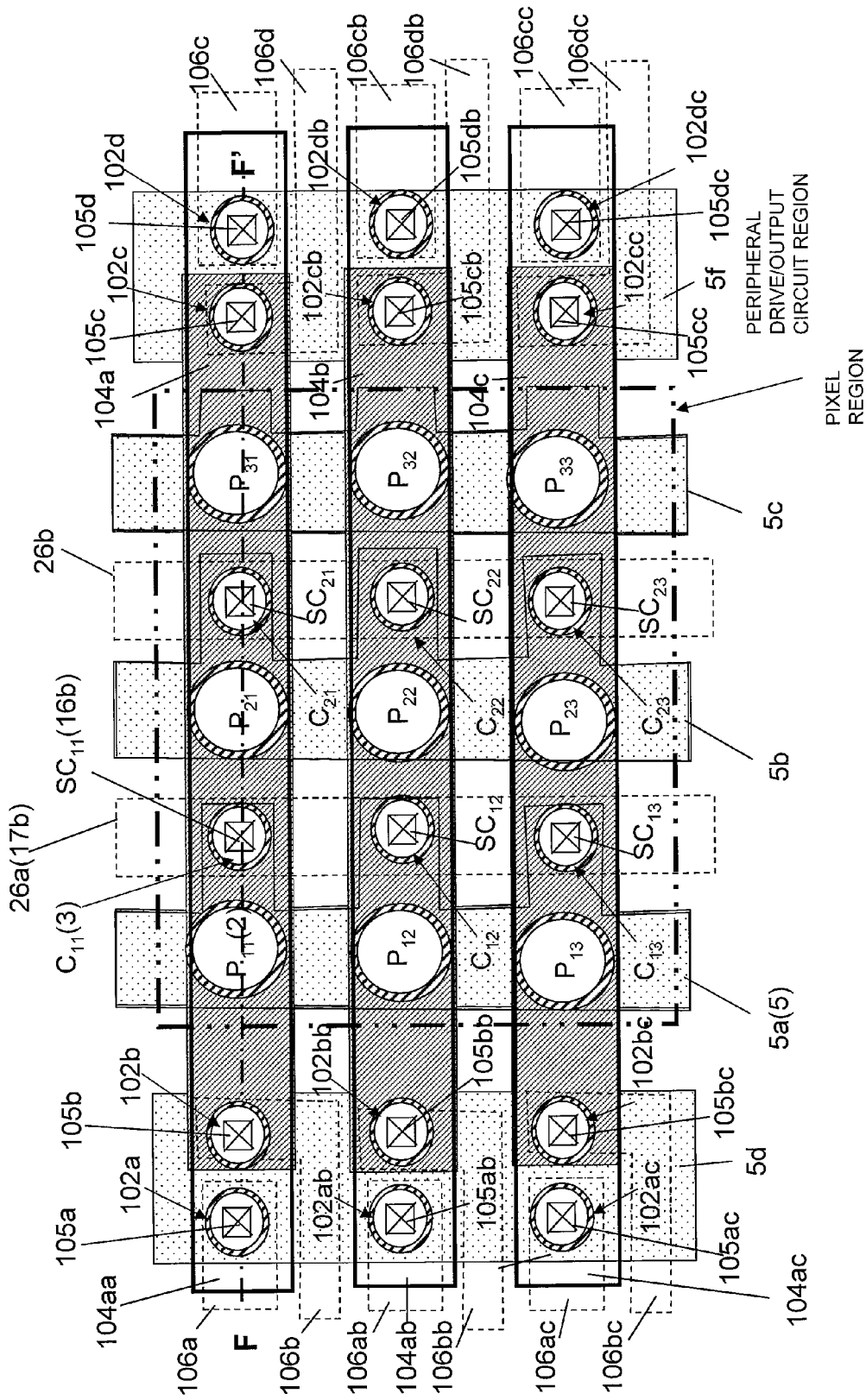
FIG. 13B is a plan view illustrating the solid-state imaging device according to the eleventh embodiment.

According to this embodiment, the solid-state imaging device illustrated in FIG. 13B can be formed. A cross-sectional structural view taken along line F-F' in FIG. 13B corresponds to FIG. 13A (In a pixel region of FIG. 13A, among first silicon pillars and second silicon pillars that are repeatedly arranged in the horizontal (row) direction, only a first silicon pillar P$_{11}$ that forms a first pixel on line F-F' and a second silicon pillar C$_{11}$ that establishes contact are illustrated). In the pixel region, first silicon pillars P$_{11}$ (2) to P$_{33}$ and second silicon pillars C$_{11}$ (3) to C$_{23}$ that establish contact are alternately formed in the horizontal (row) direction. The first silicon pillars P$_{11}$ to P$_{33}$ and the second silicon pillars C$_{11}$ to C$_{23}$ are formed on signal line N$^+$ layers 5a (5), 5b, and 5c, each of which is continuous in the vertical (column) direction. Pixel selection line conductor layers 104a, 104b, and 104c are formed so as to be connected to the outer peripheries of the first silicon pillars P$_{11}$ to P$_{33}$ and the second silicon pillars C$_{11}$ to $C_{23}$ and to extend to third silicon pillars 102*b*, 102*c*, 102*bb*, 102*cb*, 102*bc*, and 102*cc* provided in the peripheral drive/output circuit region located at both ends. Gate conductor layers 104*aa*, 104*ab*, and 104*ac* are formed on the outer peripheries of the first silicon pillars $P_{11}$ to $P_{33}$ and the second silicon pillars $C_{11}$ to $C_{23}$ so as to extend to the third silicon pillars 102*b*, 102*c*, 102*bb*, 102*cb*, 102*bc*, and 102*cc* provided in the peripheral drive/output circuit region located at both ends. The gate conductor layers 104*aa*, 104*ab*, and 104*ac* are connected to gate conductor layers 106*a*, 106*ab*, 106*ac*, 106*c*, 106*cb*, and 106*cc* through contact holes 105*a*, 105*ab*, 105*ac*, 105*d*, 105*db*, and 105*dc* formed on the third silicon pillars 102*a*, 102*ab*, 102*ac*, 102*d*, 102*db*, and 102*dc* provided at both ends. The pixel selection line conductor layers 104*a*, 104*b*, and 104*c* are connected to gate conductor layers 106*b*, 106*bb*, 106*bc*, 106*d*, 106*db*, and 106*dc* through contact holes 105*b*, 105*bb*, 105*bc*, 105*c*, 105*cb*, and 105*cc* that are respectively formed on the third silicon pillars 102*b*, 102*bb*, 102*bc*, 102*c*, 102*cb*, and 102*cc* provided at both ends. With this structure, driving can be performed from both ends, i.e., from the gate conductor layers 104*aa*, 104*ab*, and 104*ac* and from the pixel selection line conductor layers 104*a*, 104*b*, and 104*c*. Accordingly, a reset operation and a signal reading operation in which a driving pulse voltage is applied to the gate conductor layers 104*aa*, 104*ab*, and 104*ac* and the pixel selection line conductor layers 104*a*, 104*b*, and 104*c* can be performed at high speeds.

In this embodiment, as illustrated in FIG. 13A, the pixel selection line conductor layer 104*a* and the gate conductor layer 7*a* do not overlap in the vertical direction. However, the structure is not limited thereto. An insulating layer may be formed on a surface of the gate conductor layer 7*a*, and the gate conductor layer 7*a* and the pixel selection line conductor layer 104*a* may be overlapped with each other in the vertical direction in a portion where the insulating layer contacts the pixel selection line conductor layer 104*a*. With this structure, it is possible to more effectively prevent problems such as a decrease in the resolution and color mixing in color imaging, which are caused when light incident between first silicon pillars 2 that form a plurality of pixels leaks in first silicon pillars 2 that form adjacent pixels to generate signal charges.

Twelfth Embodiment

A semiconductor device using SGTs according to this embodiment will now be described with reference to FIGS. 14A, 14B, and 14C.

Figure 14A:
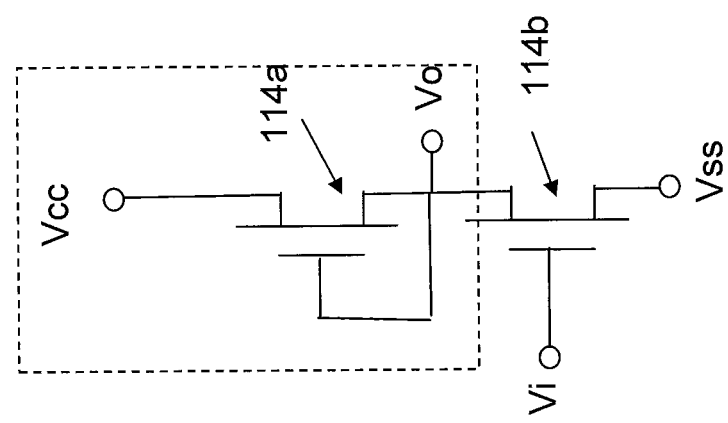
FIG. 14A is a plan view illustrating an E/D inverter circuit using SGTs according to a twelfth embodiment of the present invention.

FIG. 14A illustrates an E/D (enhancement driver/depletion load) inverter circuit in which a depletion-type N-channel SGT 114*a* is used as a load and an enhance-type N-channel SGT is used as a drive transistor. A gate of an N-channel SGT 114*b* is connected to an input terminal Vi, and a source and a gate of the N-channel SGT 114*a* are connected to an output terminal Vo. The source of the N-channel SGT 114*a* and a drain of the N-channel SGT 114*b* are connected to the output terminal Vo. A source of the N-channel SGT 114*b* is connected to a ground terminal Vss. In this E/D inverter circuit, a signal voltage input to the input terminal Vi is inverted and output from the output terminal.

Figure 14B:
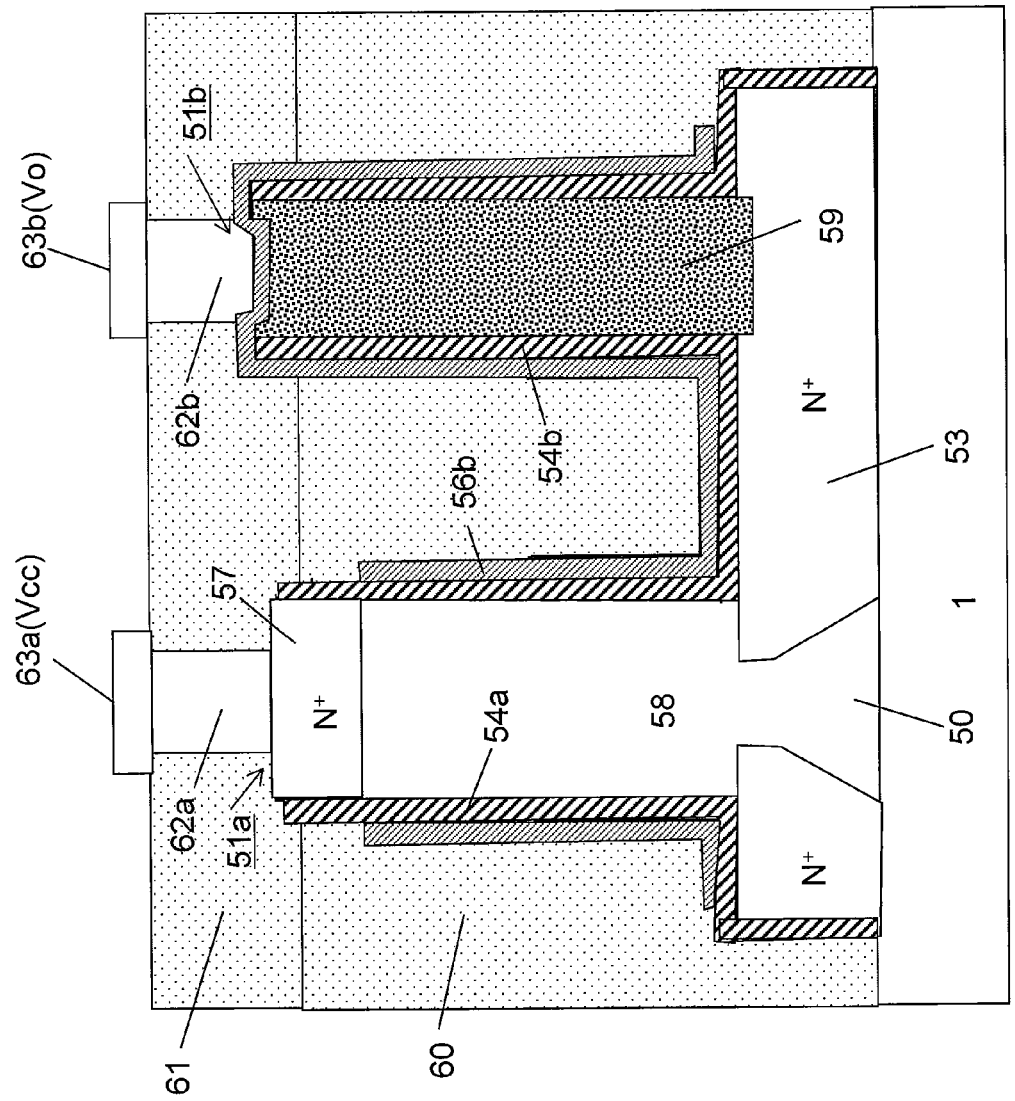
FIG. 14B is a cross-sectional structural view of a load N-channel SGT portion illustrating an E/D inverter circuit using SGTs according to the twelfth embodiment.

FIG. 14B illustrates a cross-sectional structure of a region of the N-channel SGT 114*a* surrounded by the dotted line in FIG. 14A. A gate insulating layer 54*a* is formed on the outer periphery of a silicon pillar 51*a* that forms an N-channel SGT. A gate conductor layer 56*b* formed on the outer periphery of the gate insulating layer 54*a* extends to a silicon pillar 51*b* that establishes contact. The gate conductor layer 56*b* extends upward along an insulating layer 54*b* formed on the outer periphery of the silicon pillar 51*b* that establishes contact and to the top of the silicon pillar 51*b* that establishes contact, and is connected to a conductor layer 59. A drain $N^+$ layer 57 of the N-channel SGT 114*a* is connected to a power supply wiring metal layer 63*a* (Vcc) through a contact hole 62*a* formed in an insulating layer 61. The gate conductor layer 56*b* and the conductor layer 59 of the silicon pillar 51*b* that establishes contact and is connected to a source $N^+$ layer 53 of the N-channel SGT 114*a* are connected to an output wiring metal layer 63*b* (Vo) on the silicon pillar 51*b* that establishes contact through a contact hole 62*b*.

Thus, the connection between the source $N^+$ layer 53 and the gate conductor layer 56*b* of the N-channel SGT 114*a* is realized on the top surface of the silicon pillar 51*b* that establishes contact without adding a new contact hole. Furthermore, the contact holes 62*a* and 62*b* having the same depth can be formed.

Figure 14C:
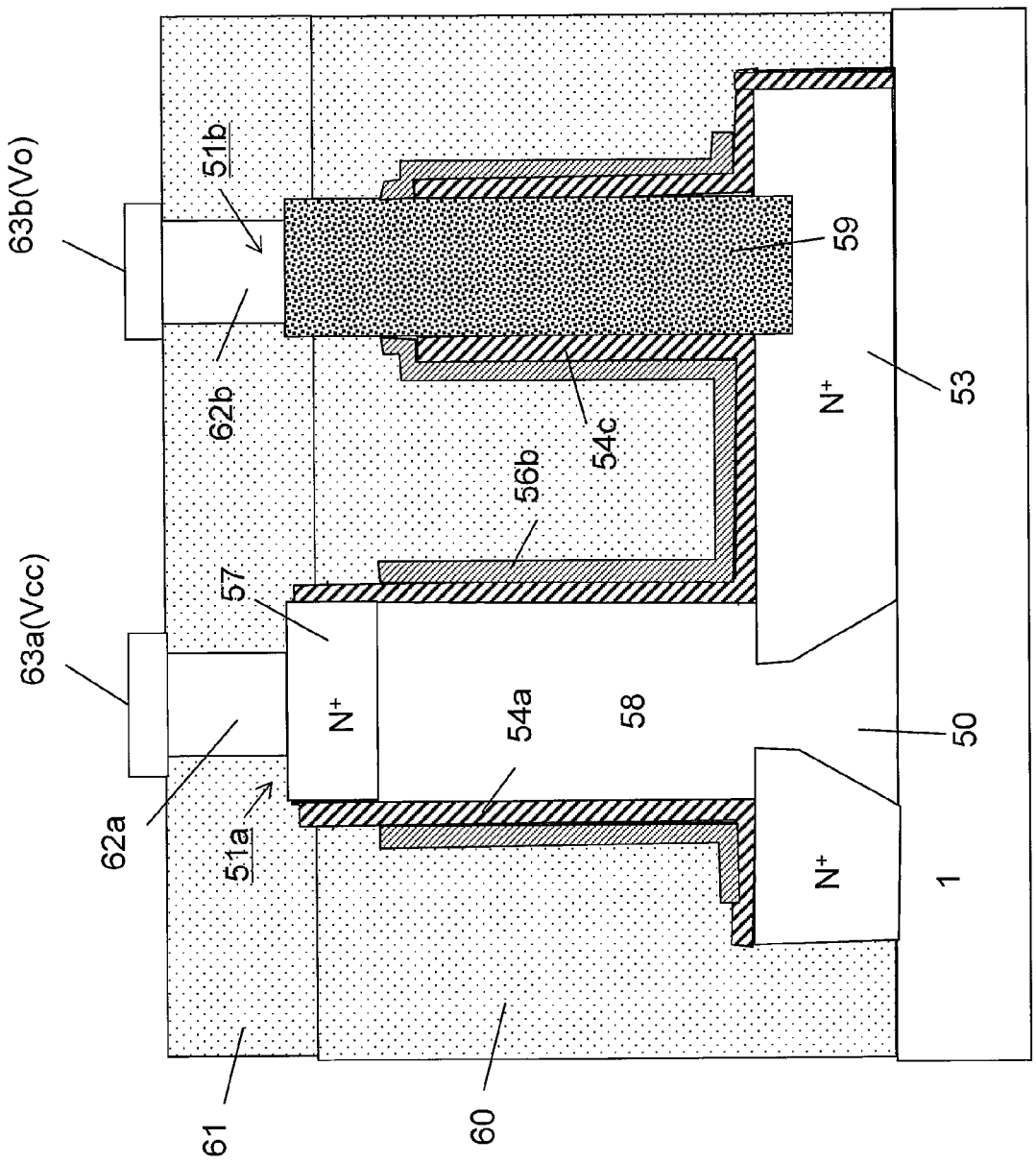
FIG. 14C is a cross-sectional structural view of the load N-channel SGT portion illustrating the E/D inverter circuit using SGTs according to the twelfth embodiment.

FIG. 14C illustrates an embodiment in which the connection between a gate conductor layer 56*b* and a conductor layer 59 of a silicon pillar 51*b* that establishes contact is established on a side face of the conductor layer 59. An insulating layer 54*c* formed on the outer periphery of the conductor layer 59 is removed until the height of the insulating layer 54*c* becomes smaller than the height of the gate conductor layer 56*b* formed on the outer periphery of a silicon pillar 51*a* that forms an SGT. Furthermore, the gate conductor layer 56*b* is formed, and connection between the gate conductor layer 56*b* and the conductor layer 59 is established on an upper portion of the conductor layer 59. A drain $N^+$ layer 57 of the N-channel SGT is connected to a power supply wiring metal layer 63*a* (Vcc) on an insulating layer 61 through a contact hole 62*a*. The gate conductor layer 56*b* is connected to an output wiring metal layer 63*b* (Vo) of the source $N^+$ layer 53 of the N-channel SGT 114*a* through a contact hole 62*b*.

Thus, as in the structure illustrated in FIG. 14B, the connection between the source $N^+$ layer 53 and the gate conductor layer 56*b* of the N-channel SGT 114*a* is realized on the top surface of the silicon pillar 51*b* that establishes contact without adding a new contact hole. As a result, the contact holes 62*a* and 62*b* having the same depth can be formed.

Thirteenth Embodiment

A solid-state imaging device according to this embodiment will now be described with reference to FIGS. 15A and 15B.

Figure 15A:
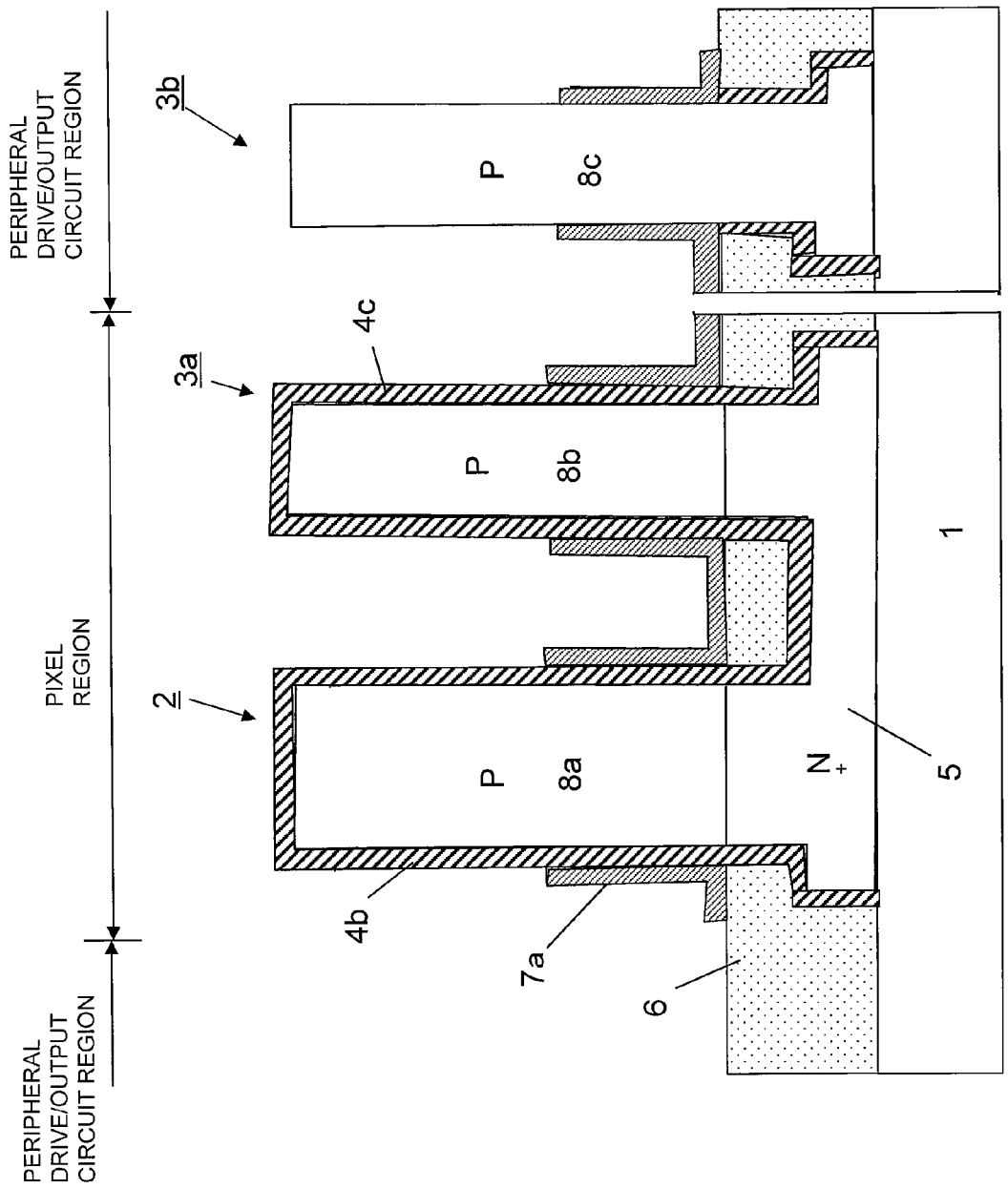
FIG. 15A is a cross-sectional structural view of a solid-state imaging device according to a thirteenth embodiment of the present invention.

FIG. 15A is a view illustrating a cross-sectional structure formed through the same steps as the production steps illustrated in FIGS. 2A to 2C. In this embodiment, a second silicon pillar 3*a* that establishes contact is formed in a pixel region of a solid-state imaging device so as to be adjacent to a first silicon pillar 2 that forms a pixel, and a third silicon pillar 3*b* that establishes contact is formed in a peripheral drive/output circuit region. This third silicon pillar 3*b* is formed so as to be separated from a signal line $N^+$ layer. Silicon oxide ($SiO_2$) layers 4*b*, 4*c*, and 4*d* are formed so as to cover the first silicon pillar 2, the second silicon pillar 3*a*, and the third silicon pillar 3*b*, respectively. The $SiO_2$ layer 4*d* on the outer periphery of the third silicon pillar 3*b* is then removed. A gate conductor layer 7*a* is formed so as to surround the $SiO_2$ layers 4*b* and 4*c* and the third silicon pillar 3*b*. The gate conductor layer 7*a* is formed on a $SiO_2$ layer 6 so as to connect the first silicon pillar 2, the second silicon pillar 3*a*, and the third silicon pillar 3*b* to each other. The gate conductor layer 7*a* is directly connected to a P layer 8*c* of the third silicon pillar 3*b*.

Figure 15B:
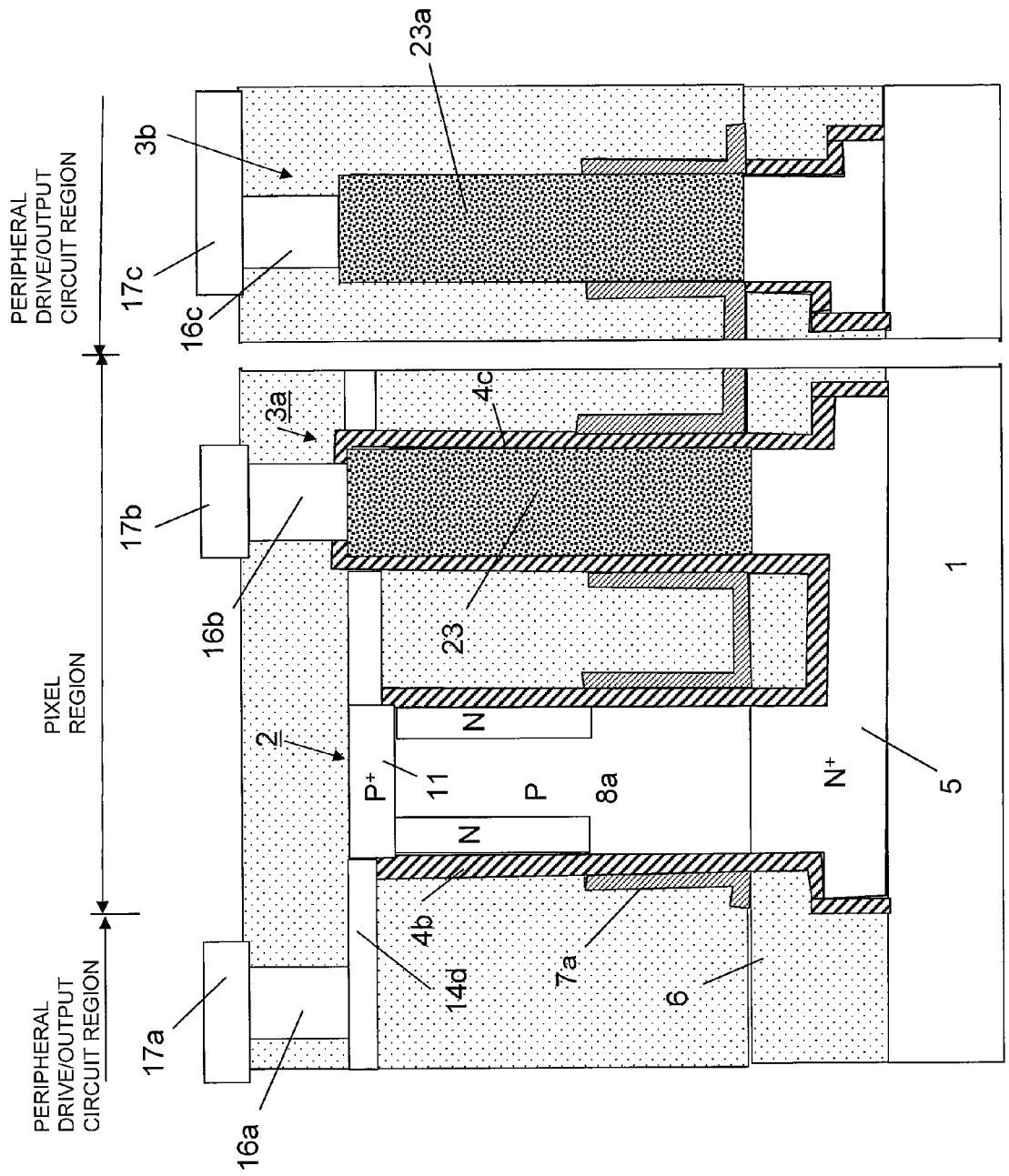
FIG. 15B is a cross-sectional structural view of the solid-state imaging device according to the thirteenth embodiment.

FIG. 15B is a view illustrating a cross-sectional structure formed by obtaining the structure illustrated in FIG. 15A, and then performing the same steps as the steps illustrated in FIGS. 3A to 3C. A silicide layer 23*a* is formed in the third silicon pillar 3*b* as in the case where a silicide layer 23 is formed in the second silicon pillar 3a. Subsequently, the solid-state imaging device is formed by the same step as that illustrated in FIG. 7B.

As illustrated in FIG. 15B, the gate conductor layer 7a is connected to the silicide layer 23a in a lower portion of the third silicon pillar 3b. Accordingly, in this embodiment, unlike the structure illustrated in FIG. 7B, it is not necessary to form the gate conductor layer 7a so as to be connected to the top of the third silicon pillar 3b. In this case, the heights of portions of gate conductor layer 7a surrounding the first silicon pillar 2, the second silicon pillar 3a, and third silicon pillar 3b can be made the same. Accordingly, unlike the structure illustrated in FIG. 7B, it is not necessary to leave the gate conductor layer 7a of the third silicon pillar 3b to the top of the third silicon pillar 3b.

With reference to FIG. 15A, a description has been made of a case where the gate conductor layer 7a is formed without reacting with the silicide layer 23a of the third silicon pillar 3b. On the other hand, in the case where the gate conductor layer 7a is formed of a metal layer that forms a silicide with Si, for example, a metal layer containing a metal material such as W, Pt, Co or Ti, the gate conductor layer 7a reacts with the silicide layer in the third silicon pillar 3b by heat treatment, whereby the gate conductor layer 7a and the silicide layer are connected to each other.

This embodiment can also be applied to the connection between the source $N^+$ layer 53 of the N-channel SGT 114a and the gate conductor layer 56b illustrated in FIGS. 14A to 14C. In this case, this connection can be established by directly connecting the gate conductor layer 56b to the conductor layer 59 in a lower portion of the silicon pillar 51b for a contact hole.

Fourteenth Embodiment

A solid-state imaging device according to this embodiment will now be described with reference to FIGS. 16A and 16B. In the thirteenth embodiment, the gate conductor layer 7a is directly connected to the silicide layer 23a of the third silicon pillar 3b in a lower portion of the third silicon pillar 3b. In contrast, this embodiment is characterized in that a gate conductor layer 7a is connected to a metal conductor layer composed of, for example, copper (Cu) or tungsten (W) instead of the silicide layer 23a.

Figure 16A:
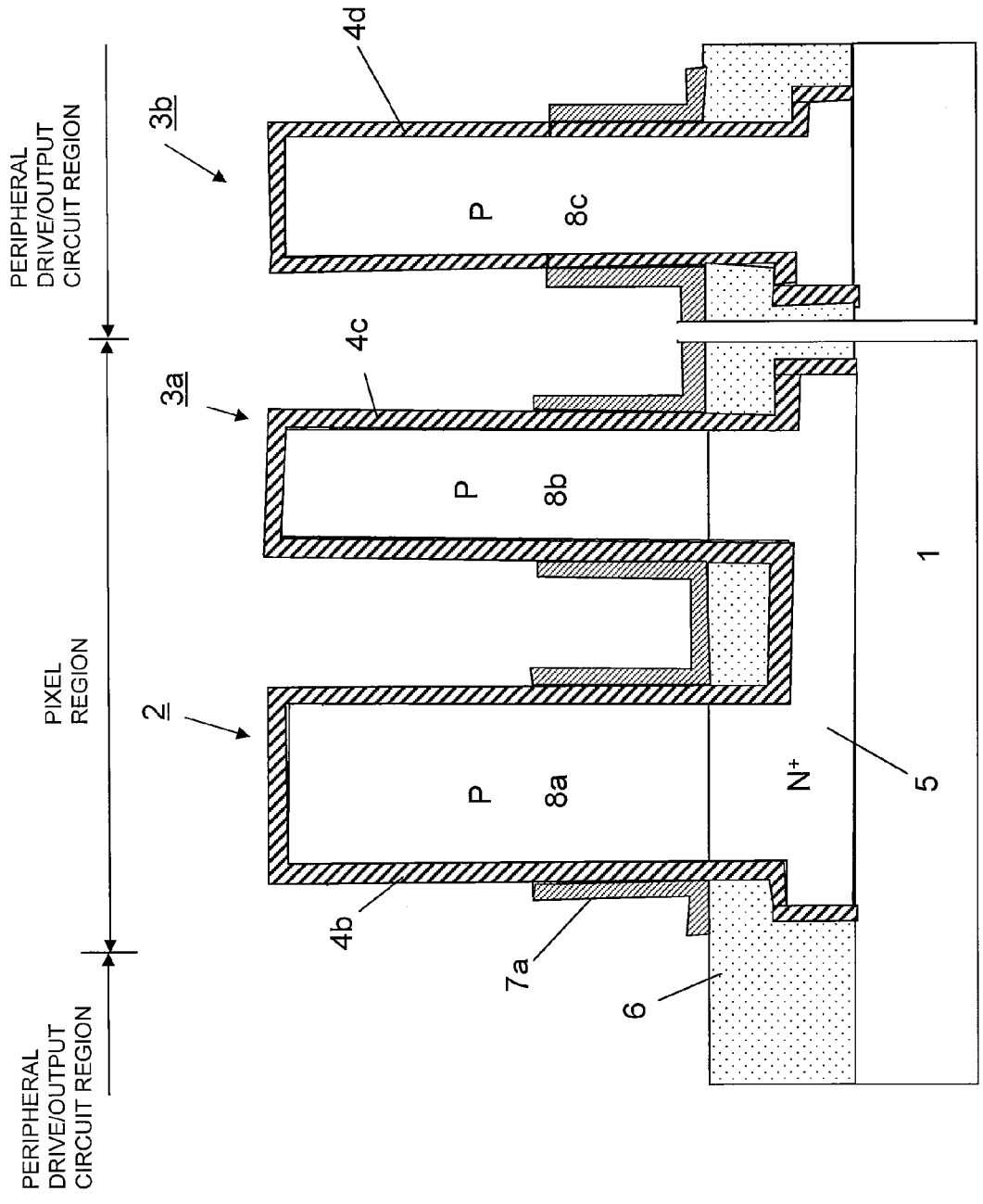
FIG. 16A is a cross-sectional structural view illustrating a solid-state imaging device according to a fourteenth embodiment of the present invention.
Figure 16B:
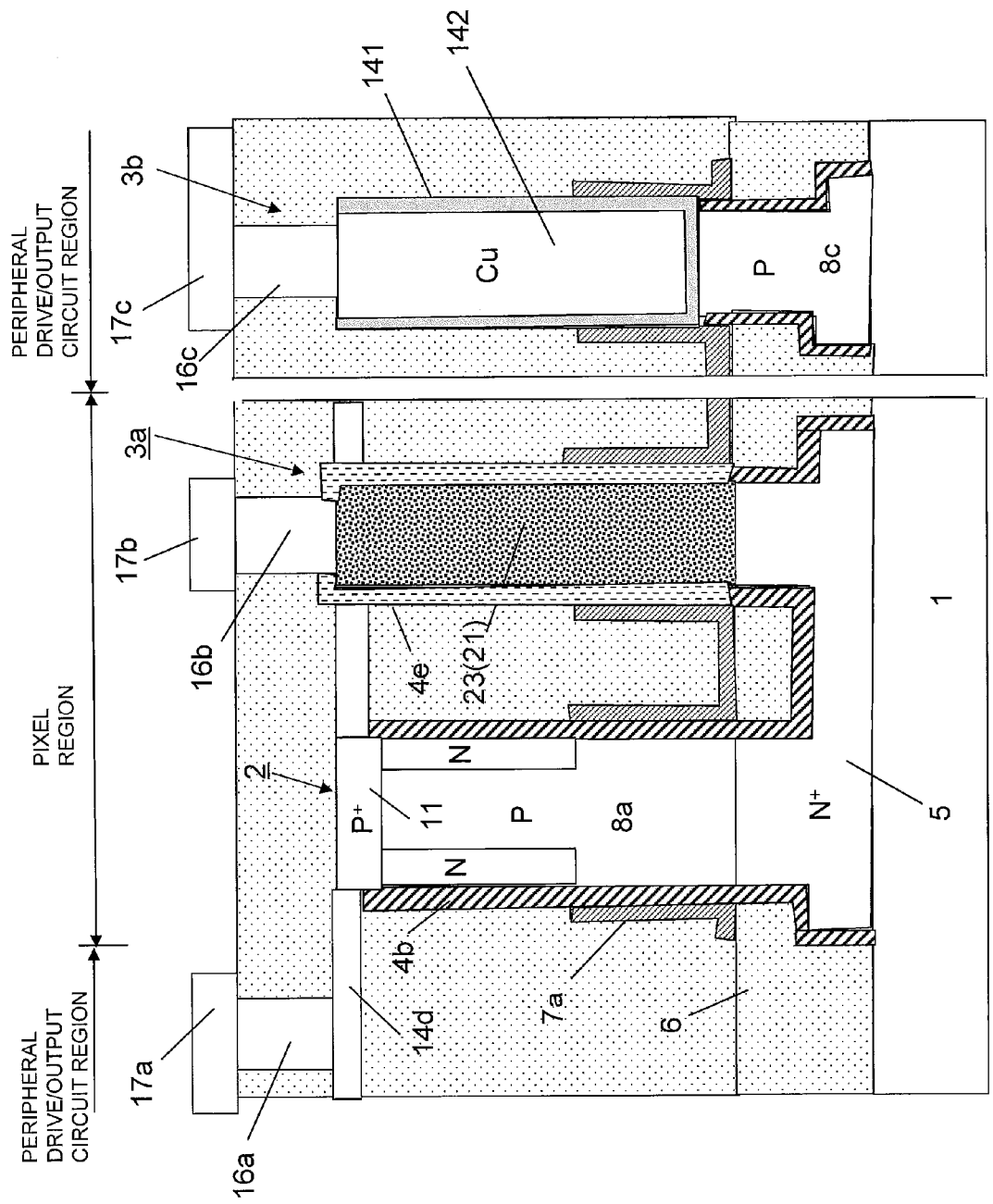
FIG. 16B is a cross-sectional structural view illustrating the solid-state imaging device according to the fourteenth embodiment.

Unlike the structure illustrated in FIG. 15A, in this embodiment, a $SiO_2$ layer 4d on the outer periphery of a third silicon pillar 3b is not removed but left, as illustrated in FIG. 16A. In this embodiment, a gate conductor layer 7a is continuously formed on a first interlayer insulating layer 6 so as to surround $SiO_2$ layers 4b, 4c, and 4d that are respectively formed on the outer peripheries of a first silicon pillar 2, a second silicon pillar 3a, and the third silicon pillar 3b.

Subsequently, as illustrated in FIG. 4B, a P layer 8c of the third silicon pillar 3b is etched to a lower portion of the third silicon pillar 3b. The $SiO_2$ layer 4c exposed to the inside of a hole formed by etching is removed to expose the gate conductor layer 7a. As illustrated in FIG. 16B, a barrier-seed layer 141 composed of TiN, TaN, Cu, etc. is then formed on the upper surface of the etched P layer 8c of the third silicon pillar 3b and the side face of the hole formed by etching. Subsequently, Cu is filled with the hole using a damascene technique. A step similar to the step illustrated in FIG. 4D is then performed, thus obtaining the cross-sectional structure illustrated in FIG. 16B.

In this embodiment, the $SiO_2$ layer 4d on the outer periphery of the third silicon pillar 3b that is formed at the same time with the $SiO_2$ layer 4b, which is a gate insulating layer of the first silicon pillar 2, may be removed before the formation of the gate conductor layer 7a, as in the thirteenth embodiment. The process of removing the $SiO_2$ layer 4d of the third silicon pillar 3b is performed by covering areas other than the $SiO_2$ layer 4d with a photoresist layer, removing the $SiO_2$ layer 4d, and then removing the photoresist layer. In this process, it is highly possible that the $SiO_2$ layer 4b of the first silicon pillar 2, the $SiO_2$ layer 4b functioning as a gate, is contaminated. However, in this embodiment, since the $SiO_2$ layer 4d is not removed before the formation of the gate conductor layer 7a, it is possible to avoid the disadvantage of contamination of the gate $SiO_2$ layer 4b. Furthermore, as in the thirteenth embodiment, the gate conductor layer 7a need not be formed so as to extend to the top of the third silicon pillar 3b.

In the first to fourteenth embodiments, a Si semiconductor is used. Alternatively, other semiconductors such as germanium-Si (GeSi) and indium-antimony (InSb) may be used. The same advantages can be achieved also in such a case.

In the embodiments, a description has been made of examples in which the silicon pillars 2 and 2a that form pixels and the silicon pillars 51a, 97a, 97b, and 97c that form SGTs are composed of P-type or N-type Si. Alternatively, the silicon pillars may be composed of intrinsic-type Si.

In the embodiments, each of the gate conductor layers 7, 30a, 43a, 43b, 56b, 7a to 7c, 7aa to 7ac, 104a to 104c, 93, 93a, and 93b formed on outer peripheral portions of the first silicon pillars 2, 2a, 51a, 97a, 97b, 97c, and 51a is formed of a single material layer. Alternatively, each of the gate conductor layers may be formed of a plurality of layers separated by insulating layers. Furthermore, among the plurality of layers, any one of the layers may include an electrically floating conductor layer.

Each of the pixel selection line conductor layers 14, 14a, 14b, 14c, and 34 may be, for example, a metal layer having a low electrical resistivity or an indium tin oxide (ITO) layer, which is a transparent conductive film. In the case where an ITO film is used in the solid-state imaging device illustrated in FIG. 8A, the pixel selection line conductor layers 82a, 82b, and 82c do not overlap with the silicon pillars $C_{11}$ to $C_{33}$, which establish contact, in the vertical direction, and thus these layers 82a, 82b, and 82c may be arranged so as to cover the top surface of the first silicon pillars $P_{11}$ to $P_{33}$. Similarly, as illustrated in FIG. 1A, an ITO film can also be used in the case where the second silicon pillars Ca, Cb, and Cc that establish contact are not present in the pixel region but are formed in the peripheral drive/output circuit region.

In FIG. 6, the $N^+$ layer 31b remains in a lower portion of the second silicon pillar 3a which is used in place of a contact hole. Alternatively, the silicide layer 35 may directly contact the signal line conductor layer 28. Even in this case, the advantages achieved by a technical idea of the present invention are not lost. Furthermore, in this embodiment, the present invention is applied to a solid-state imaging device. Alternatively, the present invention may be applied to a semiconductor device using SGTs. Also in this case, the application of the present invention contributes to the reduction in the resistance of wiring, and thus contributes to an increase in the driving speed of a circuit.

In FIGS. 4D and 5, the W layer 70a and the Cu layer 70b are formed by a damascene technique in which a metal material is embedded in the hole 68 of the contact pillar. However, the method is not limited thereto. These layers may be formed by embedding $N^+$ polycrystalline Si containing a donor impurity.

In FIG. 4B, the hole 68a is formed by etching the silicon layer of the second silicon pillar 3 until the $SiO_2$ layer 4c is exposed. However, the method is not limited thereto. Alternatively, the silicon layer may be left without exposing the $SiO_2$ layer 4c on the inner surface of the hole so that the silicon layer relieves stress due to the embedded metal layer such as the W layer or the Cu layer.

In FIGS. 7C, 8A, 9A, and 13B, the second silicon pillars $C_{11}$ to $C_{33}$ that establish contact and the first silicon pillars $P_{11}$ to $P_{33}$ that form pixels are arranged in the pixel region so that each second silicon pillar corresponds to a first silicon pillar. However, the arrangement is not limited thereto. Alternatively, each silicon pillar that establishes contact may be arranged so as to correspond to a plurality of silicon pillars out of the first silicon pillars $P_{11}$ to $P_{33}$ so as to be connected to the signal line N$^+$ layer 5a, 5b, 5c, 80a, 80b, or 80c. The resistance of the signal line can be reduced also in this case.

For example, in FIGS. 7C, 8A, 9A, and 13B, the second silicon pillars $C_{11}$ to $C_{33}$ that establish contact and that are provided in the pixel region are separated from the first silicon pillars $P_{11}$ to $P_{33}$ that form pixels. That is, in these figures, silicon pillars that form pixels and silicon pillars that establish pixels are separately illustrated. Herein, the term "first silicon pillar that forms a pixel" refers to a silicon pillar including a photoelectric conversion portion having a photodiode, a signal reading portion having a junction transistor, and a reset portion having a reset transistor.

In FIG. 8A, the gate conductor layers 81a, 81b, and 81c of MOS transistors and the pixel selection line conductor layers 82a, 82b, and 82c may be inversely arranged because the same advantages can be achieved in either case.

In FIG. 12, a technical idea of the present invention is applied to a CMOS inverter circuit using SGTs. However, the application is not limited thereto. The reduction in the coupling capacitance contributes to the realization of high-speed driving and stable operation of a circuit. Accordingly, the technical idea of the present invention can also be applied to a solid-state imaging device in which a first silicon pillar 2 includes one or a plurality of conductor layers.

In the above embodiments, a technical idea of the present invention is applied to a case where a pixel of a solid-state imaging device or an SGT of a semiconductor device is formed in a Si pillar-shaped semiconductor. However, the application of the technical idea of the present invention is not limited to a solid-state imaging device and an SGT. The technical idea of the present invention can be widely applied to a semiconductor device in which a circuit element is formed in a pillar-shaped semiconductor. Specifically, the technical idea of the present invention is characterized in that a semiconductor region formed at the bottom of a pillar-shaped semiconductor in which a circuit element is formed is electrically connected to a conductor layer formed in a pillar-shaped semiconductor that establishes contact and that is formed at the same time with the pillar-shaped semiconductor that forms the circuit element, and an upper wiring metal layer is connected to a semiconductor region that is formed on the pillar-shaped semiconductor that forms the circuit element or formed on an upper portion of the pillar-shaped semiconductor that forms the circuit element, a conductor layer that is connected to the upper semiconductor region of the pillar-shaped semiconductor that forms the circuit element, the conductor layer being formed so as to be flush with the upper semiconductor region, and the pillar-shaped semiconductor that establishes contact through contact holes formed so as to have substantially the same depth. Note that the pillar-shaped semiconductor that forms a circuit element and the pillar-shaped semiconductor that establishes contact may not be necessarily formed at the same time.

Figure 18A:
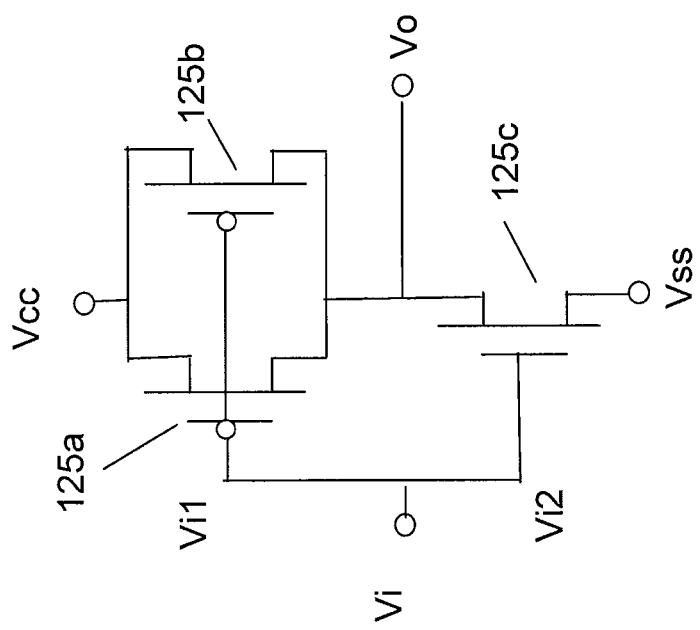
FIG. 18A is a circuit diagram of an example of a CMOS inverter circuit using SGTs in the related art.
Figure 18B:
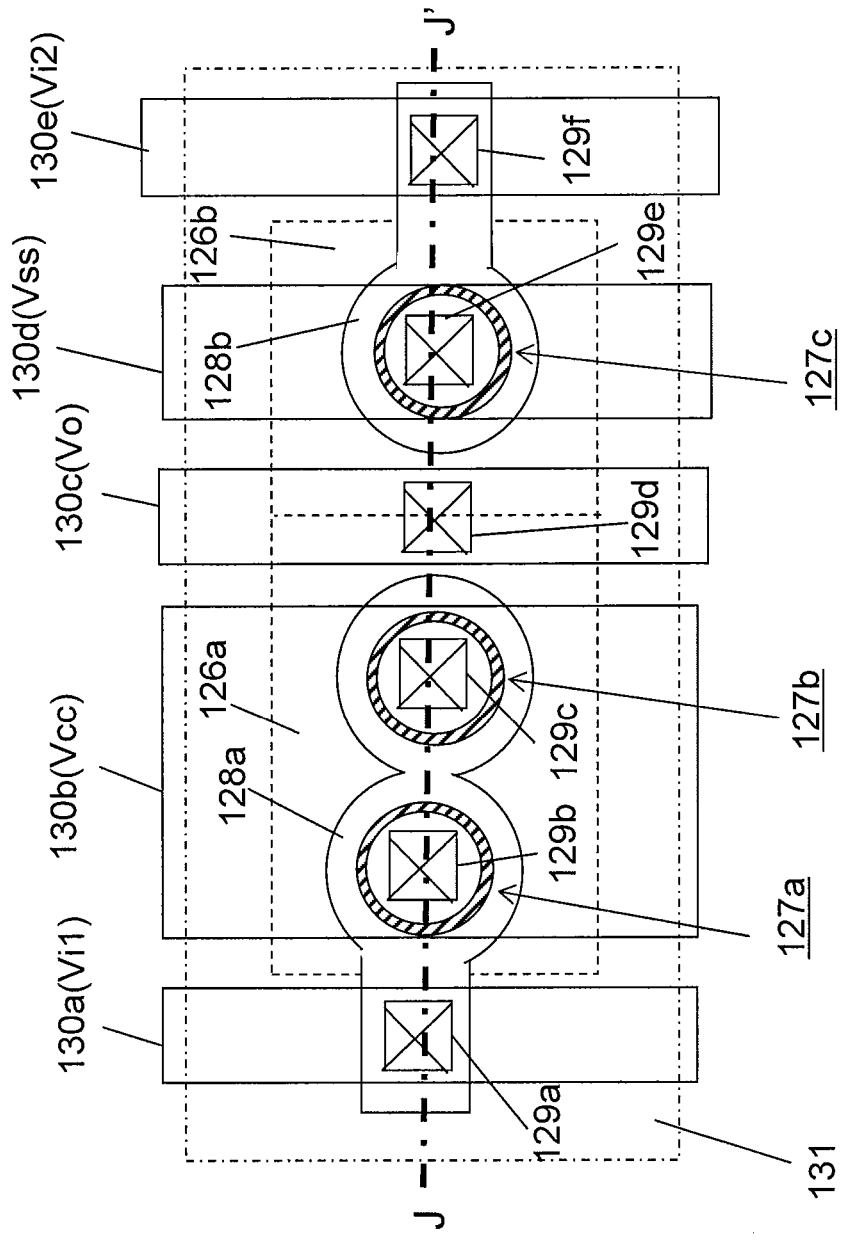
FIG. 18B is a plan view illustrating the example of the CMOS inverter circuit using SGTs in the related art.
Figure 18C:
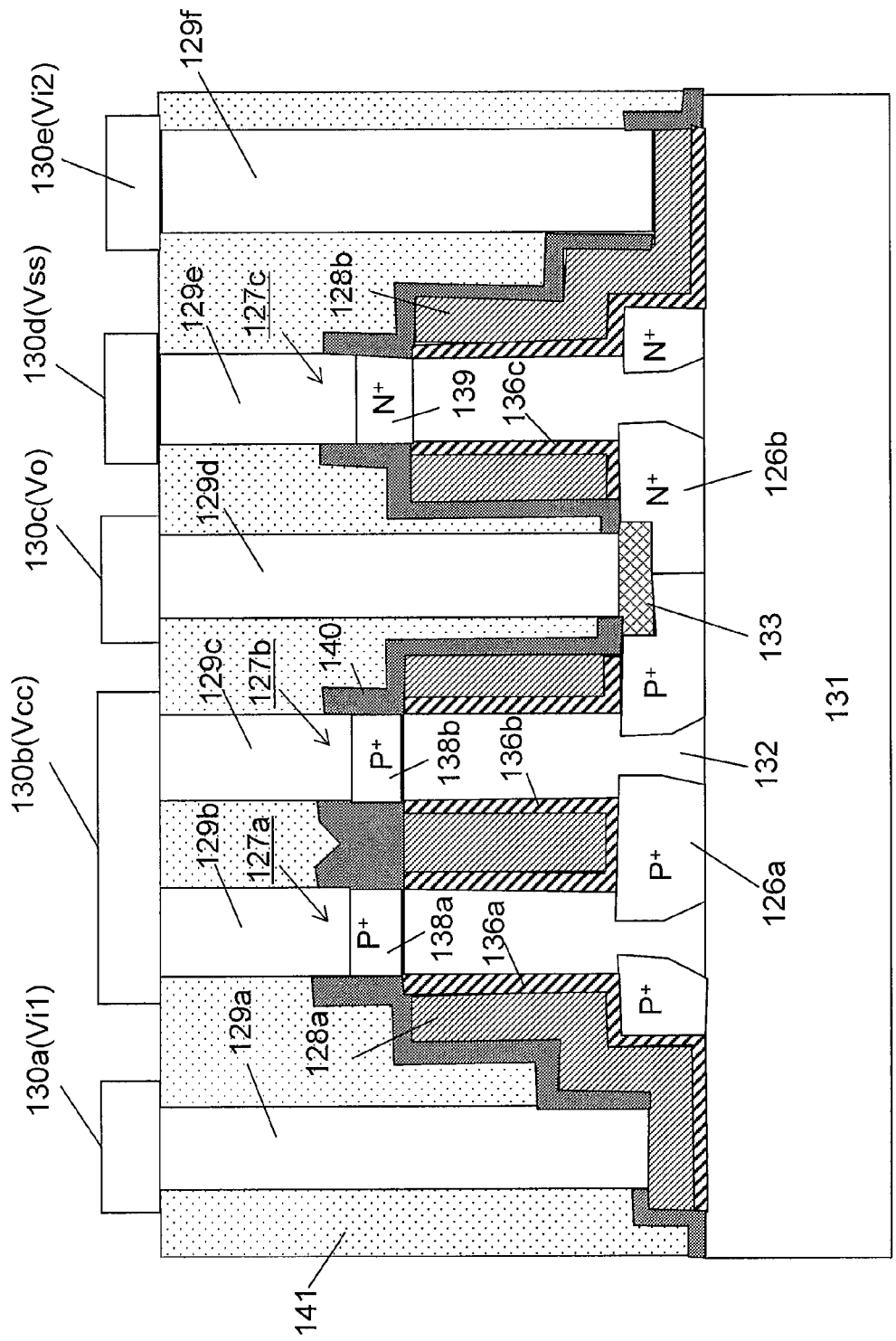
FIG. 18C is a cross-sectional structural view illustrating the example of the CMOS inverter circuit using SGTs in the related art.

In the above embodiments, the shape of the signal line N$^+$ layer in the solid-state imaging device differs from that of the P$^+$ layer or the N$^+$ layer located below the silicon pillar that forms an SGT. This is because the shape is matched with the shapes in the solid-state imaging device illustrated in FIG. 17A and in the semiconductor device using SGTs illustrated in FIG. 18C, which illustrate the related art. The shapes of the N$^+$ layer and the P$^+$ layer may be the same or different from each other depending on the difference in the production methods.

As illustrated in FIG. 1A, the shape of each of the gate conductor layers 7a, 7b, and 7c of pixels in the solid-state imaging device is a rectangle in plan view. On the other hand, each of the SGT gate conductor layers 93ba, 93bb, and 93bc illustrated in FIG. 11E has a circular shape surrounding, for example, the silicon pillars 97aa, 97ab, 97ac, 97ad, and 97ae. The gate conductor layers may have either shape. Alternatively, the shape of each of the gate conductor layers 7a, 7b, and 7c in plan view may be another shape such as an elliptical shape or a pentagon. Alternatively, the shapes of the gate conductor layers 7a, 7b, and 7c may be appropriately different depending on the design of the semiconductor device.

In the ninth embodiment, as illustrated in FIGS. 11A to 11G, a technical idea of the present invention is applied to a semiconductor device using SGTs. Alternatively, the ninth embodiment can be applied to drive/output/input circuits of a solid-state imaging device or other semiconductor devices.

For example, in FIGS. 10C and 11F, the silicon pillar 51a or 97aa that establishes contact is formed on the planar silicon layer 50 or 108a connected to the source P$^+$ layer 53a or 96aa and the source N$^+$ layer 96ba. Alternatively, as in the solid-state imaging device illustrated in FIG. 7B, the silicon pillar that establishes contact may be formed on a planar silicon layer separated from a planar Si in which the source P$^+$ layer 53a or 96aa and the source N$^+$ layer 96ba are formed.

For example, with reference to FIGS. 11E, 11F, and 11G, a description has been made of a case where the gate conductor layers 93ba, 93bb, and 93bc formed on the outer peripheries of the silicon pillars 97ab and 97ac that form P-channel SGTs and the silicon pillar 97ae that forms an N-channel SGT are layers composed of the same material. Alternatively, in order to set a threshold voltage, the gate conductor layers 93ba, 93bb, and 93bc may be layers composed of materials different from each other or may include layers composed of different materials.

In FIG. 13A, the pixel selection line conductor layer 104a is connected to the P$^+$ layer 11 provided on an upper region of the first silicon pillar 2. Alternatively, the pixel selection line conductor layer 104a may be formed so as to be electrically separated from the P$^+$ layer 11, and as in the pixel selection line conductor layer 14d illustrated in FIG. 7B, the pixel selection line conductor layer may be formed as the same layer as the P$^+$ layer 11. Even when the gate conductor layer 7a and the pixel selection line conductor layer 104a formed on the first silicon pillar 2 are each composed of two or more layers, the degree of circuit integration of the solid-state imaging device can be improved by increasing the number of the third silicon pillars 102a, 102b, 102c, and 102d that establish contact and that correspond to respective conductor layers.

In FIG. 10C, only one gate conductor layer 56 is formed on the first silicon pillar 51b. However, the structure is not limited thereto. As in the case of the solid-state imaging device illustrated in FIG. 13A, in an SGT including a plurality of gate conductor layers in the height direction of the first silicon pillar 51b, a technical idea of the present invention can be applied. In this case, since the height of the first silicon pillar 51b is large, the advantage of the present invention can be further enhanced.

In the description of the cross-sectional view of FIG. 1B, the silicon oxide substrate 1 (SiO$_2$ substrate) is used as a substrate. Alternatively, this substrate may be a layer composed of another insulating material or a semiconductor layer. In the case where a semiconductor layer is used, the semiconductor layer can be used as a substrate by forming a diffusion layer with which a solid-state imaging device can operate, the diffusion layer containing a donor or an acceptor, so as to be connected to the N layer 5. This also applies to solid-state imaging devices or semiconductor devices of the other embodiments.

It is to be understood that various embodiments and modifications of the present invention can be made without departing from the broad spirit and scope of the present invention. The embodiments described above are illustrative examples of the present invention and do not limit the scope of the present invention.

The present invention can be widely applied to solid-state imaging devices and semiconductor devices including, for example, an SGT in which a circuit element is formed in a pillar-shaped semiconductor.

What is claimed is:

1. A method for producing a semiconductor device comprising:
    a pillar-shaped semiconductor-forming step of forming a first pillar-shaped semiconductor and a second pillar-shaped semiconductor on a substrate at the same time so as to have the same height;
    a pillar-shaped semiconductor bottom-connecting step of forming a first semiconductor layer by doping, with a donor or acceptor impurity, at least one of a bottom region of the first pillar-shaped semiconductor and a region that contacts the bottom region at a lower position to connect the first semiconductor layer and the second pillar-shaped semiconductor to each other;
    a circuit element-forming step of forming a circuit element including an upper semiconductor region by doping an upper region of the first pillar-shaped semiconductor with a donor or acceptor impurity to form the upper semiconductor region;
    a conductor layer-forming step of forming a first conductor layer in the second pillar-shaped semiconductor;
    a contact hole-forming step of forming a first contact hole and a second contact hole that are respectively connected to the first pillar-shaped semiconductor and the second pillar-shaped semiconductor;
    a wiring metal layer-forming step of forming a wiring metal layer that is connected to each of the upper semiconductor region and the first conductor layer through the first contact hole and the second contact hole, respectively;
    a step of forming a first insulating layer so as to surround the first pillar-shaped semiconductor; and
    a pillar-shaped-semiconductor-connecting conductor layer-forming step of forming a pillar-shaped-semiconductor-connecting conductor layer so as to surround the first insulating layer and the second pillar-shaped semiconductor and to connect the first pillar-shaped semiconductor to the second pillar-shaped semiconductor.

2. The method for producing a semiconductor device according to claim 1, further comprising:
    a step of forming a second conductor layer on the same surface as the upper semiconductor region so as to be connected to the upper semiconductor region,
    wherein, in the contact hole-forming step, the first contact hole and the second contact hole are respectively formed on the second conductor layer and the second pillar-shaped semiconductor so as to be connected to the second conductor layer and the second pillar-shaped semiconductor, and
    in the wiring metal layer-forming step, a wiring metal layer that is connected to the second conductor layer and the first conductor layer through the first contact hole and the second contact hole, respectively, is formed.

3. The method for producing a semiconductor device according to claim 1,
    wherein the conductor layer-forming step includes
    a step of doping, with a donor or acceptor impurity, the second pillar-shaped semiconductor to form the first conductor layer or a step of embedding any one of a polycrystalline semiconductor layer doped with a donor or acceptor, a silicide layer, and a metal layer in the second pillar-shaped semiconductor to form the first conductor layer.

4. The method for producing a semiconductor device according to claim 1,
    wherein, in the pillar-shaped-semiconductor-connecting conductor layer-forming step, a second insulating layer is further formed so as to surround the second pillar-shaped semiconductor, and the pillar-shaped-semiconductor-connecting conductor layer is formed so as to surround the first and second insulating layers and to connect the first pillar-shaped semiconductor to the second pillar-shaped semiconductor.

5. The method for producing a semiconductor device according to claim 1, further comprising:
    a step of forming a pillar-shaped-semiconductor-connecting upper conductor layer above the pillar-shaped-semiconductor-connecting conductor layer so as to surround the first and second insulating layers and to connect the first pillar-shaped semiconductor to the second pillar-shaped semiconductor.

6. The method for producing a semiconductor device according to claim 1,
    wherein the pillar-shaped semiconductor bottom-connecting step is a step of doping, with a donor or acceptor impurity, at least one of a bottom region of the first pillar-shaped semiconductor and a region that contacts the bottom region at a lower position to form a first semiconductor layer, and connecting the first semiconductor layer to the second pillar-shaped semiconductor by forming a fourth conductor layer on the substrate.

7. The method for producing a semiconductor device according to claim 4,
    wherein the second insulating layer is formed using an insulating material having a capacitance lower than that of the first insulating layer.

8. The method for producing a semiconductor device according to claim 1, further comprising:
    a step of forming the first pillar-shaped semiconductor and a third pillar-shaped semiconductor at the same time so as to have the same height;
    a step of forming, in the third pillar-shaped semiconductor, an impurity diffusion layer containing a donor or acceptor impurity, a silicide layer, or a metal layer; and
    a step of forming the pillar-shaped-semiconductor-connecting conductor layer on the outer periphery of the first pillar-shaped semiconductor, with the first insulating layer therebetween, so as to extend from the outer periphery of the first pillar-shaped semiconductor to the third pillar-shaped semiconductor, to surround the third pillar-shaped semiconductor, and to connect, in a lower region of the third pillar-shaped semiconductor, to the impurity diffusion layer containing a donor or acceptor impurity, the silicide layer, or the metal layer that is formed in the third pillar-shaped semiconductor.

9. A semiconductor device comprising:
a substrate;
a first pillar-shaped semiconductor and a second pillar-shaped semiconductor that are formed on the substrate and that have the same height;
a first semiconductor layer doped with a donor or acceptor impurity and formed in at least one of a bottom region of the first pillar-shaped semiconductor and a region that contacts the bottom region at a lower position, the first semiconductor layer and the second pillar-shaped semiconductor being connected to each other;
a circuit element including an upper semiconductor region doped with a donor or acceptor impurity, the circuit element being formed in an upper region of the first pillar-shaped semiconductor;
a first conductor layer formed in the second pillar-shaped semiconductor;
a first contact hole and a second contact hole that are respectively connected to the first pillar-shaped semiconductor and the second pillar-shaped semiconductor;
a wiring metal layer that is connected to the upper semiconductor region and the first conductor layer through the first contact hole and the second contact hole, respectively;
a first insulating layer and a second insulating layer that are formed so as to respectively surround the first pillar-shaped semiconductor and the second pillar-shaped semiconductor; and
the pillar-shaped-semiconductor-connecting conductor layer that surrounds at least the first insulating layer out of the first and second insulating layers and that extends to the second insulating layer.

10. The semiconductor device according to claim 9, wherein a height of the pillar-shaped-semiconductor-connecting conductor layer on the outer periphery of the second pillar-shaped semiconductor is smaller than a height of the pillar-shaped-semiconductor-connecting conductor layer on the outer periphery of the first pillar-shaped semiconductor and is larger than a thickness of the pillar-shaped-semiconductor-connecting conductor layer.

11. The semiconductor device according to claim 9,
wherein the semiconductor device is a solid-state imaging device,
a pixel of the solid-state imaging device includes the first pillar-shaped semiconductor and the second pillar-shaped semiconductor, and has the circuit element,
the pixel includes
a bottom semiconductor layer functioning as the first semiconductor layer formed on the substrate,
a second semiconductor layer formed on the bottom semiconductor layer in the first pillar-shaped semiconductor and composed of a semiconductor having a conductivity type opposite to that of the bottom semiconductor layer or an intrinsic semiconductor,
the pillar-shaped-semiconductor-connecting conductor layer formed on the outer periphery of the second semiconductor layer, with the first insulating layer therebetween, so as to be located above the bottom semiconductor layer,
a third semiconductor layer formed on an outer peripheral portion of the second semiconductor layer so as to be located above the pillar-shaped-semiconductor-connecting conductor layer, the third semiconductor layer having the same conductivity type as that of the first semiconductor layer, and
a fourth semiconductor layer functioning as the upper semiconductor region connected to the second semiconductor layer and formed on the third semiconductor layer, the fourth semiconductor layer having a conductivity type opposite to that of the bottom semiconductor layer, and
a bottom region of the first pillar-shaped semiconductor and the first conductor layer in the second pillar-shaped semiconductor are connected to each other through the bottom semiconductor layer.

12. The semiconductor device according to claim 9,
wherein the semiconductor device includes a surrounding gate transistor (SGT),
the SGT is formed as the circuit element in the first pillar-shaped semiconductor,
the SGT includes
a bottom semiconductor region functioning as the first semiconductor layer and formed on the substrate,
a channel semiconductor layer connected to an upper portion of the bottom semiconductor region and composed of a semiconductor having a conductivity type opposite to that of the bottom semiconductor region or an intrinsic semiconductor,
an insulating layer formed on the outer periphery of the channel semiconductor layer, and
a conductor layer formed on the outer periphery of the channel semiconductor layer with the insulating layer therebetween,
the upper semiconductor region is connected to an upper portion of the channel semiconductor layer and has a conductivity type the same as that of the bottom semiconductor region, and the upper semiconductor region functions as a drain when the bottom semiconductor region functions as a source of the SGT while the upper semiconductor region functions as a source when the bottom semiconductor region functions as a drain of the SGT, and
the bottom semiconductor region and the first conductor layer in the second pillar-shaped semiconductor are connected to each other.

13. The semiconductor device according to claim 11,
wherein the semiconductor device is a solid-state imaging device, and
in a pixel region where a plurality of the pixels are arranged, the first pillar-shaped semiconductors that form the respective pixels and the second pillar-shaped semiconductors are two-dimensionally arranged in a vertical (column) direction and in a horizontal (row) direction.

14. The semiconductor device according to claim 13,
wherein the semiconductor device is a solid-state imaging device,
the bottom semiconductor layer functioning as the first semiconductor layer is connected, for each column in which the first pillar-shaped semiconductors are arranged in the vertical direction, to bottom regions of the first pillar-shaped semiconductors in the column and extends in the vertical (column) direction to form a first semiconductor-layer-connecting conductor layer,
the first semiconductor-layer-connecting conductor layer is connected to bottom regions of the second pillar-shaped semiconductors adjacent to the corresponding first pillar-shaped semiconductors on the first semiconductor-layer-connecting conductor layer, the pillar-shaped-semiconductor-connecting conductor layers of the first pillar-shaped semiconductors are connected to each other so as to block light incident between the first pillar-shaped semiconductors adjacent to each other in the row direction to form a second semiconductor-layer-connecting conductor layer extending in the horizontal (row) direction, the semiconductor device includes a third semiconductor-layer-connecting conductor layer that extends in the horizontal (row) direction so as to block light incident between the first pillar-shaped semiconductors adjacent to each other in the column direction and that is connected to the fourth semiconductor layer of each of the first pillar-shaped semiconductors, and a plurality of the second pillar-shaped semiconductors are formed in a region where at least one of the second semiconductor-layer-connecting conductor layer and the third semiconductor-layer-connecting conductor layer is formed, a contact hole is formed on each of the second pillar-shaped semiconductors, and the first semiconductor-layer-connecting conductor layer and the wiring metal layer are connected to each other through the contact hole and the first conductor layer in each of the second pillar-shaped semiconductors.

15. The semiconductor device according to claim 13, wherein the semiconductor device is a solid-state imaging device, in a pixel region where the pixels are arranged, the bottom semiconductor layer functioning as the first semiconductor layer extends, for each column in which the first pillar-shaped semiconductors are arranged in the vertical direction, in the vertical (column) direction to form a first semiconductor-layer-connecting conductor layer, the pillar-shaped-semiconductor-connecting conductor layers of the first pillar-shaped semiconductors are connected to each other to form a second semiconductor-layer-connecting conductor layer extending in the horizontal (row) direction, the semiconductor device includes a third semiconductor-layer-connecting conductor layer that is connected to the fourth semiconductor layer of the first pillar-shaped semiconductors and that extends in the horizontal (row) direction, the second semiconductor-layer-connecting conductor layer and the third semiconductor-layer-connecting conductor layer are formed so as to have a portion where the second semiconductor-layer-connecting conductor layer and the third semiconductor-layer-connecting conductor layer overlap each other when viewed from a direction in which electromagnetic energy waves are incident, and the second pillar-shaped semiconductors are formed on the first semiconductor-layer-connecting conductor layer and between the first pillar-shaped semiconductors adjacent to each other in the horizontal (row) direction.

16. The semiconductor device according to claim 12, wherein the semiconductor device includes a surrounding gate transistor (SGT), a plurality of the first pillar-shaped semiconductors are arranged, the pillar-shaped-semiconductor-connecting conductor layer of the first pillar-shaped semiconductors extends so as to connect the plurality of first pillar-shaped semiconductors to each other, the second pillar-shaped semiconductor is formed in a region where the pillar-shaped-semiconductor-connecting conductor layer is formed, a second insulating layer is formed so as to surround the second pillar-shaped semiconductor, and the pillar-shaped-semiconductor-connecting conductor layer is formed on the outer periphery of the second pillar-shaped semiconductor with the second insulating layer therebetween.

17. The semiconductor device according to claim 9, wherein the first pillar-shaped semiconductor, the second pillar-shaped semiconductor, and a third pillar-shaped semiconductor, the whole of which is covered with a third insulating layer, are formed on the substrate, a sixth semiconductor layer is formed in an upper region of the first pillar-shaped semiconductor, and a seventh semiconductor layer is formed in a lower region of the first pillar-shaped semiconductor, a first insulating layer and a second insulating layer are formed so as to respectively surround the first pillar-shaped semiconductor and the second pillar-shaped semiconductor, the pillar-shaped-semiconductor-connecting conductor layer includes at least one layer, and is formed on the outer periphery of the first pillar-shaped semiconductor so as to surround the first insulating layer and on the outer periphery of the second pillar-shaped semiconductor so as to surround the second insulating layer, and the pillar-shaped-semiconductor-connecting conductor layer is connected to a top surface of the third pillar-shaped semiconductor, contact holes are formed so as to be connected to each of the third pillar-shaped semiconductor, the sixth semiconductor layer on the first pillar-shaped semiconductor, and the second pillar-shaped semiconductor, and the semiconductor device includes a wiring metal layer that is connected to the sixth semiconductor layer, the seventh semiconductor layer, and the pillar-shaped-semiconductor-connecting conductor layer through the contact holes.

18. The semiconductor device according to claim 9, wherein a first insulating layer and a second insulating layer are formed so as to respectively surround the first pillar-shaped semiconductor and the second pillar-shaped semiconductor, and the pillar-shaped-semiconductor-connecting conductor layer is connected to the first conductor layer on an upper portion of the second pillar-shaped semiconductor.

19. The semiconductor device according to claim 9, wherein the first pillar-shaped semiconductor and a third pillar-shaped semiconductor are formed at the same time so as to have the same height, an impurity diffusion layer containing a donor or acceptor impurity, a silicide layer, or a metal layer is formed in the third pillar-shaped semiconductor, and the pillar-shaped-semiconductor-connecting conductor layer extends to the third pillar-shaped semiconductor, surrounds the third pillar-shaped semiconductor, and is connected to the impurity diffusion layer containing a donor or acceptor impurity, the silicide layer, or the metal layer formed in the third pillar-shaped semiconductor in a lower region of the third pillar-shaped semiconductor.

* * * * *